(12) United States Patent
Naruke et al.

(10) Patent No.: US 11,569,256 B2
(45) Date of Patent: Jan. 31, 2023

(54) MEMORY DEVICE WITH TRANSISTORS ABOVE MEMORY STACKS AND MANUFACTURING METHOD OF THE MEMORY DEVICE

(71) Applicant: Kioxia Corporation, Minato-ku (JP)

(72) Inventors: Kiyomi Naruke, Sagamihara (JP);
Shinichiro Shiratake, Yokohama (JP);
Mutsumi Okajima, Yokkaichi (JP);
Hidetoshi Saito, Yamato (JP);
Hirofumi Inoue, Kamakura (JP)

(73) Assignee: Kioxia Corporation, Minato-ku (JP)

( * ) Notice: Subject to any disclaimer, the term of this patent is extended or adjusted under 35 U.S.C. 154(b) by 332 days.

(21) Appl. No.: 16/817,187

(22) Filed: Mar. 12, 2020

(65) Prior Publication Data

US 2021/0091108 A1    Mar. 25, 2021

(30) Foreign Application Priority Data

Sep. 19, 2019  (JP) .............................. JP2019-170794

(51) Int. Cl.
| | |
|---|---|
| *H01L 27/11582* | (2017.01) |
| *G11C 16/26* | (2006.01) |
| *H01L 27/11565* | (2017.01) |
| *H01L 27/1157* | (2017.01) |
| *H01L 27/11573* | (2017.01) |
| *H01L 23/522* | (2006.01) |

(Continued)

(52) U.S. Cl.
CPC ........ *H01L 27/11582* (2013.01); *G11C 16/08* (2013.01); *G11C 16/16* (2013.01); *G11C 16/24* (2013.01); *G11C 16/26* (2013.01); *H01L 23/5226* (2013.01); *H01L 23/5283* (2013.01); *H01L 27/1157* (2013.01); *H01L 27/11565* (2013.01); *H01L 27/11573* (2013.01)

(58) Field of Classification Search
CPC .......... H01L 27/11582; H01L 23/5226; H01L 23/5283; H01L 27/11565; H01L 27/1157; H01L 27/11573; G11C 16/08; G11C 16/16; G11C 16/24; G11C 16/26; G11C 16/0466
See application file for complete search history.

(56) References Cited

U.S. PATENT DOCUMENTS

| | | |
|---|---|---|
| 6,434,053 B1 | 8/2002 | Fujiwara |
| 8,630,114 B2 | 1/2014 | Lue |

(Continued)

FOREIGN PATENT DOCUMENTS

JP    2010-251572 A    11/2010

*Primary Examiner* — Jerome Leboeuf
(74) *Attorney, Agent, or Firm* — Oblon, McClelland, Maier & Neustadt, L.L.P.

(57) ABSTRACT

A device includes a stack above a substrate in a first direction perpendicular to a surface of the substrate, the stack including conductive layers; a semiconductor layer neighboring the stack in a second direction parallel to the surface of the substrate; a memory layer between the first stack and the semiconductor layer; memory cells between the conductive layers and the semiconductor layer; a first transistor connected between one end of the semiconductor layer in a third direction parallel to the surface of the substrate and crossing the second direction and a first interconnect in the first direction; and a second transistor connected between the other end of the semiconductor layer and a second interconnect in the first direction.

16 Claims, 58 Drawing Sheets

(51) Int. Cl.
  *G11C 16/16* (2006.01)
  *G11C 16/24* (2006.01)
  *H01L 23/528* (2006.01)
  *G11C 16/08* (2006.01)

(56) References Cited

U.S. PATENT DOCUMENTS

| | | |
|---|---|---|
| 9,911,497 B1 | 3/2018 | Harari |
| 2014/0042520 A1* | 2/2014 | Lee .................. H01L 29/7926 |
| | | 257/324 |
| 2014/0192596 A1* | 7/2014 | Rhie .................. G11C 16/0483 |
| | | 365/185.05 |
| 2017/0148517 A1 | 5/2017 | Harari |
| 2018/0269229 A1 | 9/2018 | Or-Bach et al. |
| 2020/0098774 A1* | 3/2020 | Yeh .................. H01L 27/1157 |
| 2020/0343252 A1* | 10/2020 | Lai .................. H01L 27/1157 |
| 2021/0057432 A1* | 2/2021 | Lu .................. H01L 27/11582 |

* cited by examiner

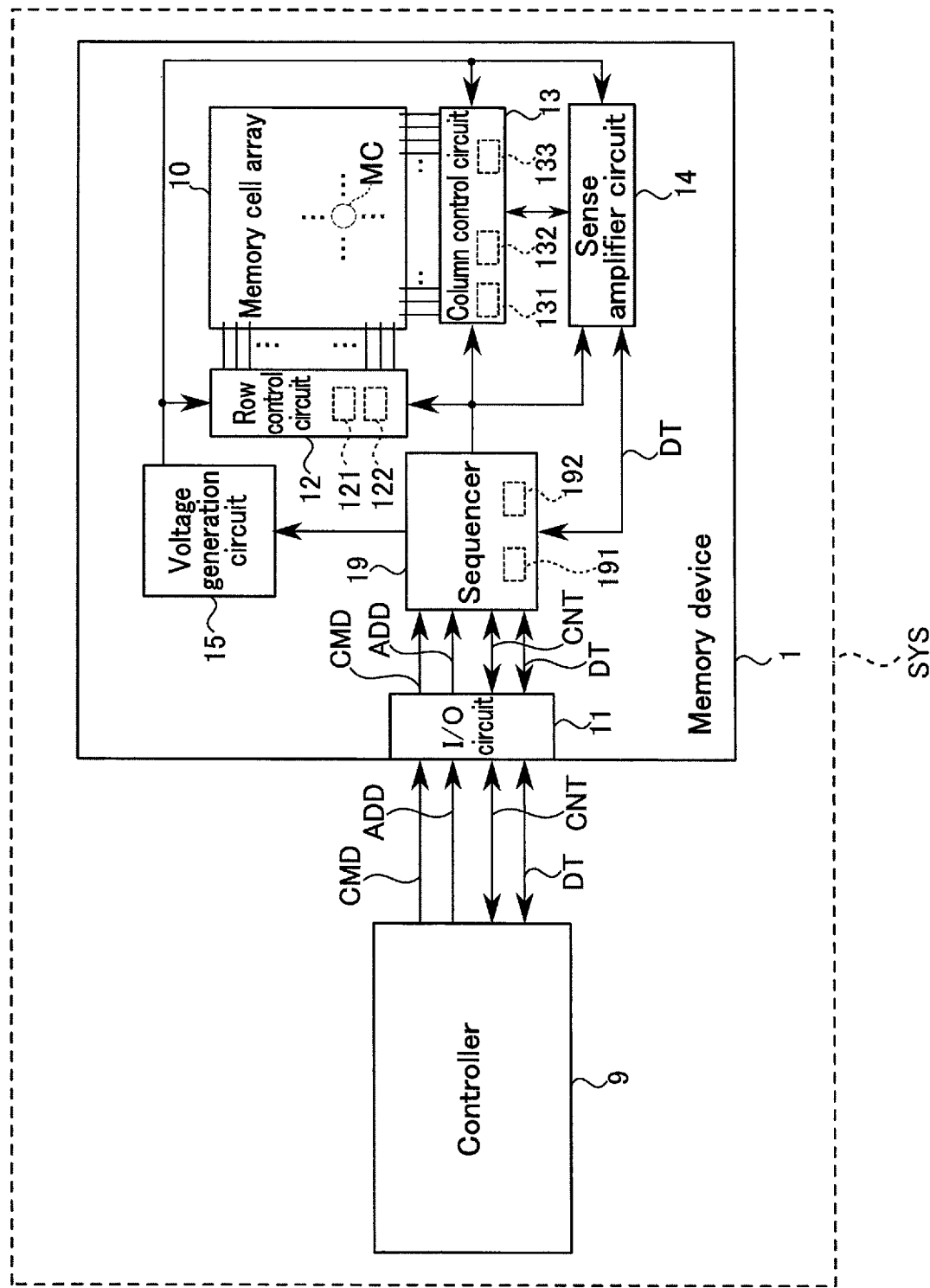
F I G. 1

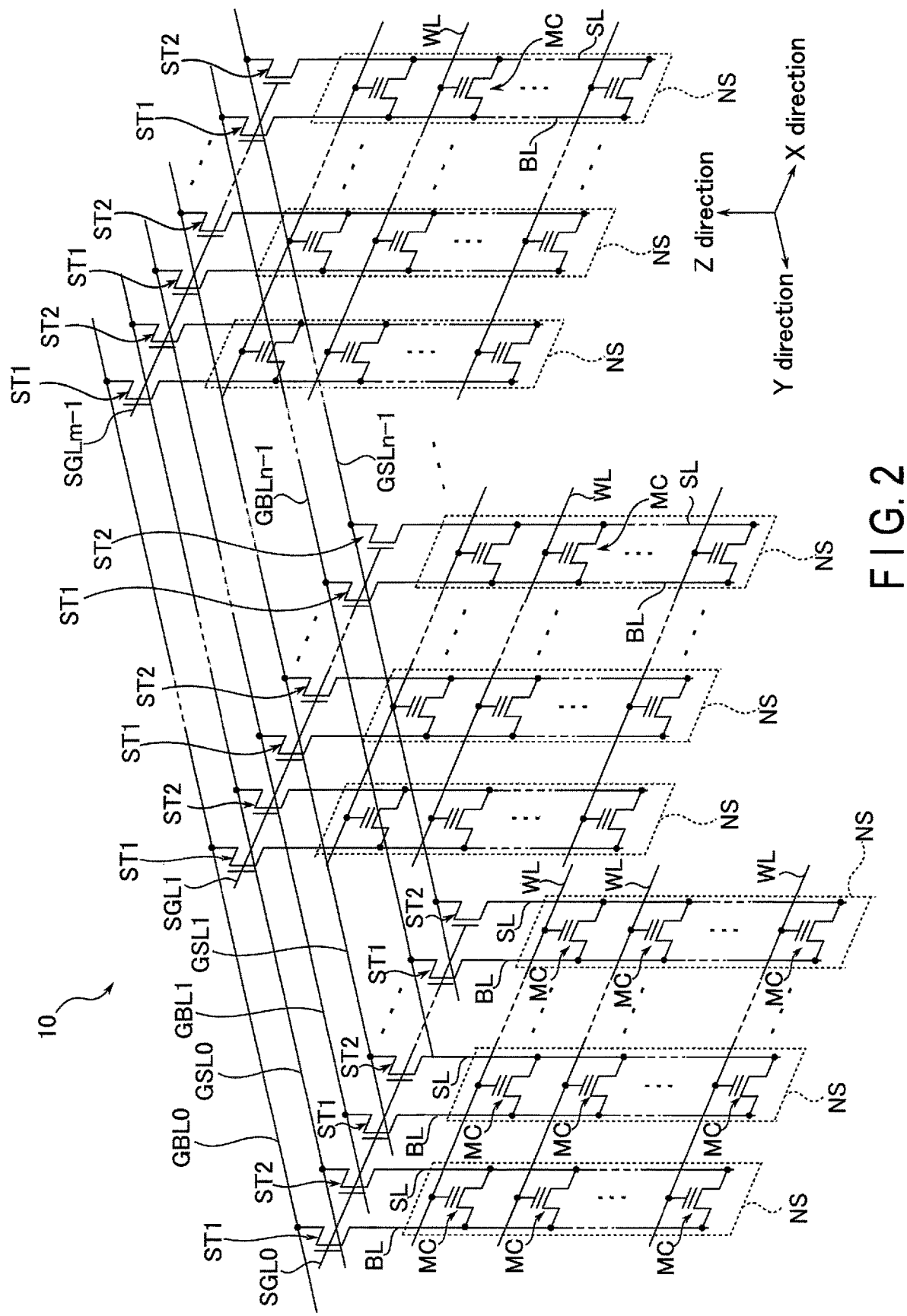
F I G. 2

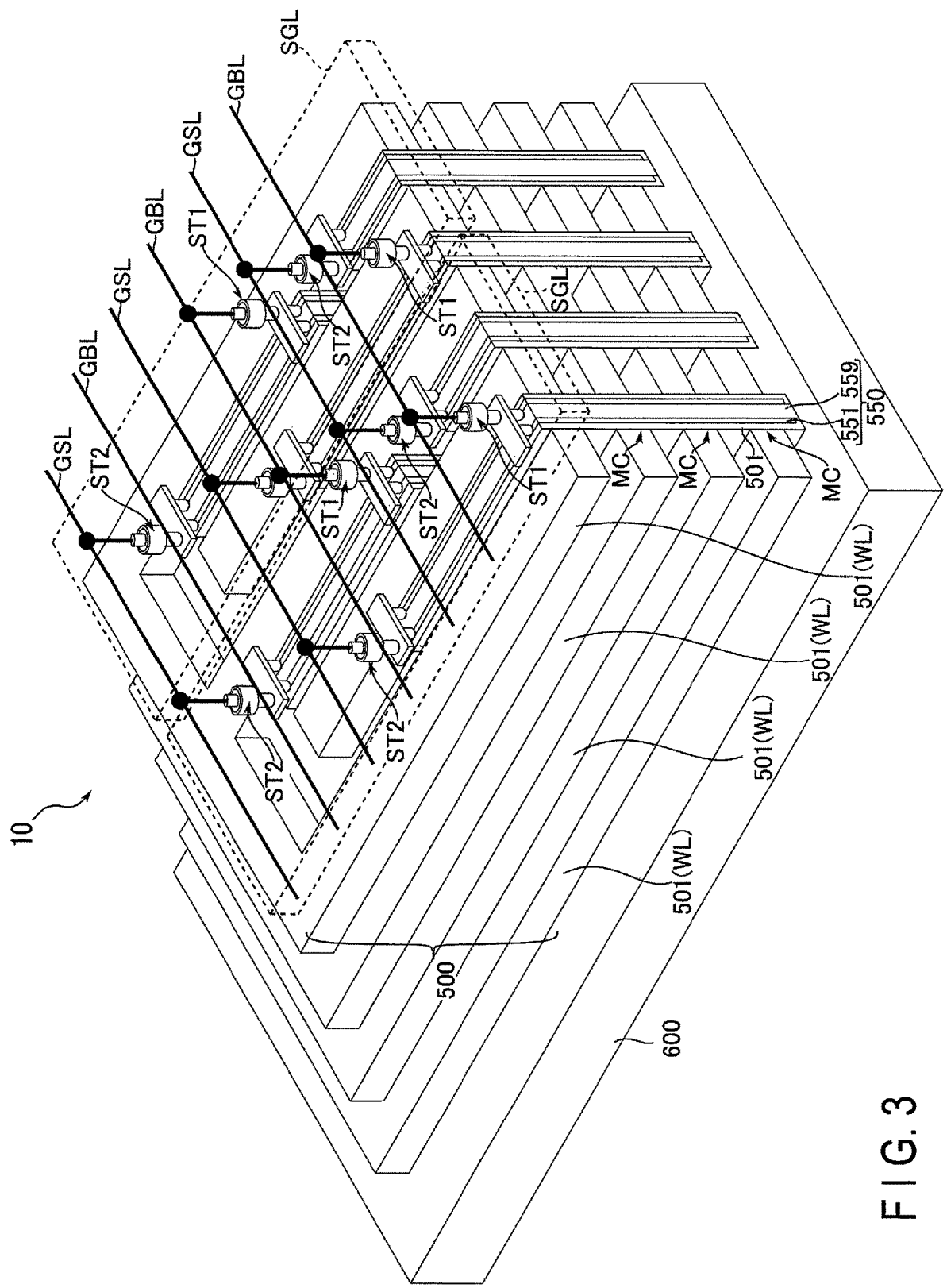
F I G. 3

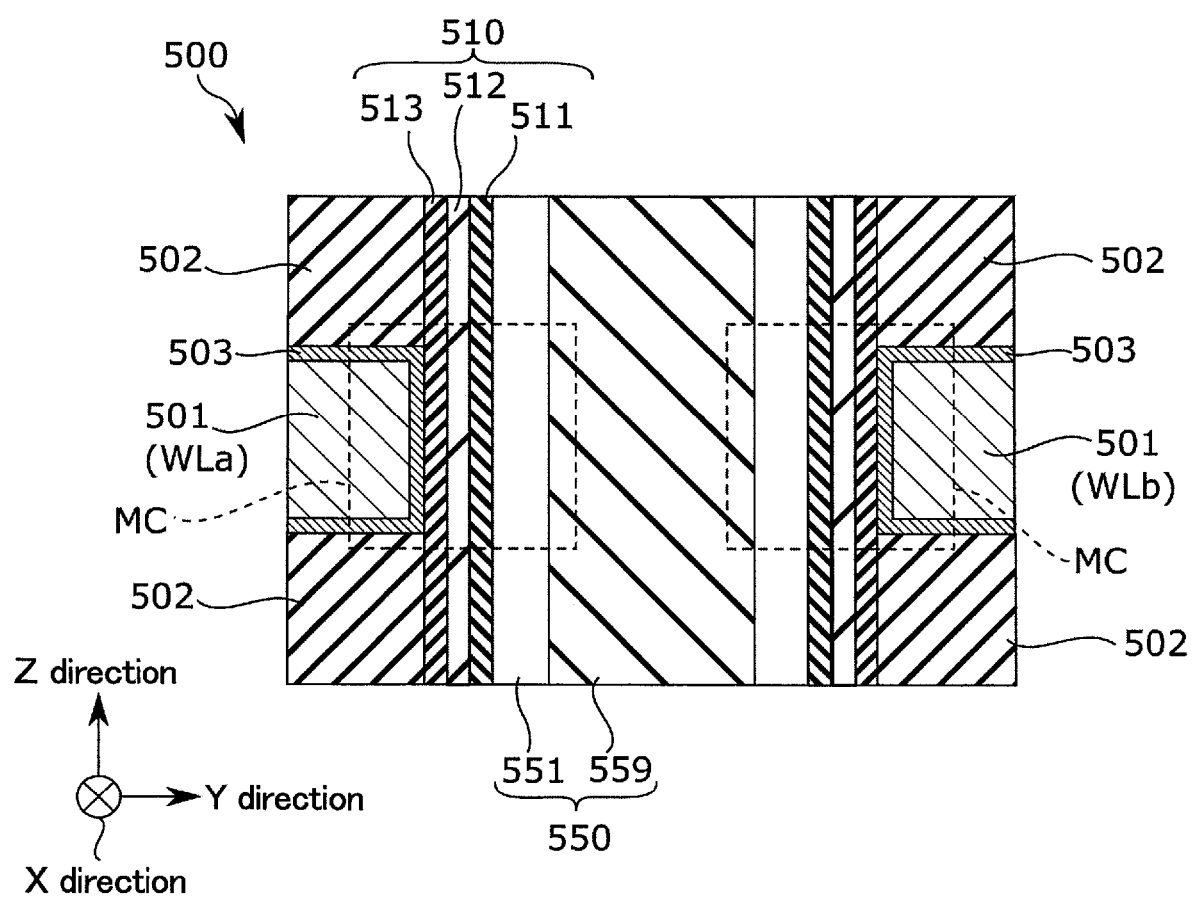
F I G. 9

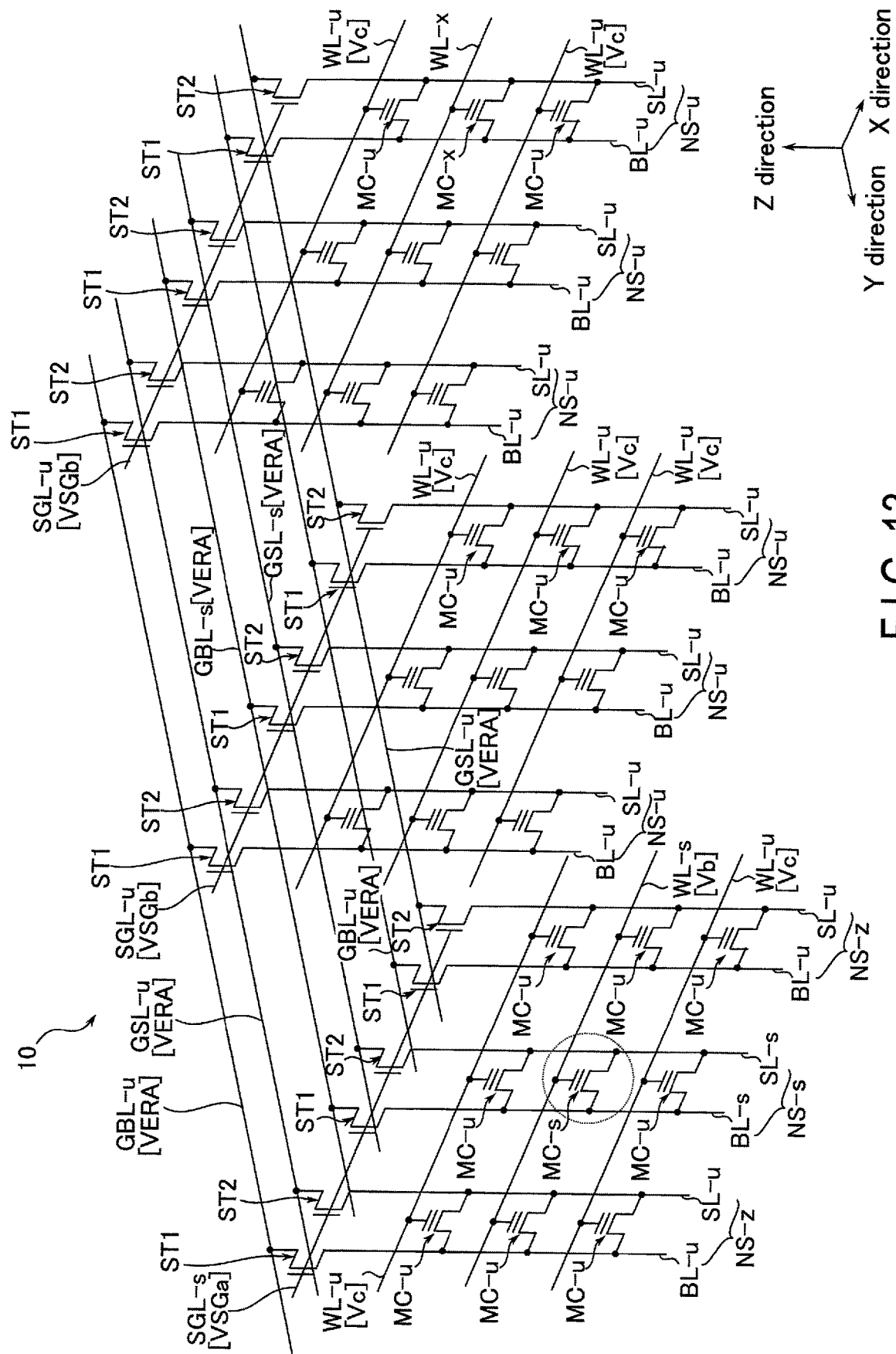
F I G. 13

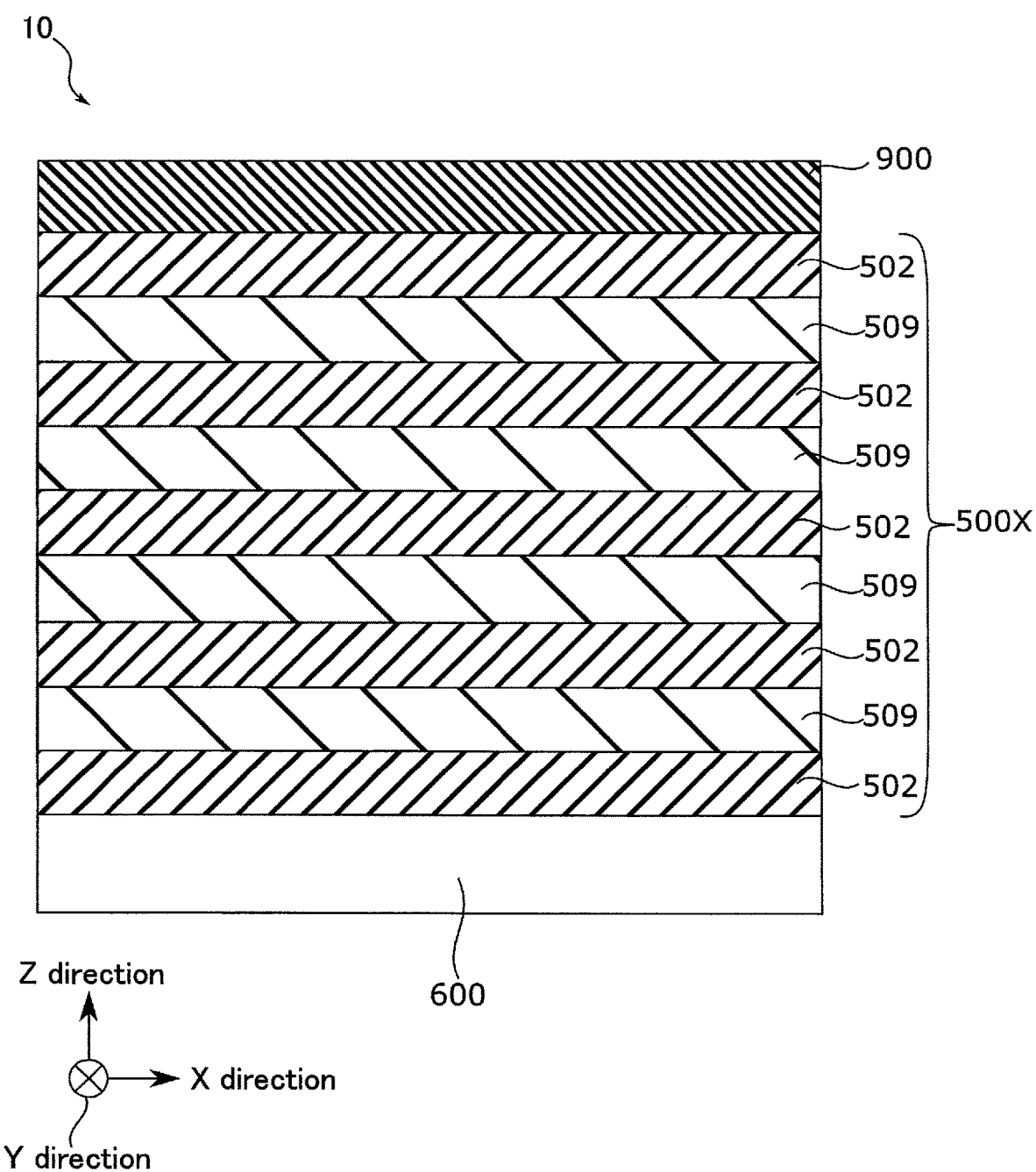
F I G. 15

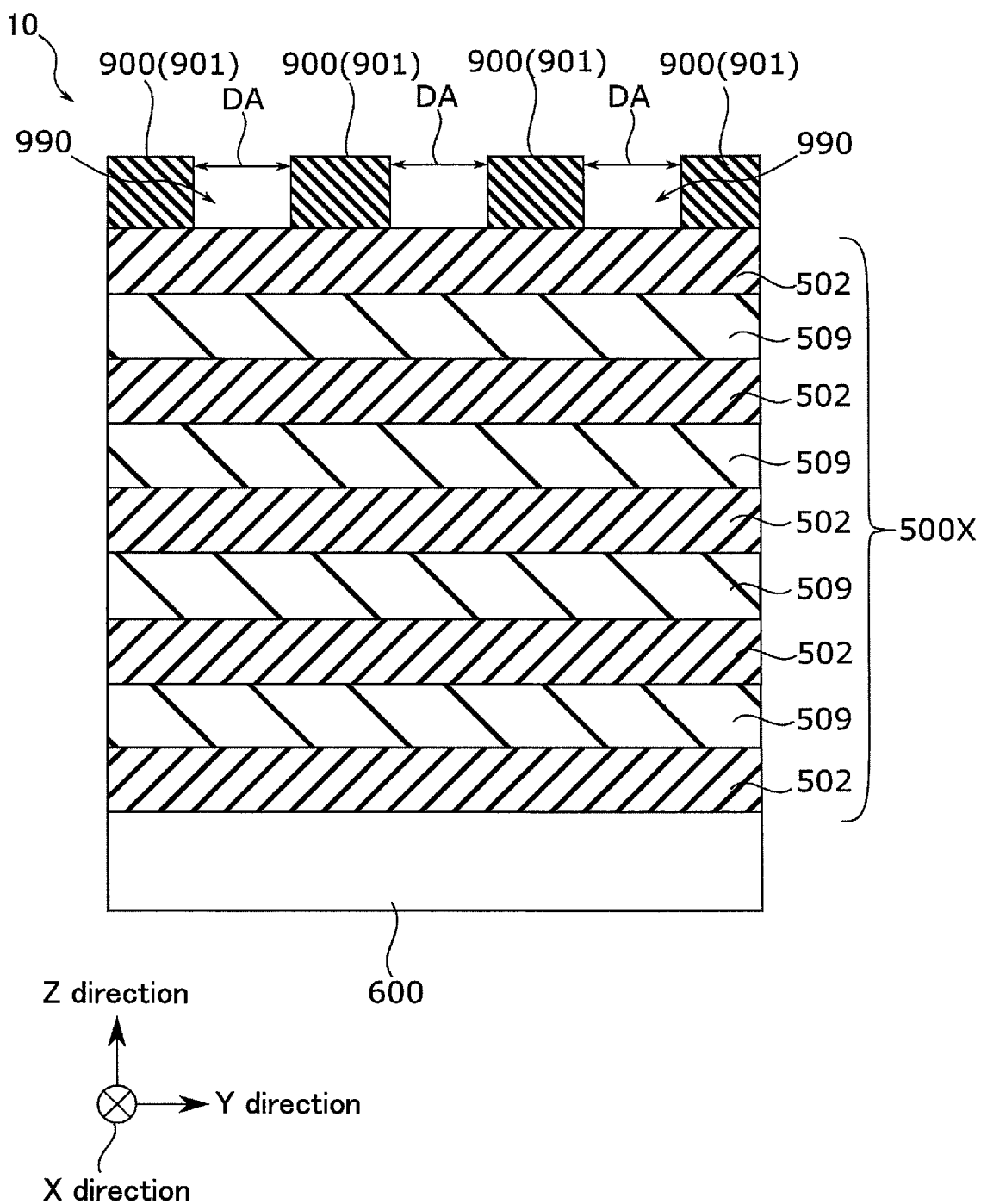
F I G. 16

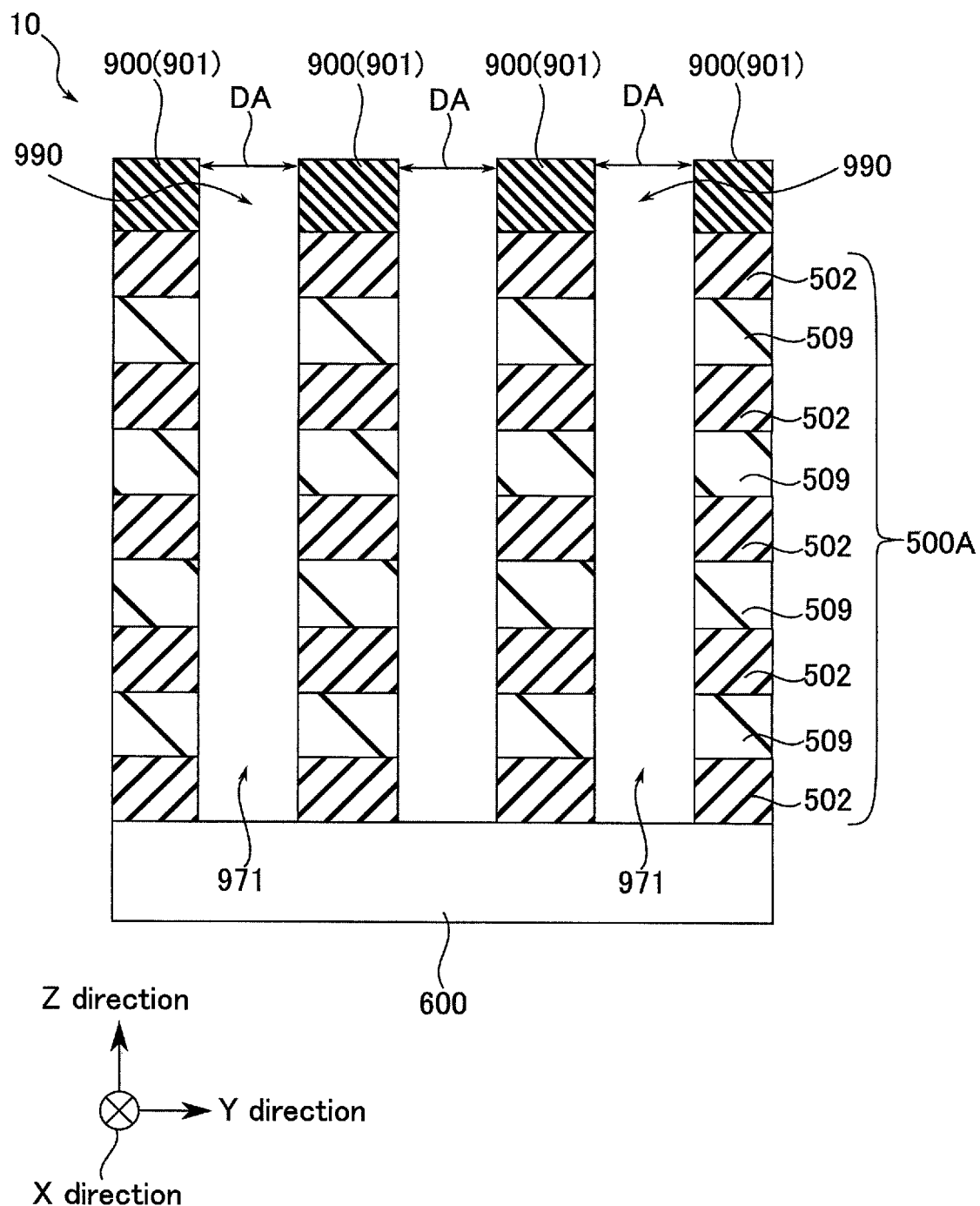
F I G. 18

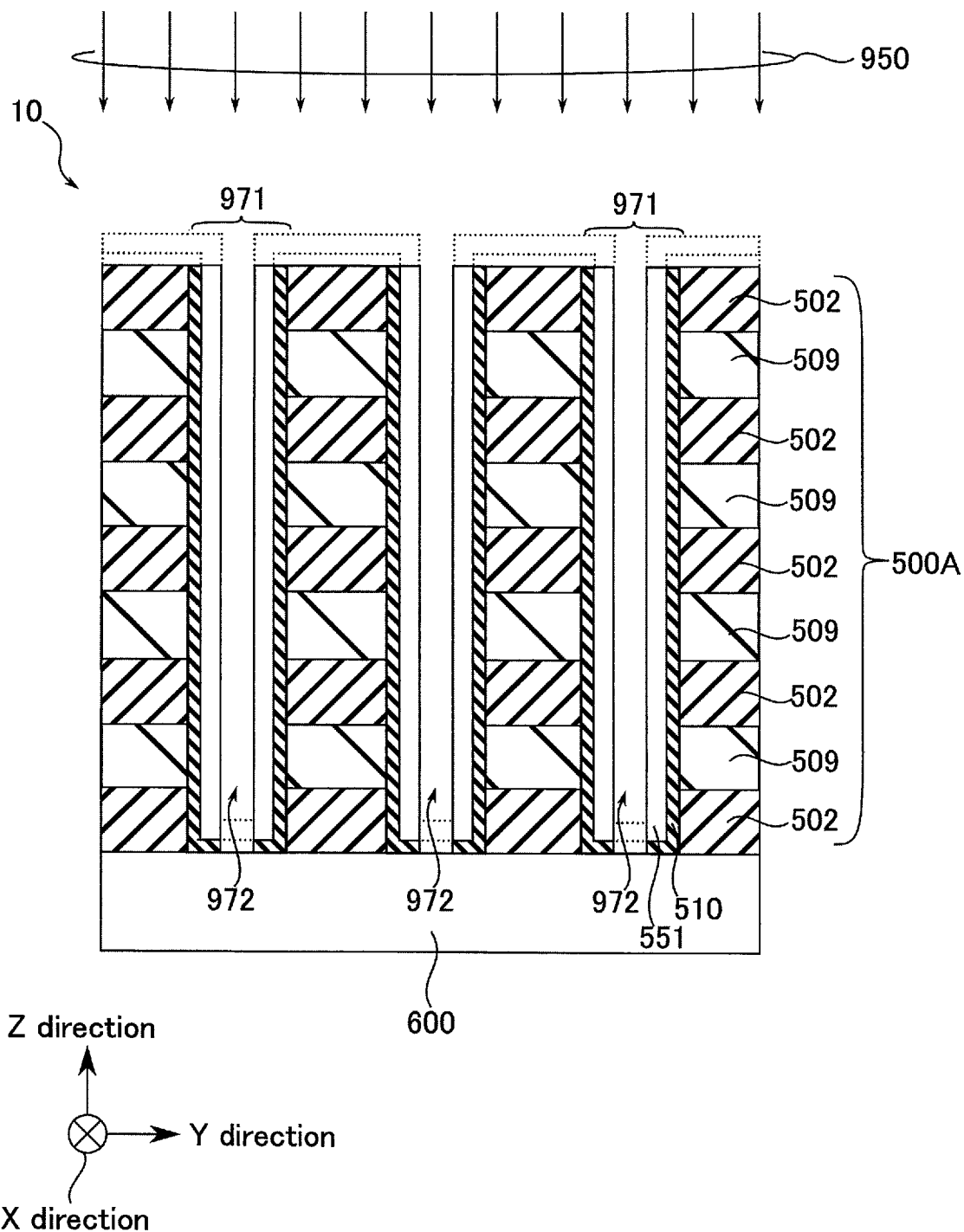
F I G. 20

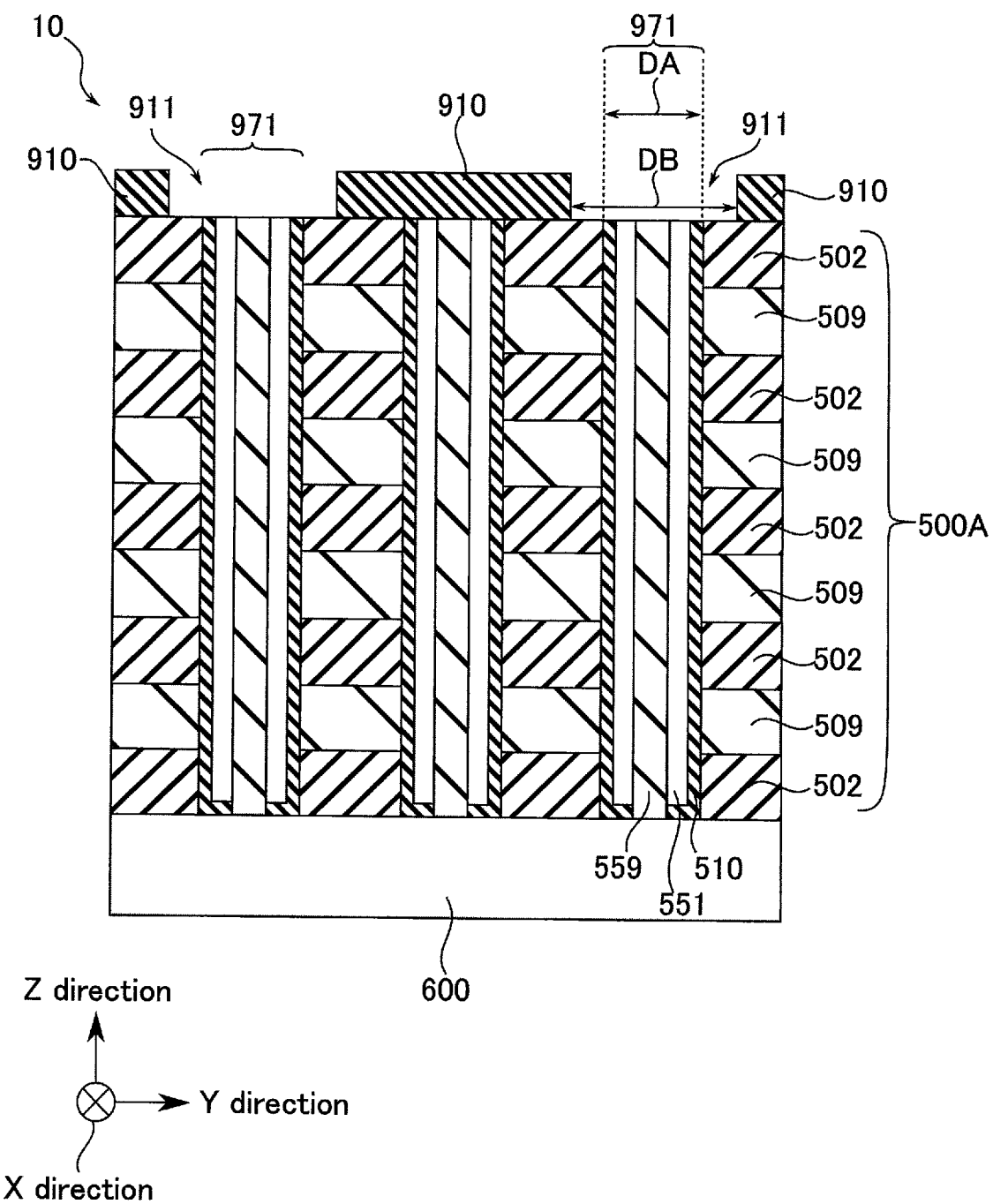
F I G. 23

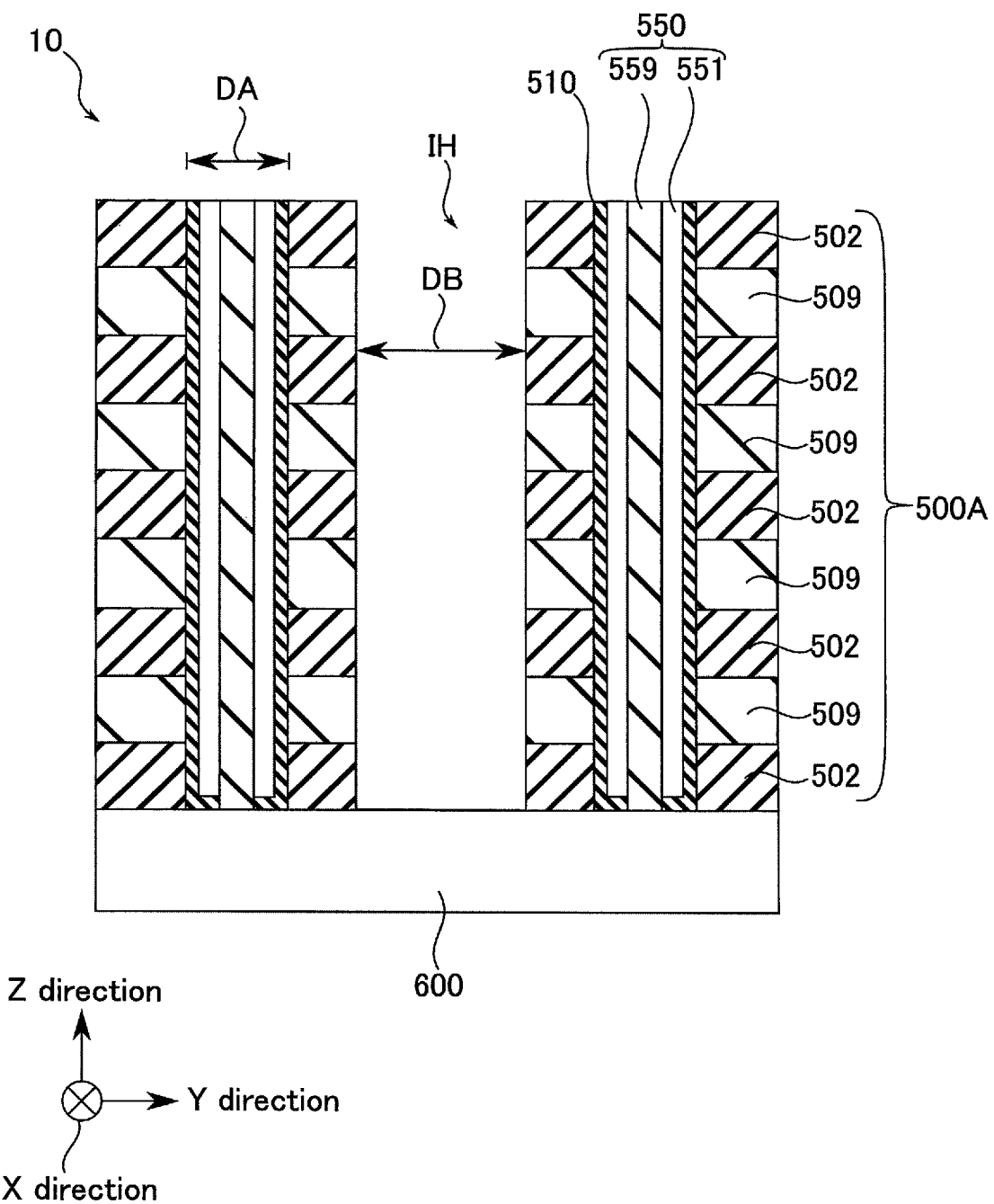
F I G. 25

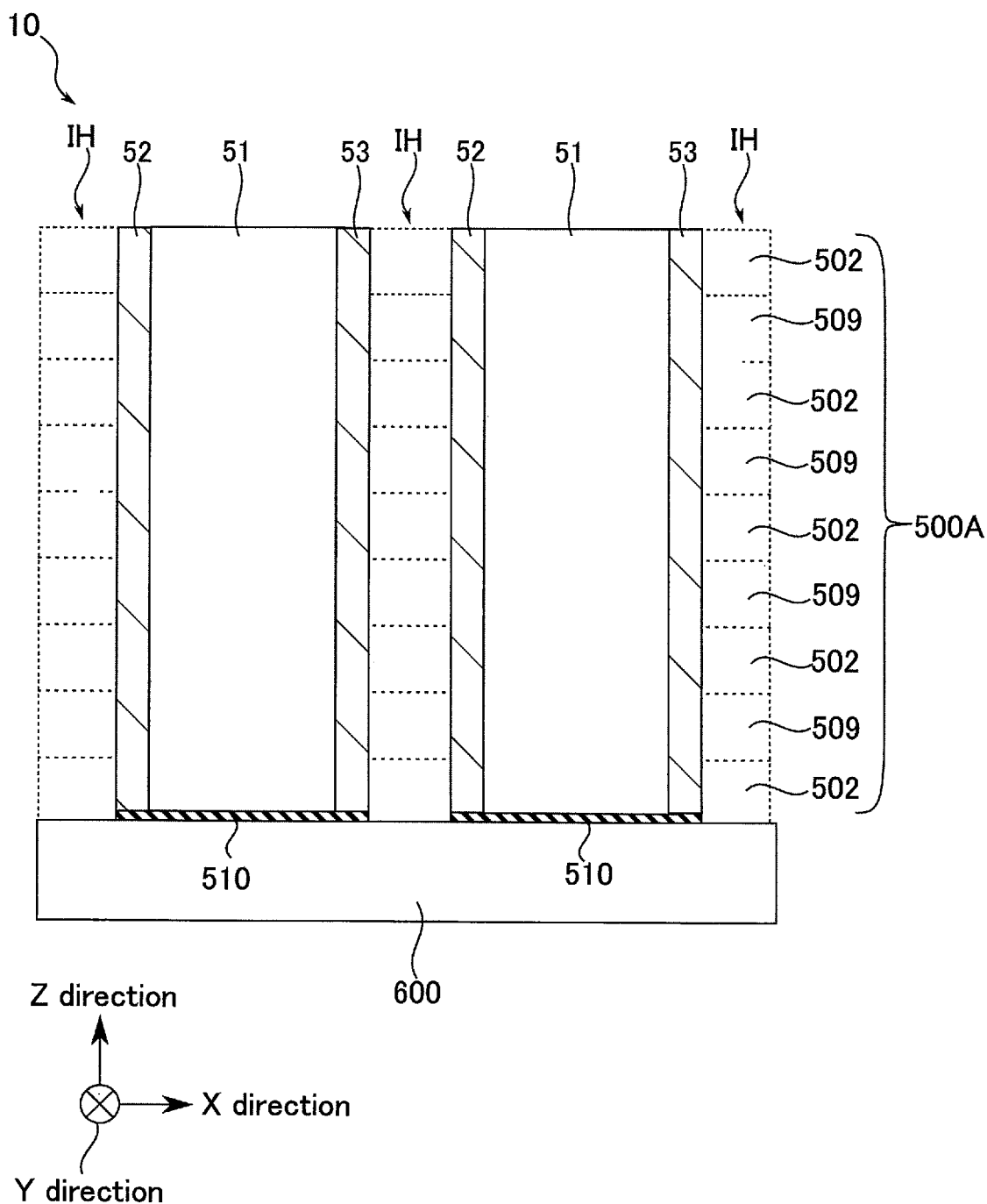
F I G. 29

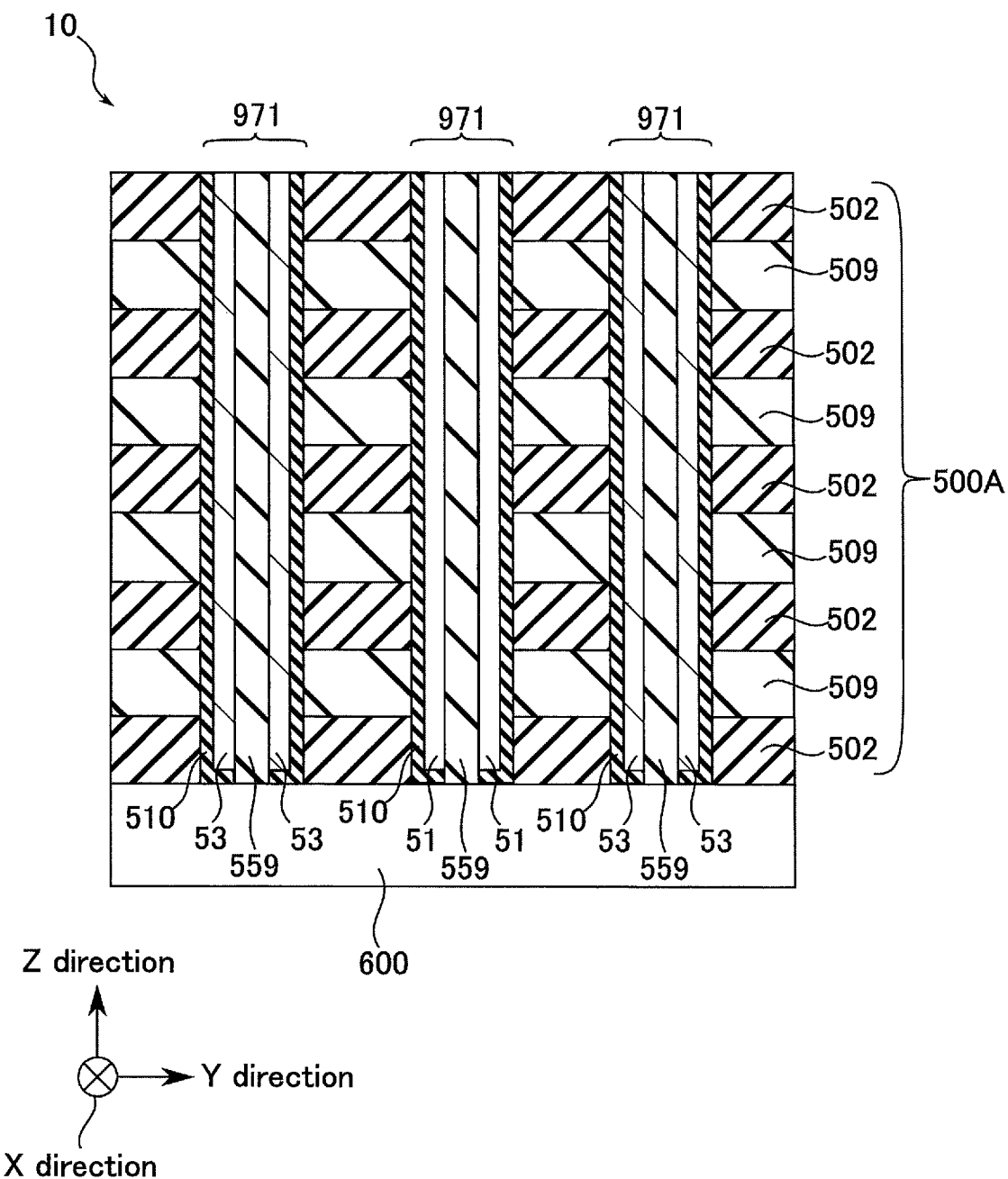
F I G. 30

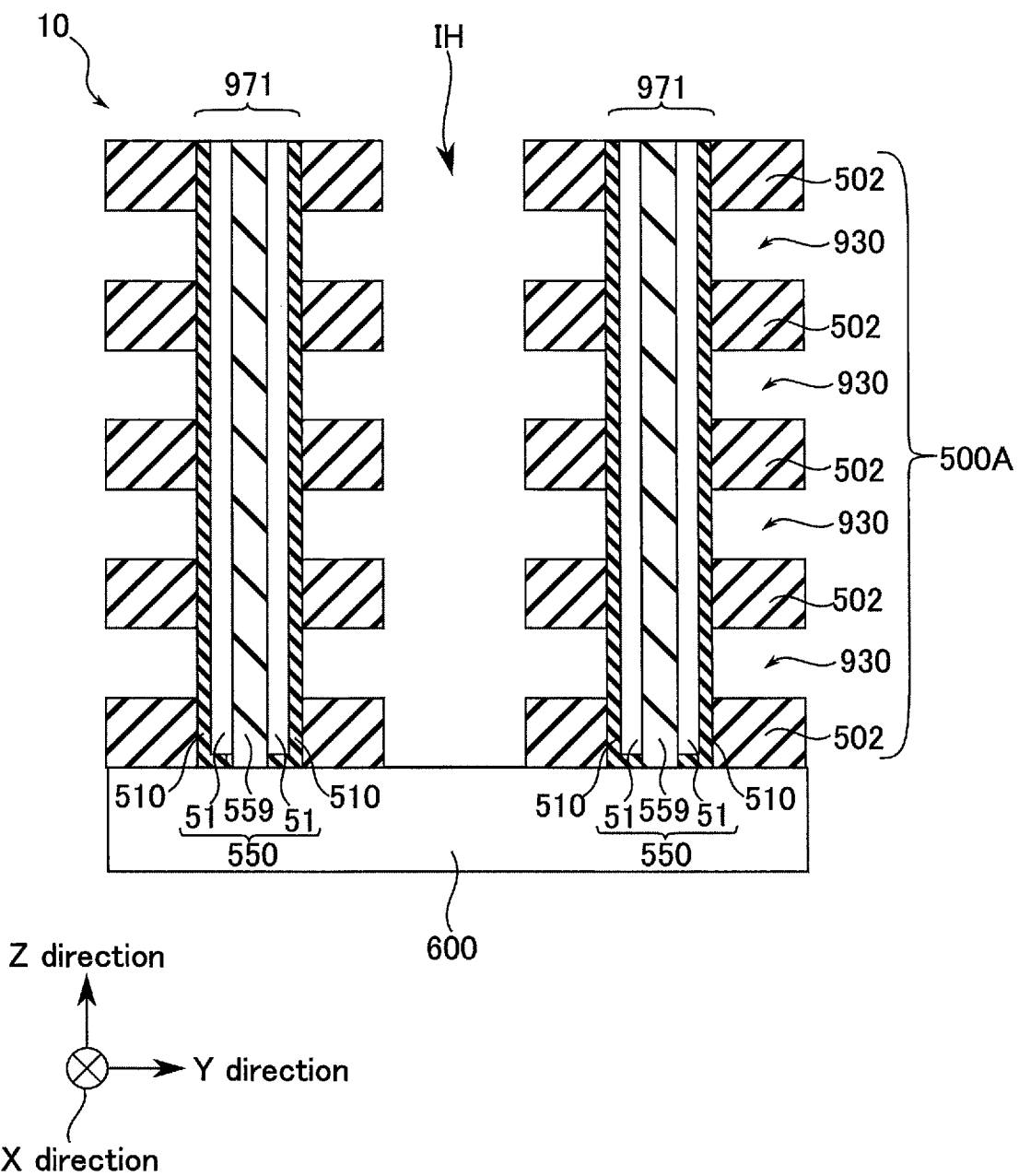
F I G. 31

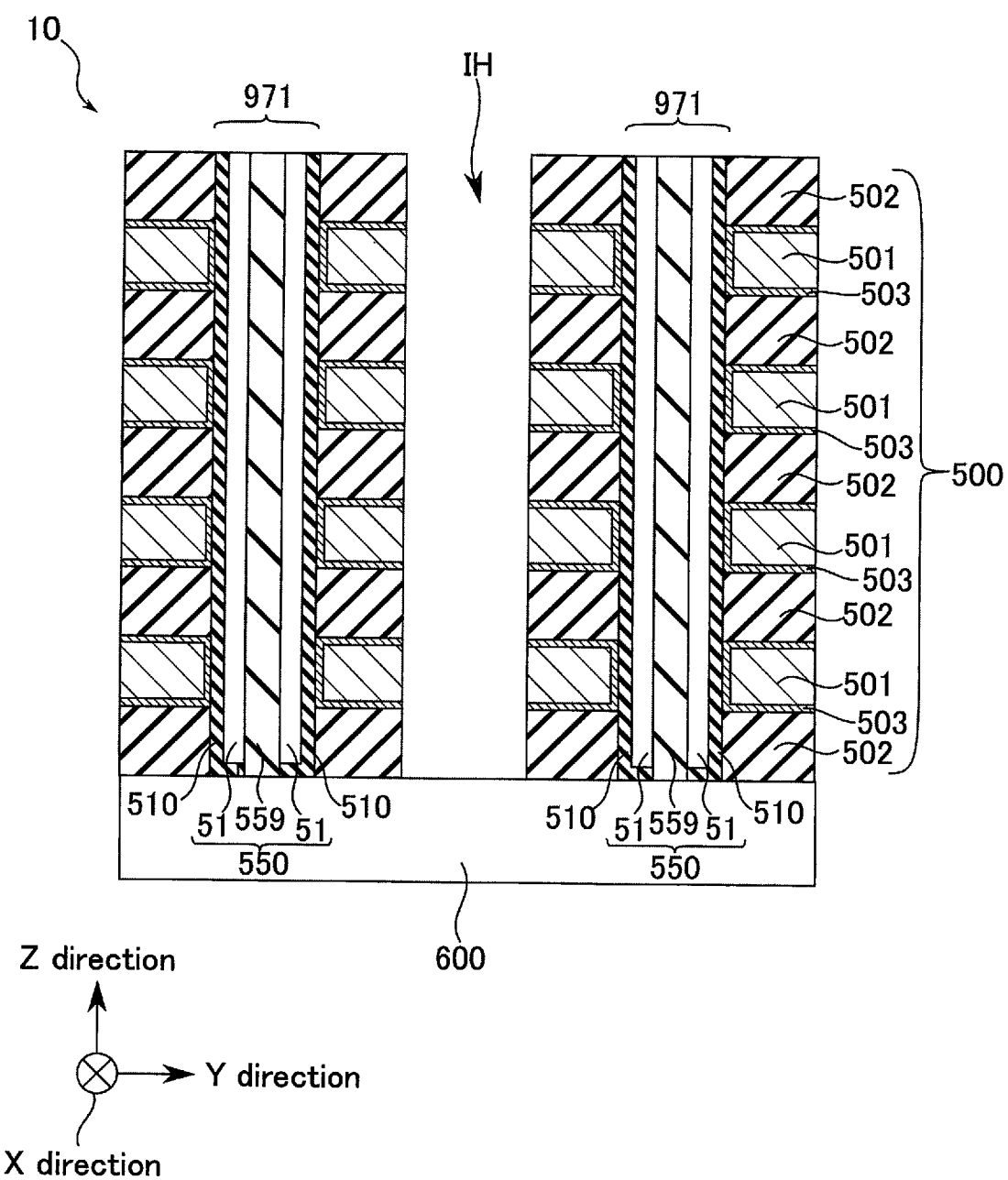
F I G. 33

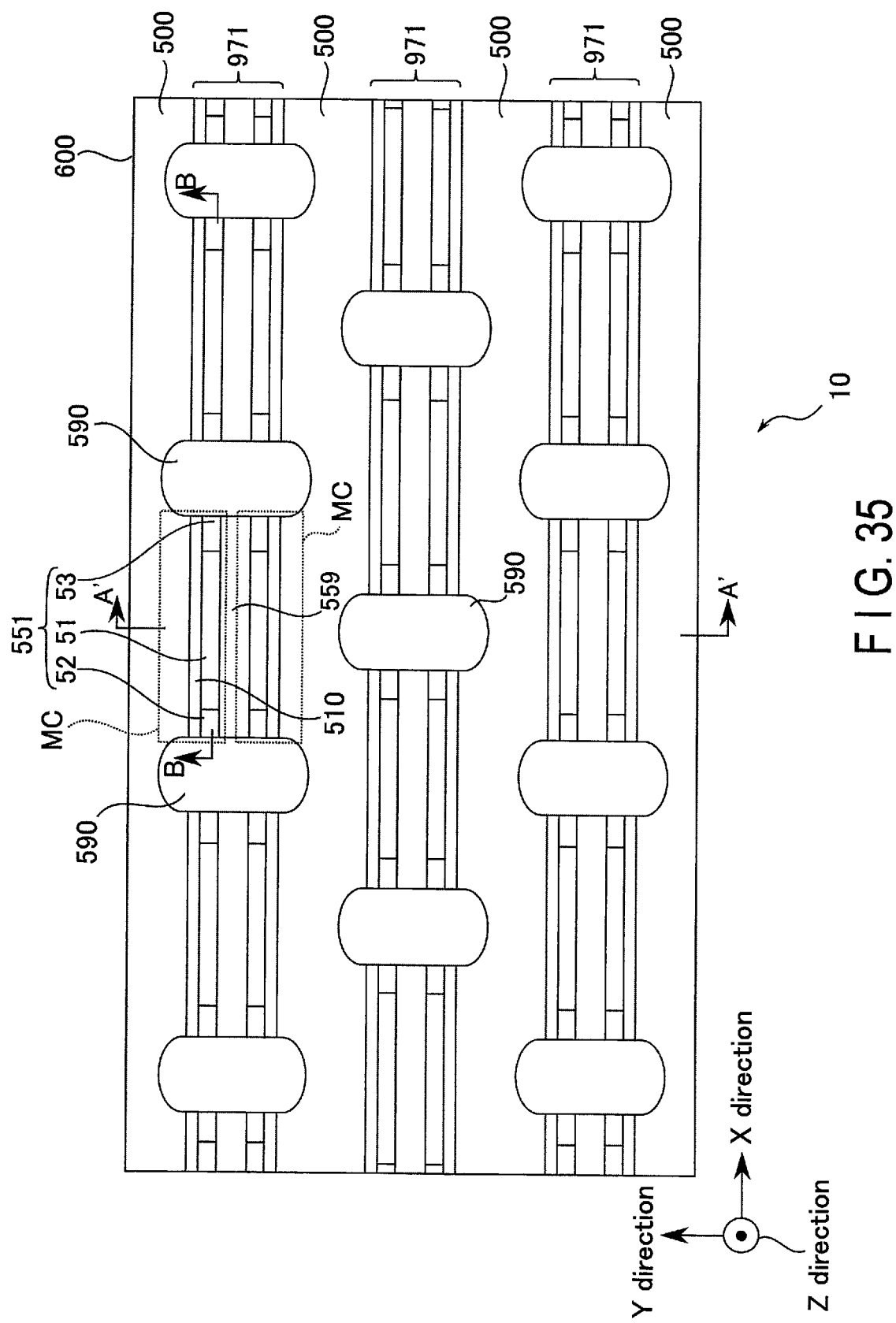
F I G. 35

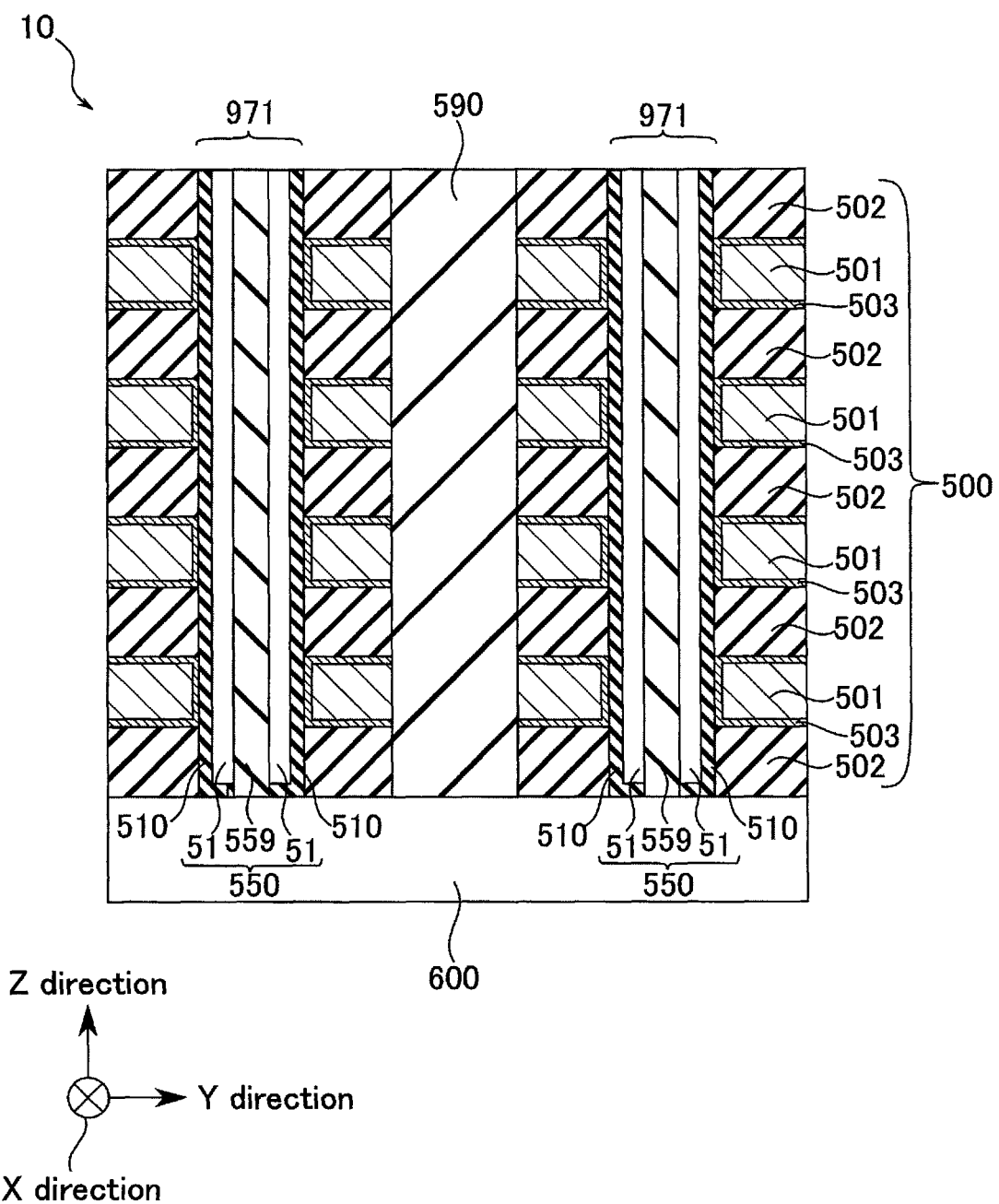
F I G. 36

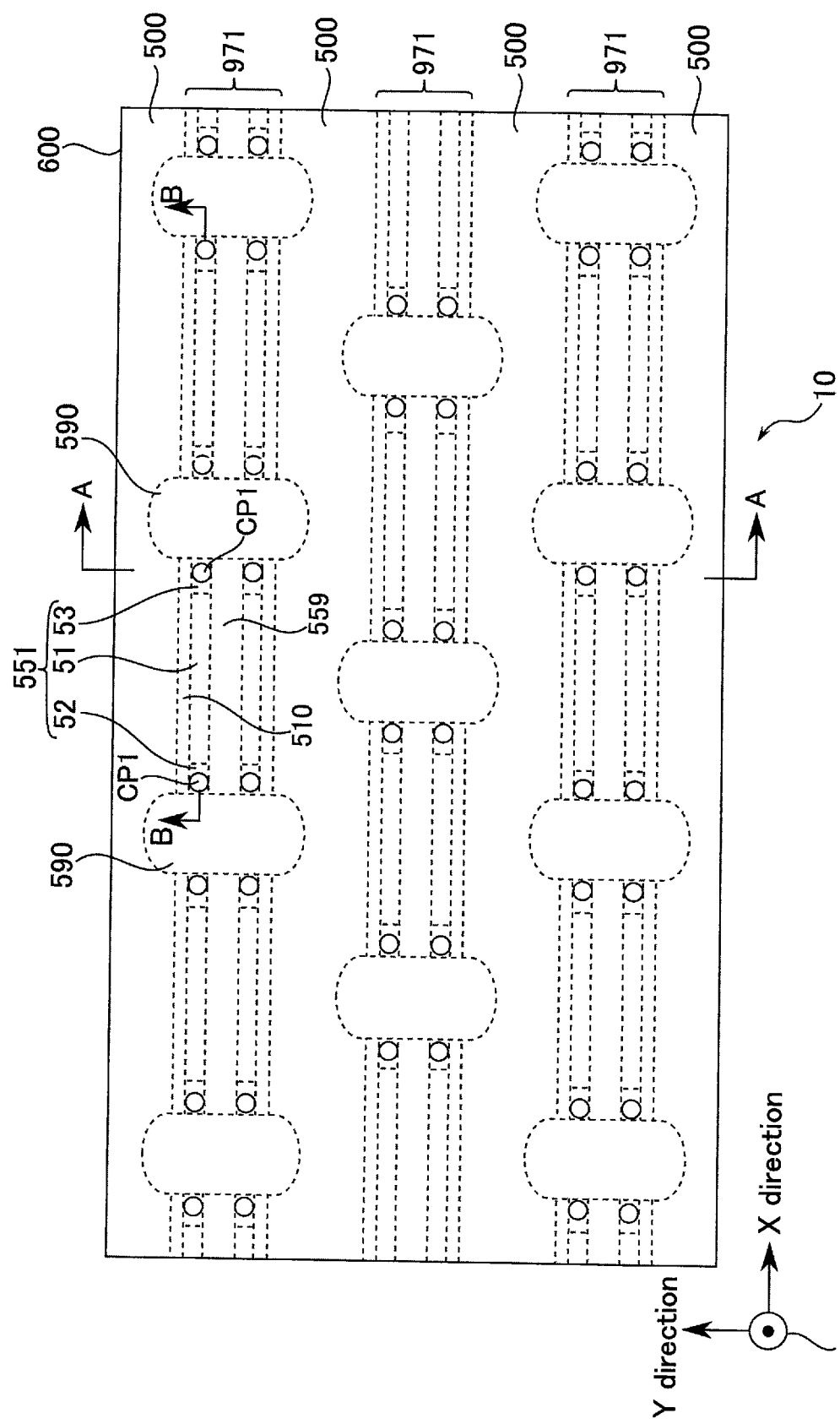
F I G. 38

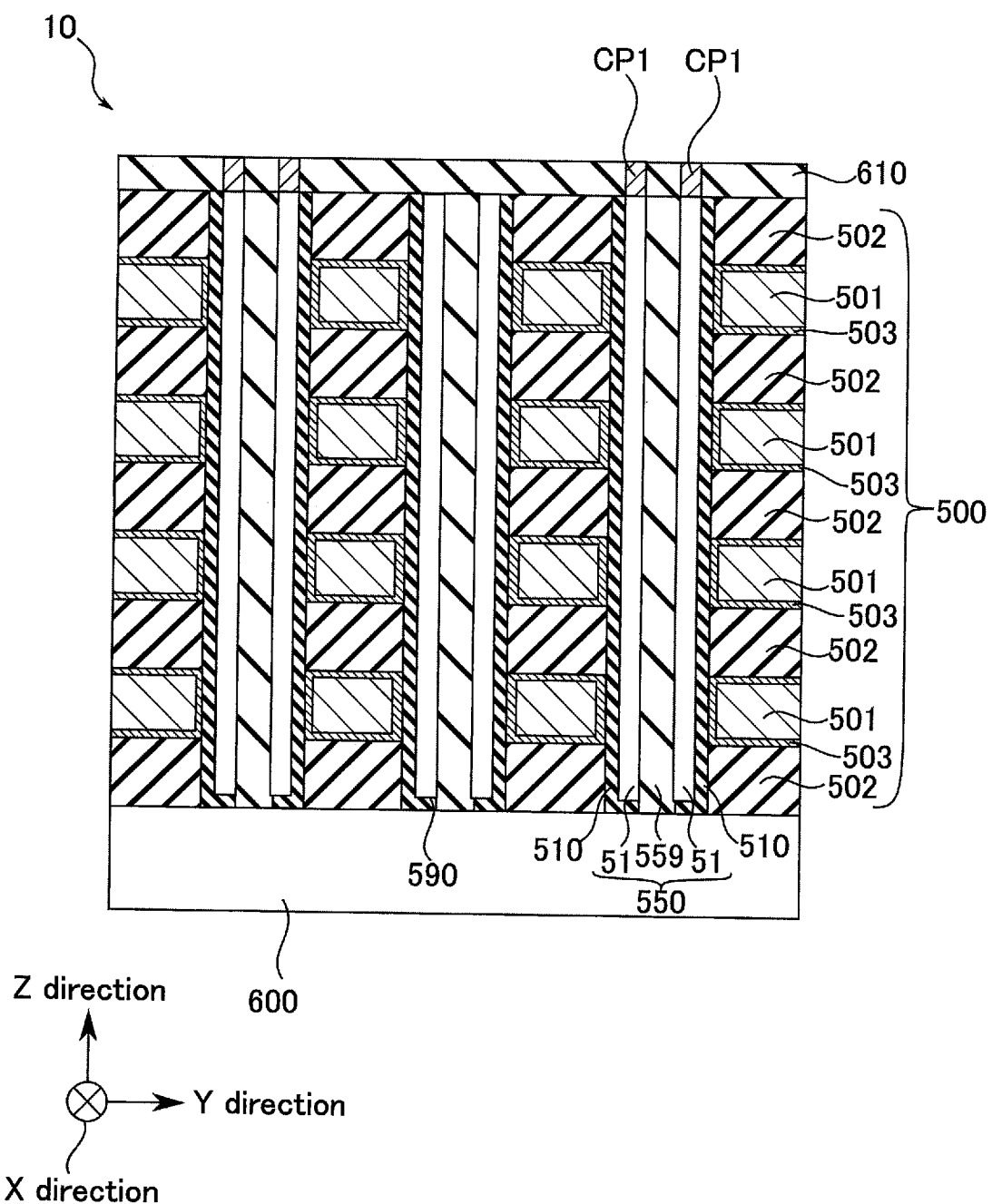
F I G. 39

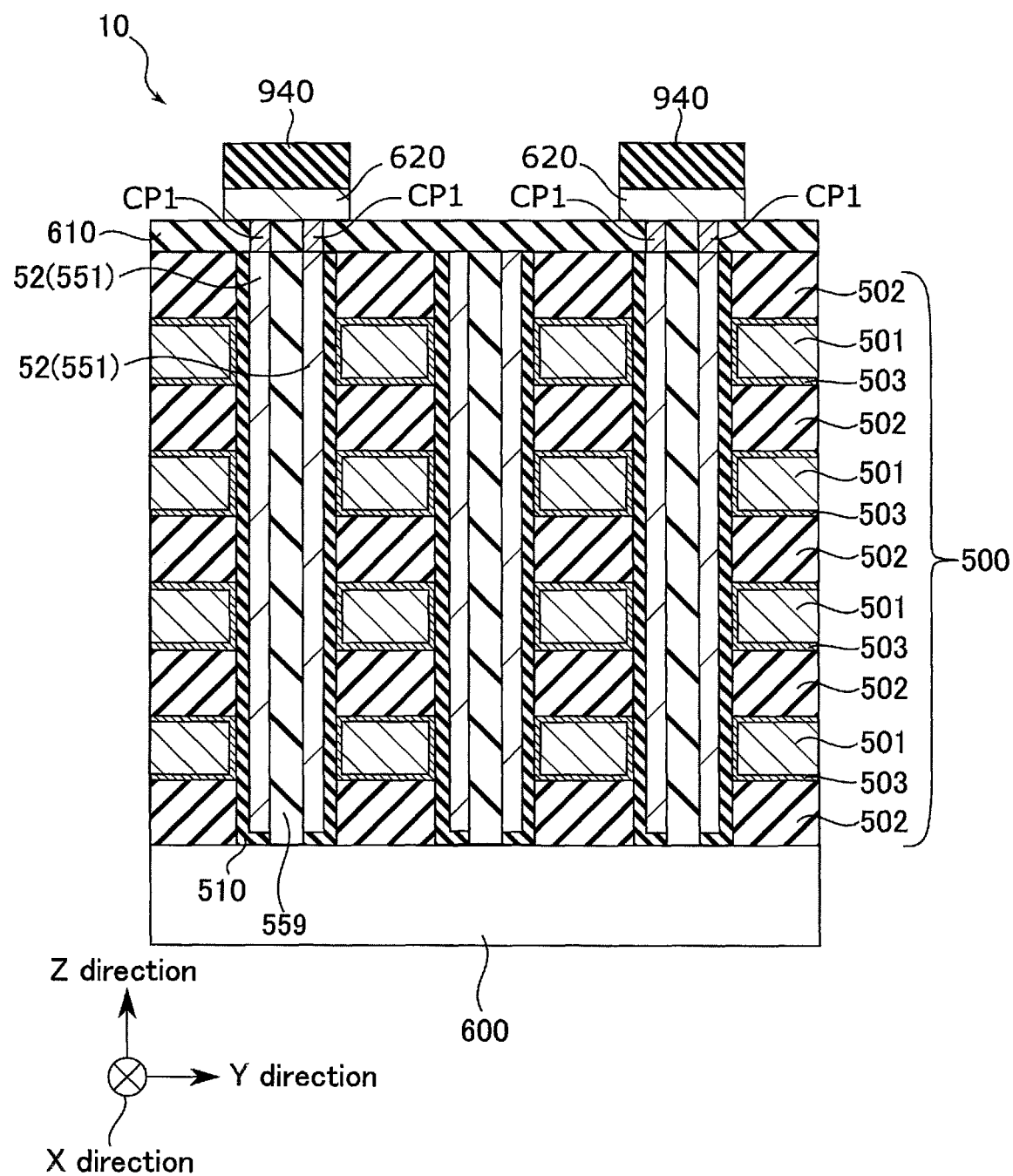
F I G. 42

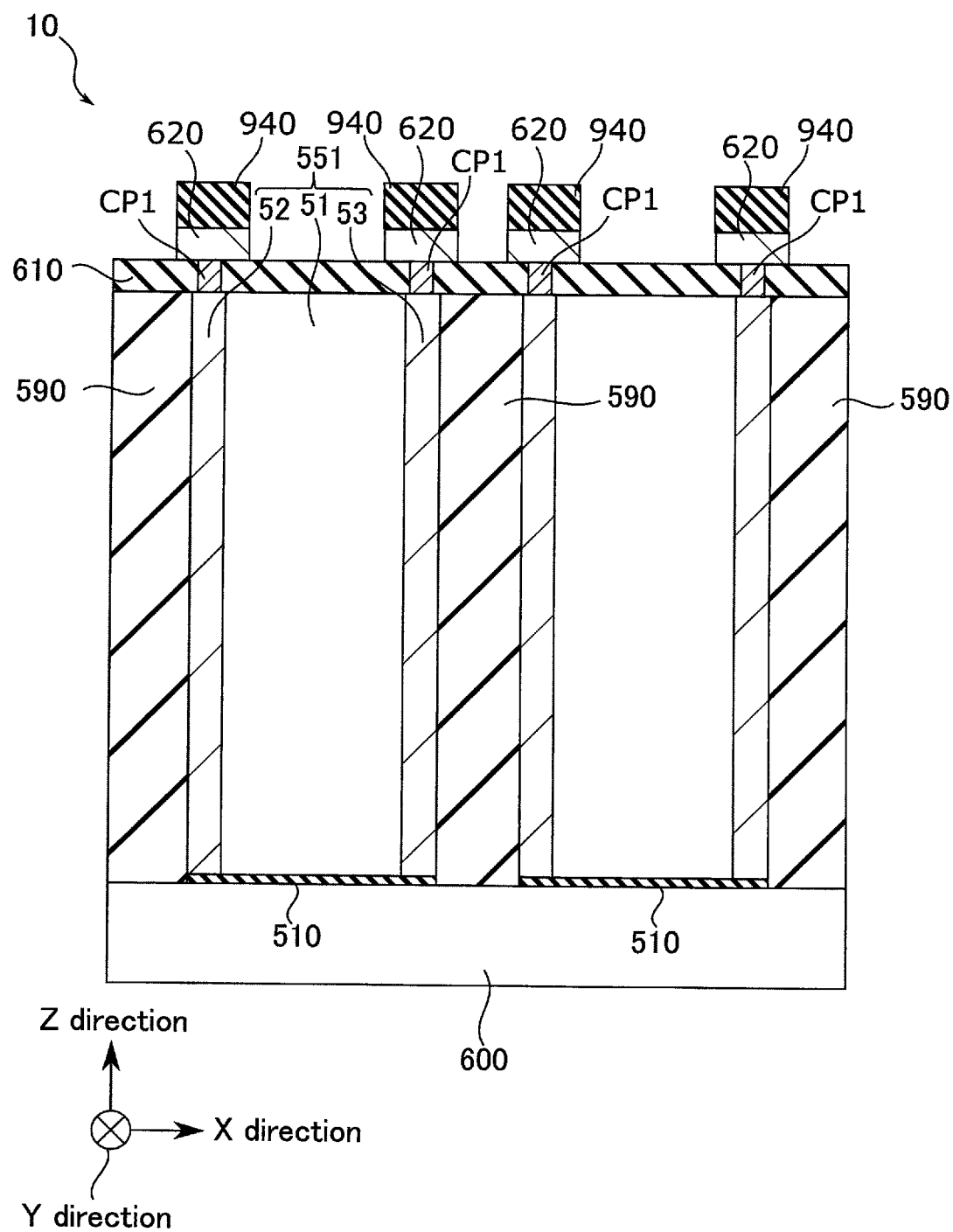
F I G. 43

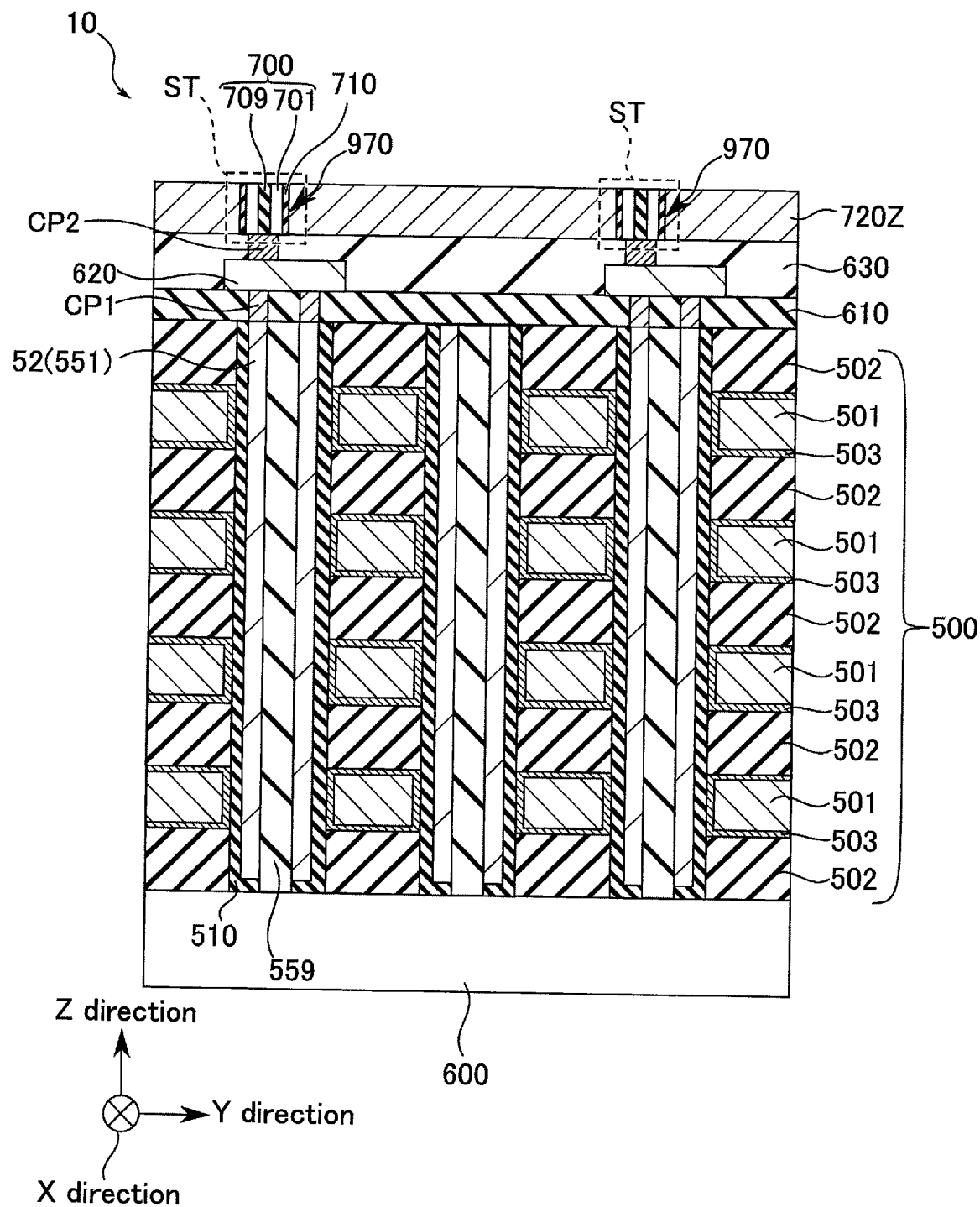
F I G. 45

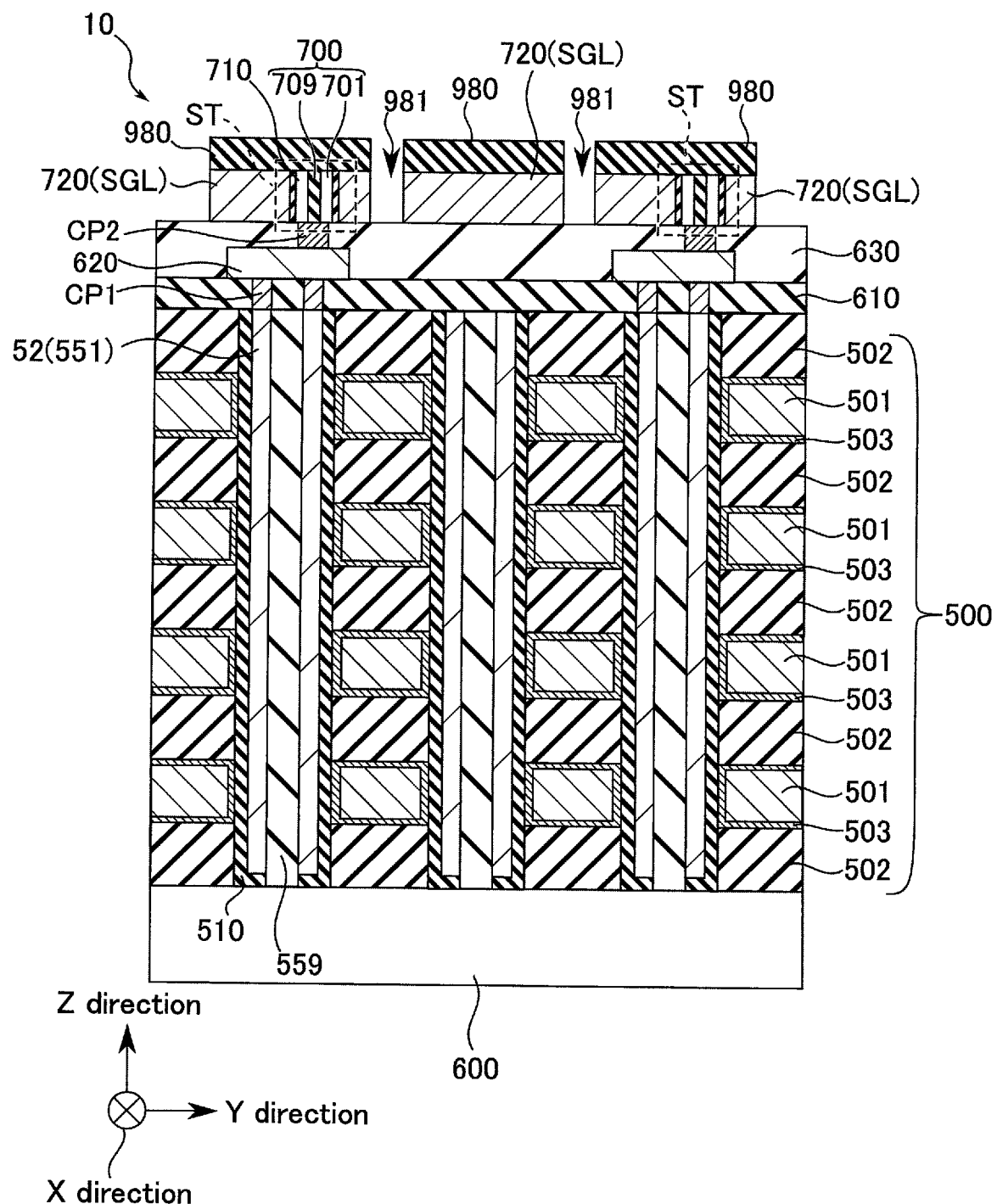
F I G. 48

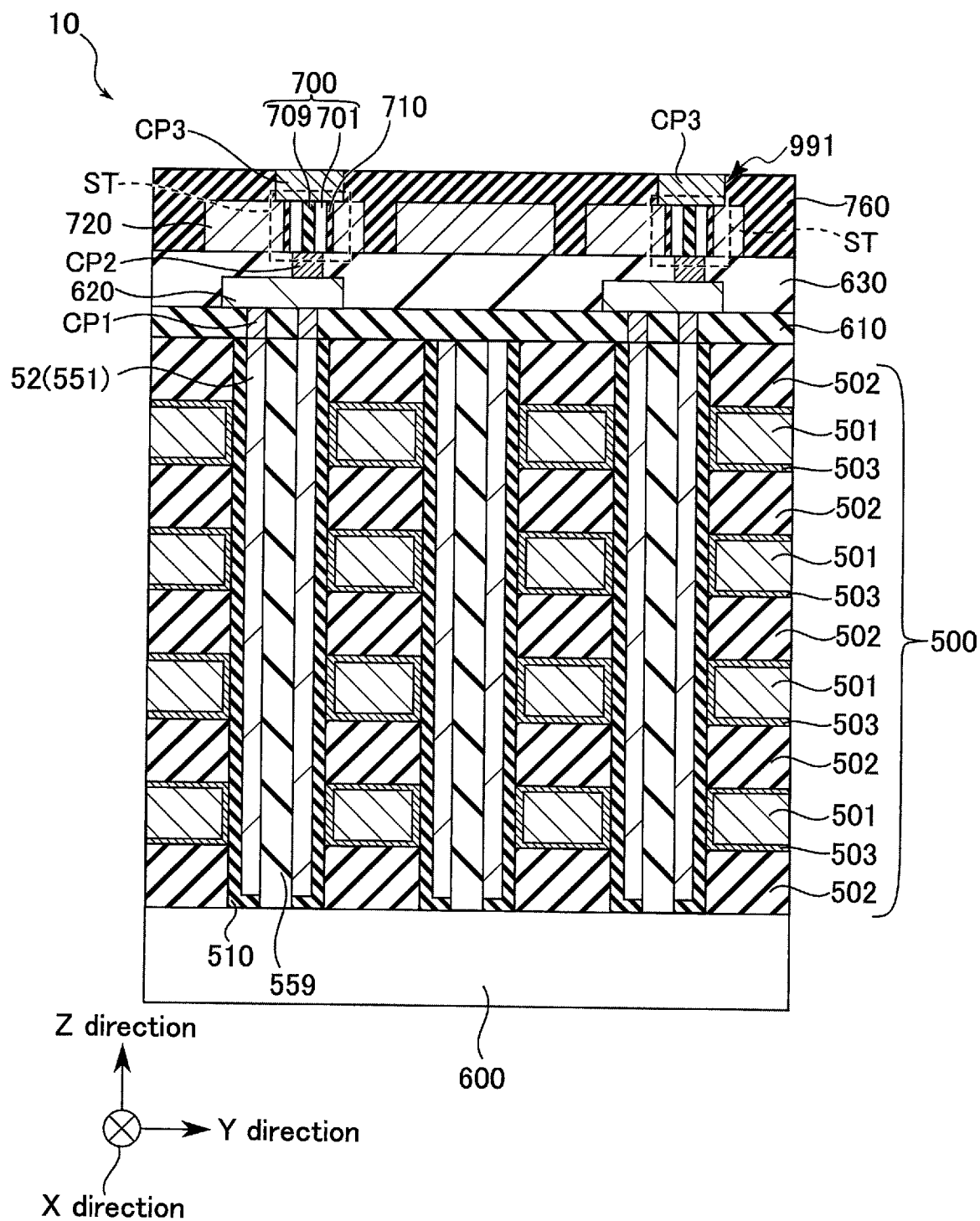
F I G. 49

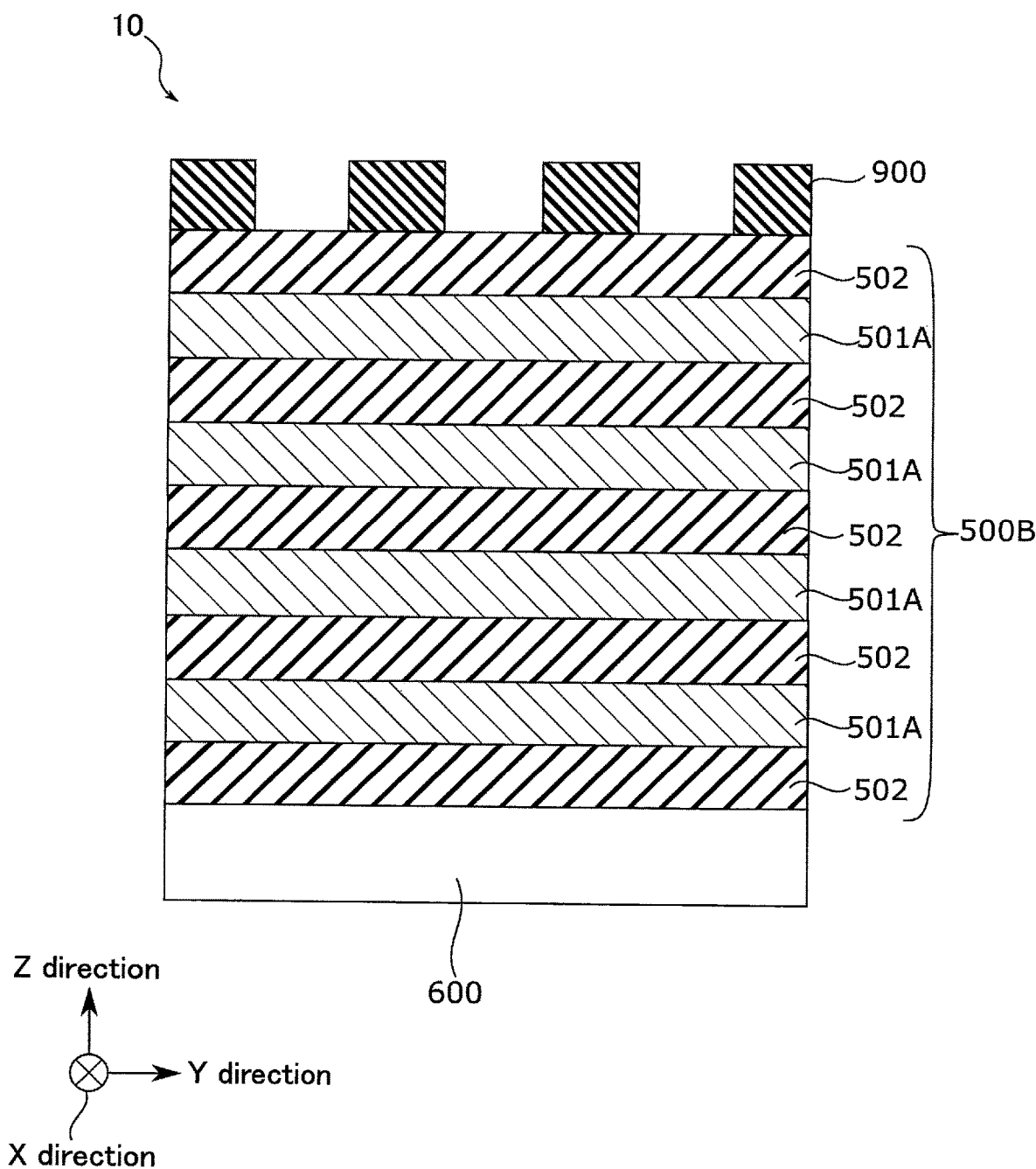
F I G. 51

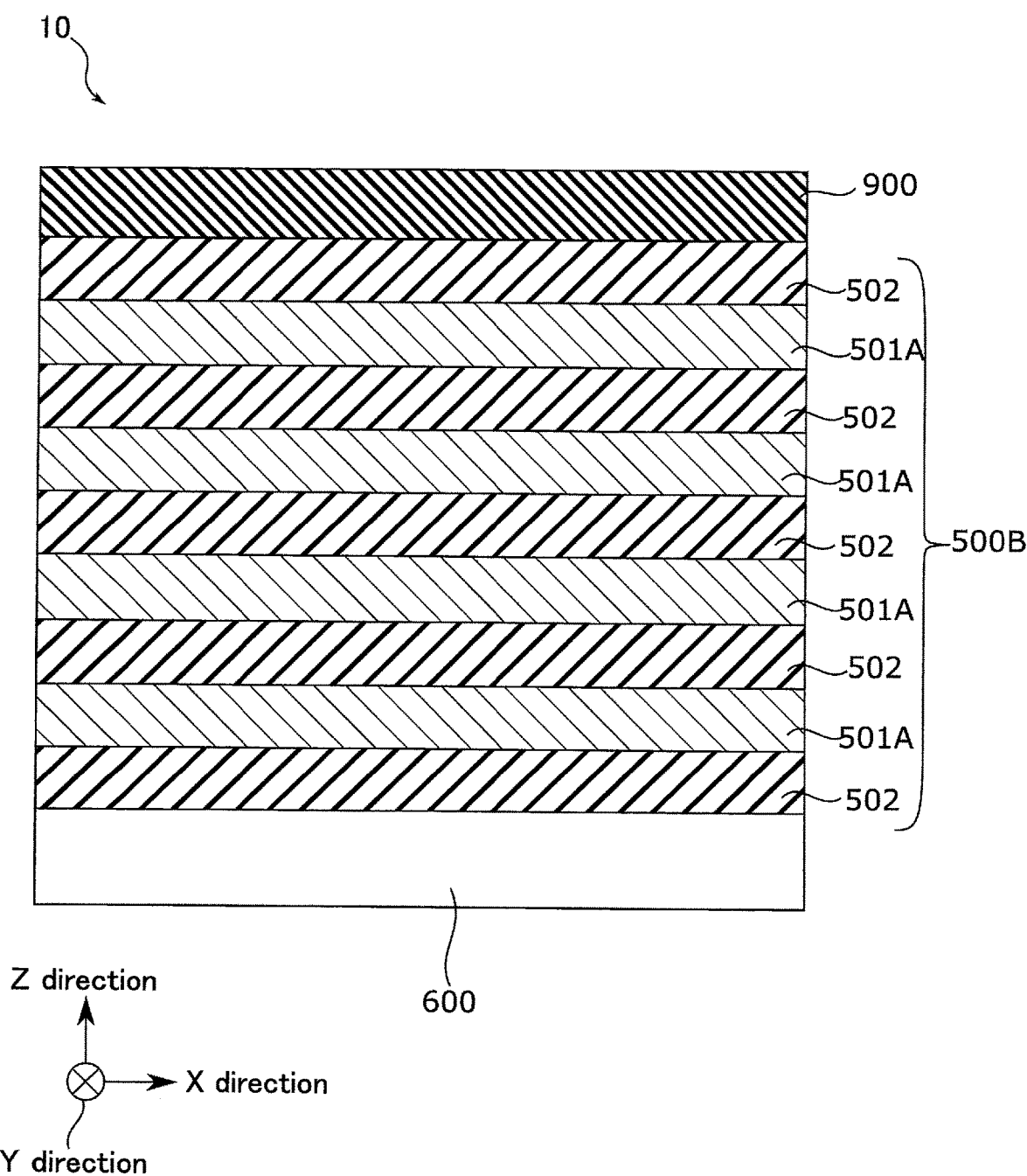
F I G. 52

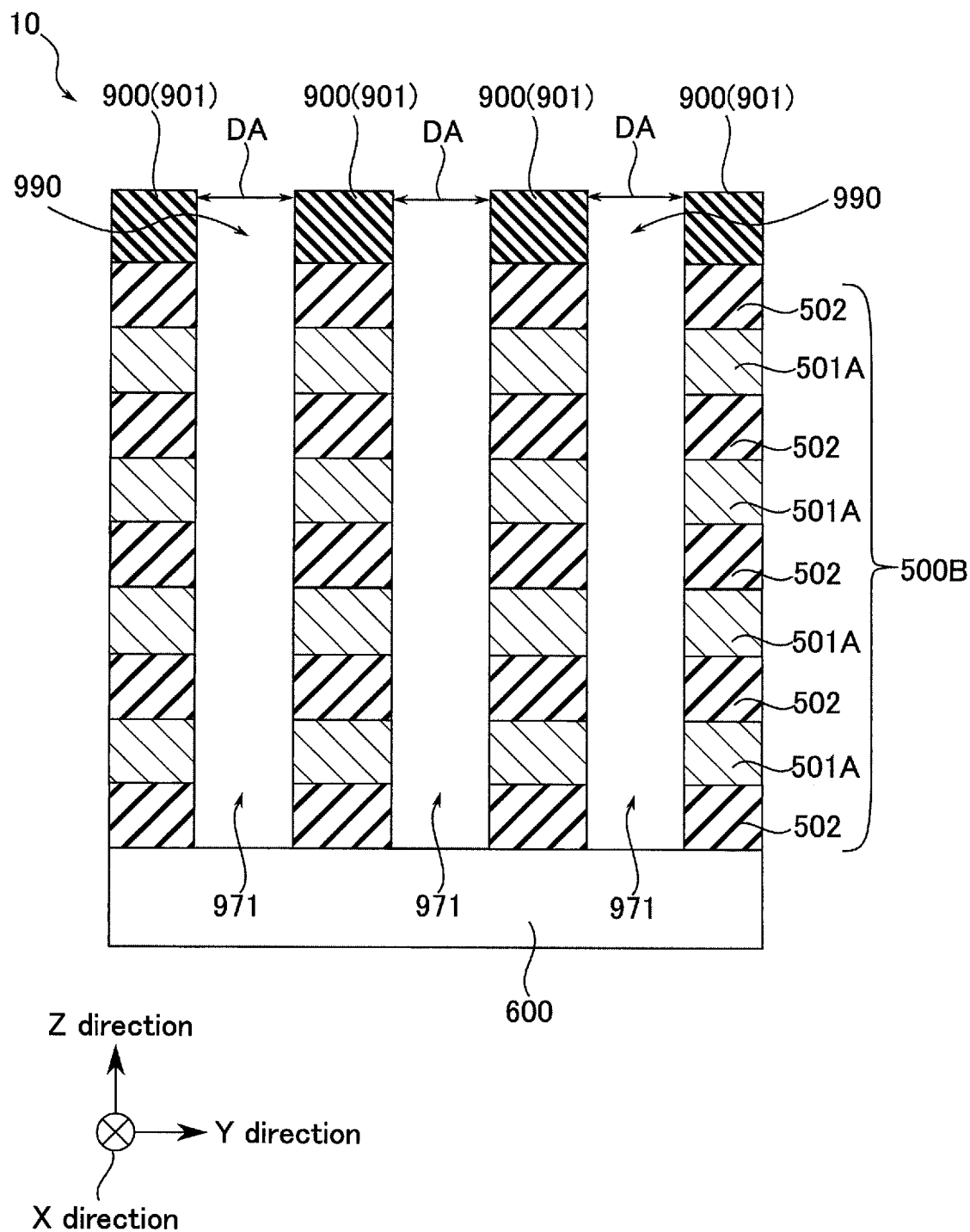
F I G. 53

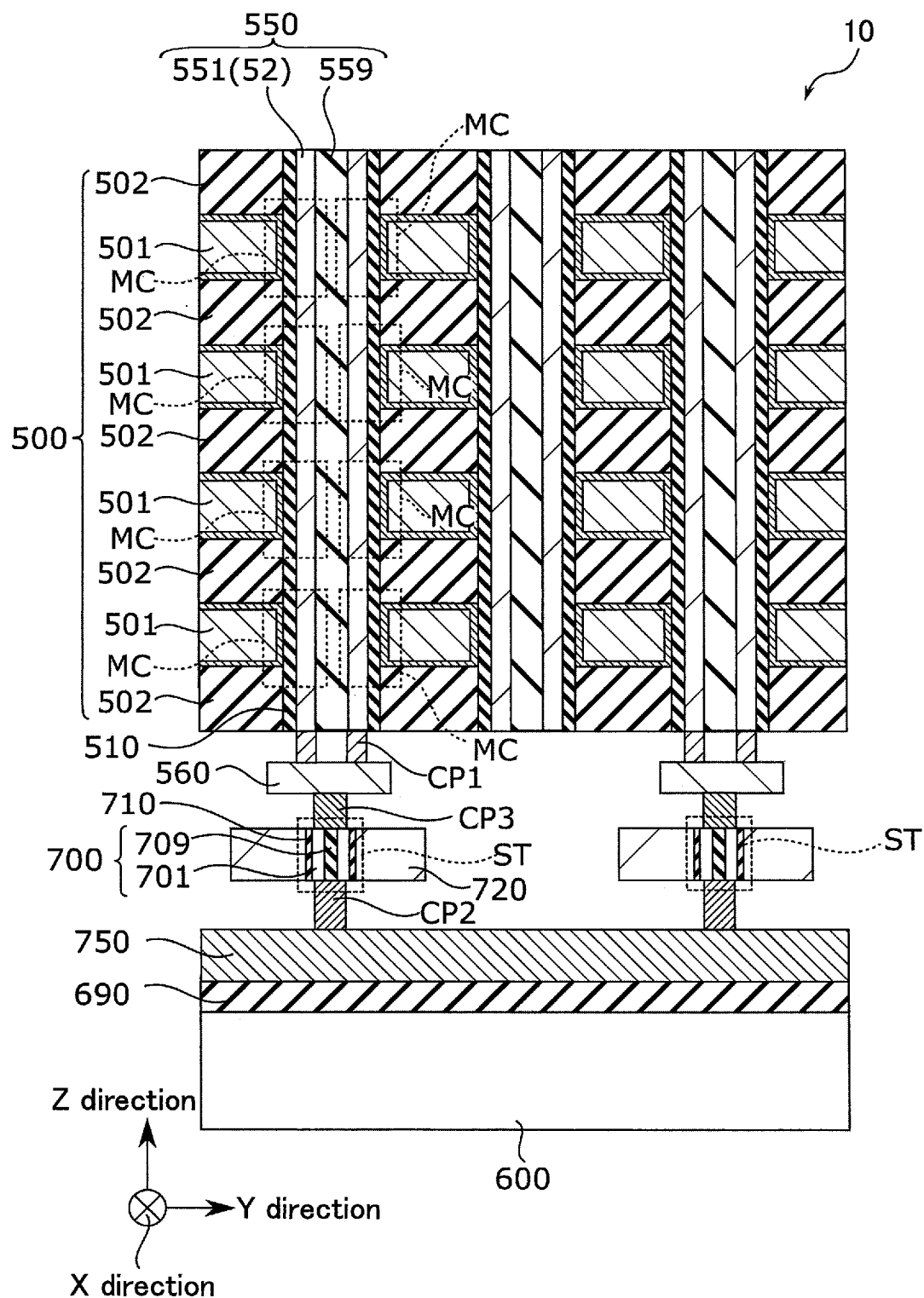
F I G. 57

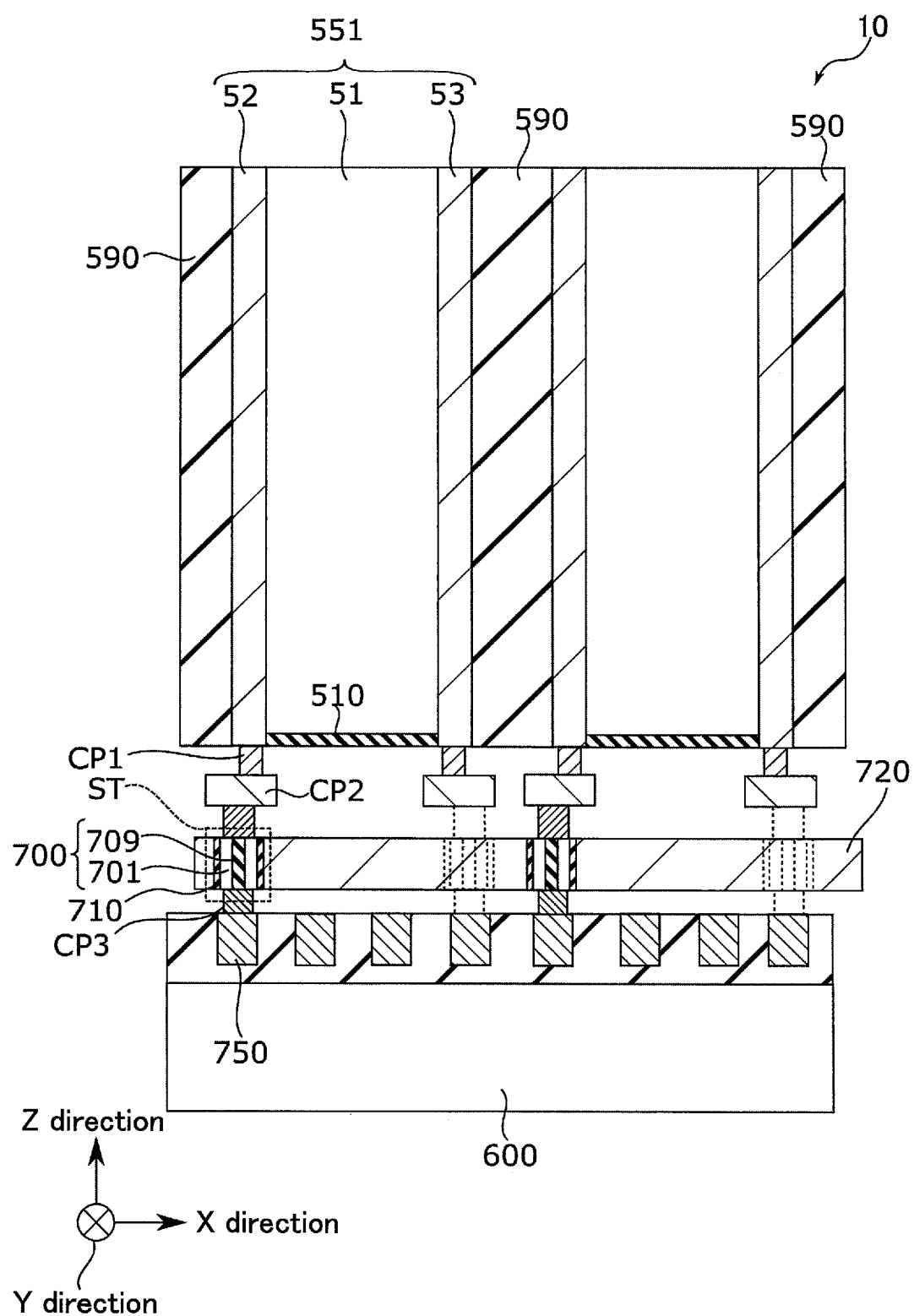
F I G. 58

MEMORY DEVICE WITH TRANSISTORS ABOVE MEMORY STACKS AND MANUFACTURING METHOD OF THE MEMORY DEVICE

CROSS-REFERENCE TO RELATED APPLICATIONS

This application is based upon and claims the benefit of priority from Japanese Patent Application No. 2019-170794, filed Sep. 19, 2019, the entire contents of which are incorporated herein by reference.

FIELD

Embodiments described herein relate generally to a memory device and a manufacturing method of a memory device.

BACKGROUND

In order to improve the memory density of a memory device, a three-dimensional implementation of an arrangement of memory cells in a memory cell array has been promoted.

BRIEF DESCRIPTION OF THE DRAWINGS

FIG. 1 is a schematic view of a system including a memory device of a first embodiment.

FIG. 2 is an equivalent circuit diagram of a memory cell array of the memory device of the first embodiment.

FIG. 3 is a bird's-eye view illustrating a structure example of the memory device of the first embodiment.

FIG. 9 is a cross-sectional view illustrating a structure example of the memory device of the first embodiment.

FIG. 11, FIG. 12, FIG. 13 and FIG. 14 are views for describing operation examples of the memory device of the first embodiment.

FIG. 15 and FIG. 16 are cross-sectional process views illustrating a fabrication step of a manufacturing method of the memory device of the first embodiment.

FIG. 18 is a cross-sectional process view illustrating a fabrication step of the manufacturing method of the memory device of the first embodiment.

FIG. 20 and FIG. 21 are cross-sectional process views illustrating fabrication steps of the manufacturing method of the memory device of the first embodiment.

FIG. 23 is a cross-sectional process view illustrating a fabrication step of the manufacturing method of the memory device of the first embodiment.

FIG. 25 is a cross-sectional process view illustrating a fabrication step of the manufacturing method of the memory device of the first embodiment.

FIG. 29, FIG. 30, FIG. 31, FIG. 32, FIG. 33 and FIG. 34 are cross-sectional process views illustrating fabrication steps of the manufacturing method of the memory device of the first embodiment.

FIG. 35 is a top view illustrating a fabrication step of the manufacturing method of the memory device of the first embodiment.

FIG. 36 and FIG. 37 are cross-sectional process views illustrating a fabrication step of the manufacturing method of the memory device of the first embodiment.

FIG. 38 is a top view illustrating a fabrication step of the manufacturing method of the memory device of the first embodiment.

FIG. 39 and FIG. 40 are cross-sectional process views illustrating a fabrication step of the manufacturing method of the memory device of the first embodiment.

FIG. 42 and FIG. 43 are cross-sectional process views illustrating a fabrication step of the manufacturing method of the memory device of the first embodiment.

FIG. 45 and FIG. 46 are cross-sectional process views illustrating a fabrication step of the manufacturing method of the memory device of the first embodiment.

FIG. 48 and FIG. 49 are cross-sectional process views illustrating a fabrication step of the manufacturing method of the memory device of the first embodiment.

FIG. 51, FIG. 52 and FIG. 53 are cross-sectional process views illustrating fabrication steps of a manufacturing method of the memory device of the second embodiment.

FIG. 57 and FIG. 58 are cross-sectional process views illustrating a structure example of a memory device of a fourth embodiment.

DETAILED DESCRIPTION

Figure 4:
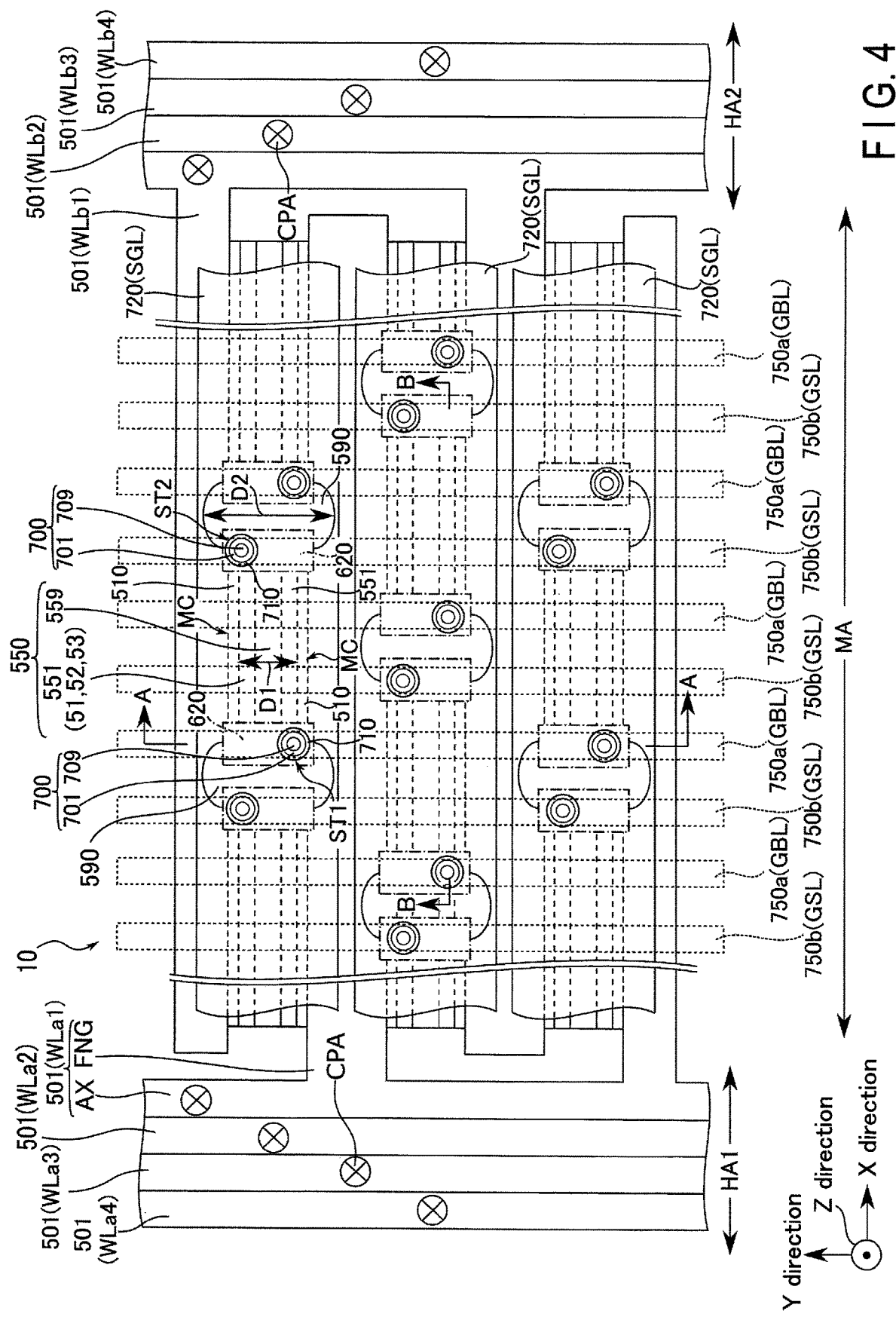
FIG. 4 are a top view illustrating a structure example of the memory device of the first embodiment.

Referring to FIG. 1 to FIG. 58, memory devices of embodiments will be described.

Hereinafter, with reference to the accompanying drawings, the embodiments will be described in detail. In the description below, elements having the same function and structure are denoted by the same reference sign.

In addition, in each embodiment below, when constituent elements (e.g. word lines WL, bit lines BL, various voltages, and signals), which are denoted by reference signs ending with numerals/alphabetical characters for distinction, do not need to be distinguished, expressions (reference signs) without such numerals/alphabetical characters at the ends are used.

In general, according to one embodiment, a memory device includes: a substrate; a first stack provided above the substrate in a first direction perpendicular to a surface of the substrate, the first stack including a first conductive layer, and a second conductive layer provided between the substrate and the first conductive layer; a first semiconductor layer extending in the first direction and neighboring the first stack in a second direction parallel to the surface of the substrate; a first memory layer provided between the first stack and the first semiconductor layer; a first memory cell provided between the first conductive layer and the first semiconductor layer; a second memory cell provided between the second conductive layer and the first semiconductor layer; a first transistor provided above the first semiconductor layer in the first direction, the first transistor including a first terminal connected to one end of the first semiconductor layer in a third direction which is parallel to the surface of the substrate and crosses the second direction, and a second terminal connected to a first interconnect; and a second transistor provided above the first semiconductor layer in the first direction, the second transistor including a third terminal connected to the other end of the first semiconductor layer in the third direction, and a fourth terminal connected to a second interconnect.

(1) First Embodiment

Referring to FIG. 1 to FIG. 49, a memory device of a first embodiment and a manufacturing method thereof will be described.

(a) Configuration Example

Referring to FIG. 1 to FIG. 10, a configuration of the memory device of the present embodiment will be described.

FIG. 1 is a block diagram illustrating a configuration example of the memory device of the present embodiment.

As illustrated in FIG. 1, a memory device 1 of the present embodiment is electrically connected to a controller (hereinafter, also referred to as "memory controller") 9.

The controller 9 orders the memory device 1 to execute data write (write operation), data read (read operation) and data erase (erase operation). When these operations are executed, the controller 9 issues commands CMD corresponding to the operations. The controller 9 sends the issued command CMD and an address (hereinafter, also referred to as "select address") ADD of an operation target to the memory device 1. At the time of the write operation, the controller 9 sends data to be written (hereinafter, also referred to as "write data") DT, together with the command CMD and address ADD, to the memory device 1.

The controller 9 sends a control signal CNT to the memory device 1. The controller 9 receives a control signal CNT from the memory device 1.

The memory device 1 receives the command CMD and address ADD (and data DT) from the controller 9. The memory device 1 executes an operation corresponding to the command CMD on an area corresponding to the address ADD in the memory cell array 10.

For example, the memory device 1 and controller 9 constitute a memory system SYS. The memory system SYS is connected to some other device (not shown) such as a processor, or is provided in some other device. The memory device 1 may be connected to some other device without intervention of the controller 9, or may be provided in some other device without intervention of the controller 9.

Note that the memory device 1 may be provided in the controller 9.

The memory device 1 includes the memory cell array 10, an input/out circuit 11, a row control circuit 12, a column control circuit 13, a sense amplifier circuit 14, a voltage generation circuit 15 and a sequencer 19.

The memory cell array 10 includes a plurality of memory cells MC. A plurality of word lines, a plurality of bit lines and a plurality of source lines are provided in the memory cell array 10. Each memory cell MC is connected to one corresponding word line, one corresponding bit line and one corresponding source line. An example of an internal configuration of the memory cell array 10 will be described later.

The input/output circuit 11 receives the command CMD, address ADD and write data DT from the controller 9. The input/output circuit 11 sends the received command CMD to the sequencer 19. The input/output circuit 11 sends the received address to the row control circuit 12 and column control circuit 13. The input/output circuit 11 sends the received write data to the sense amplifier circuit 14.

The input/output circuit 11 sends data (hereinafter, also referred to as "read data"), which is read from the memory cell array 10 by a read operation, to the controller 9.

The input/output circuit 11 transfers the control signal CNT between the controller 9 and sequencer 19.

Based on a decoded result of the address, the row control circuit 12 controls rows of the memory cell array 10. The row control circuit 12 controls activation/deactivation of the word lines WL, and potentials of the word lines WL. The row control circuit 12 includes a row decoder 121 and a word line driver 122.

Based on a decoded result of the address, the column control circuit 13 controls columns of the memory cell array 10. The column control circuit 13 controls activation/deactivation of the bit lines BL, and activation/deactivation of the source lines SL. The column control circuit 13 controls potentials of the bit lines BL, and potentials of the source lines SL. The column control circuit 13 includes a column decoder 131, a bit line driver 132 and a source line driver 133.

At the time of the read operation, the sense amplifier circuit 14 senses a signal which is output from the memory cell MC, and amplifies the sensed signal. Based on a sensed result, the data in the memory cell MC is determined. For example, at the time of the write operation and at the time of the erase operation, the sense amplifier circuit 14 can supply a predetermined voltage (select voltage or non-select voltage) to each bit line BL and each source line SL.

The voltage generation circuit 15 generates various voltages corresponding to operations to be executed. The voltage generation circuit 15 supplies the generated voltages to the row control circuit 12, column control circuit 13 and sense amplifier circuit 14.

Based on a decoded result of the command CMD, the sequencer 19 controls the circuits 11 to 15 so as to execute the operation corresponding to the command CMD. Based on the control signal CNT, the sequencer 19 controls the timing of the operation of each of the circuits 11 to 15, and the timing of transfer of the signal/data between the memory device 1 and controller 9. For example, the sequencer 19 receives read data from the sense amplifier circuit 14. The sequencer 19 sends write data to the sense amplifier circuit 14. For example, the sequencer 19 includes a register circuit 191 and a command decoder 192.

In the description below, in the memory device 1, the group of the circuits 12 to 19, excluding the memory cell array 10, is referred to as "CMOS circuit (or peripheral circuit)".

For example, the memory device 1 of the present embodiment is a flash memory.

In the flash memory 1 serving as the memory device of the present embodiment, the memory cell array 10 has the following configuration.

<Memory Cell Array>
(Circuit Example)

FIG. 2 is an equivalent circuit diagram illustrating a configuration example of the memory cell array of the flash memory of the present embodiment.

As illustrated in FIG. 2, a plurality of memory cells MC are three-dimensionally arranged in the memory cell array 10.

Each memory cell (hereinafter, also referred to as "memory cell transistor") MC is a field-effect transistor of a stack gate structure, which includes a charge storage layer.

A plurality of word lines WL, a plurality of bit lines BL and a plurality of source lines SL are provided in the memory cell array 10.

The gate of the memory cell MC is connected to a corresponding one of the word lines WL. Memory cells MC, which are arranged in an X direction, are commonly connected to the corresponding word line WL. Memory cells MC, which are arranged in a Z direction, are connected to mutually different word lines.

One terminal (e.g. one of source/drains) of the memory cell MC is connected to a corresponding one of the bit lines BL. The other terminal (e.g. the other of the source/drains) of the memory cell MC is connected to a corresponding one of the source lines SL. One memory cell MC is connected between the bit line BL and source line SL.

Memory cells MC, which are arranged in the Z direction, are commonly connected to the corresponding bit line BL. The memory cells MC, which are arranged in the Z direction, are commonly connected to the corresponding source line SL. Memory cells MC, which are arranged in the X direction and Y direction, are connected to mutually different bit lines BL and mutually different source lines SL.

In the present embodiment, a group of memory cells MC, which are connected to the same bit line BL and the same source line SL, are referred to as "string (or cell string)" NS.

In each string NS, a plurality of memory cells MC are connected in parallel between the bit line BL and source line SL.

For example, the flash memory of the present embodiment is a NOR-type flash memory.

In the NOR-type flash memory 1 of this embodiment, a plurality of select gate transistors (ST1, ST2) are provided in the memory cell array 10.

Each select gate transistor ST1 is connected to a corresponding one of the bit lines BL. Each select gate transistor ST2 is connected to a corresponding one of the source lines SL.

In the present embodiment, a plurality of global bit lines GBL (GBL0, GBL1 . . . , GBLn-1), a plurality of global source lines GSL (GSL0, GSL1 . . . , GSLn-1), and a plurality of select gate lines SGL (SGL0, SGL1, . . . , SGLn-1) are provided in the memory cell array 10.

For example, the column control circuit 13 and sense amplifier circuit 14 control the activation/deactivation of the global bit line GBL, and the potential of the global bit line GBL. The column control circuit 13 and sense amplifier circuit 14 control the activation/deactivation of the global source line GSL, and the potential of the global source line GSL.

For example, the row control circuit 12 controls the activation/deactivation of the select gate line SGL, and the potential of the select gate line SGL.

In each string NS, one terminal of the select gate transistor ST1 is connected to a corresponding one of the bit lines (hereinafter, also referred to as "local bit lines") BL, and the other terminal of the select gate transistor ST1 is connected to a corresponding one of the global bit lines GBL.

In each string NS, one terminal of the select gate transistor ST2 is connected to a corresponding one of the source lines (hereinafter, also referred to as "local source lines") SL, and the other terminal of the select gate transistor ST2 is connected to a corresponding one of the global source lines GSL.

The gates of the select gate transistors ST1, which are arranged in the X direction, and the gates of the select gate transistors ST2, which are arranged in the X direction, are commonly connected to a corresponding one of the select gate lines SGL. Note that a select gate line (drain-side select gate line), which is connected to the gates of the select gate transistors ST1, and a select gate line (source-side select gate line), which is connected to the gates of the select gate transistors ST2, may be mutually independently provided.

Strings NS, which are arranged in the X direction, are connected to a common select gate line SGL. The strings NS arranged in the X direction (the strings NS connected to the same select gate line SGL) are connected to mutually different global bit lines GBL and mutually different global source lines GSL. Strings NS, which are arranged in the Y direction, are connected to a common global bit line GBL and a common global source line GSL. The strings NS arranged in the Y direction are connected to mutually different select gate lines SGL.

The connection between the string NS and global bit line GBL and the connection between the string NS and global source line GSL are controlled by ON/OFF of the select gate transistors ST1 and ST2.

Thereby, in the NOR-type flash memory of the present embodiment, a plurality of string units NS, which share one select gate line SGL, can be selected batchwise in units of the select gate line SGL. The strings NS, which are selected by the activation of the select gate line SGL, are connected to mutually different global bit lines GBL and mutually different global source lines GSL via the select transistors ST1 and ST2 which are in the ON state.

In this manner, in the NOR-type flash memory of the present embodiment, one or more memory cells MC can be accessed in the unit (string NS) corresponding to the select gate line SGL.

In the NOR-type flash memory of the present embodiment, one memory cell MC can store data of one or more bits.

(Structure Example)

Referring to FIG. 3 to FIG. 10, a description is given of a structure example of the memory cell array in the flash memory of the present embodiment.

FIG. 3 is a bird's-eye view schematically illustrating a structure example of the memory cell array with a three-dimensional structure in the flash memory (e.g. NOR-type flash memory) of the present embodiment.

Figure 5:
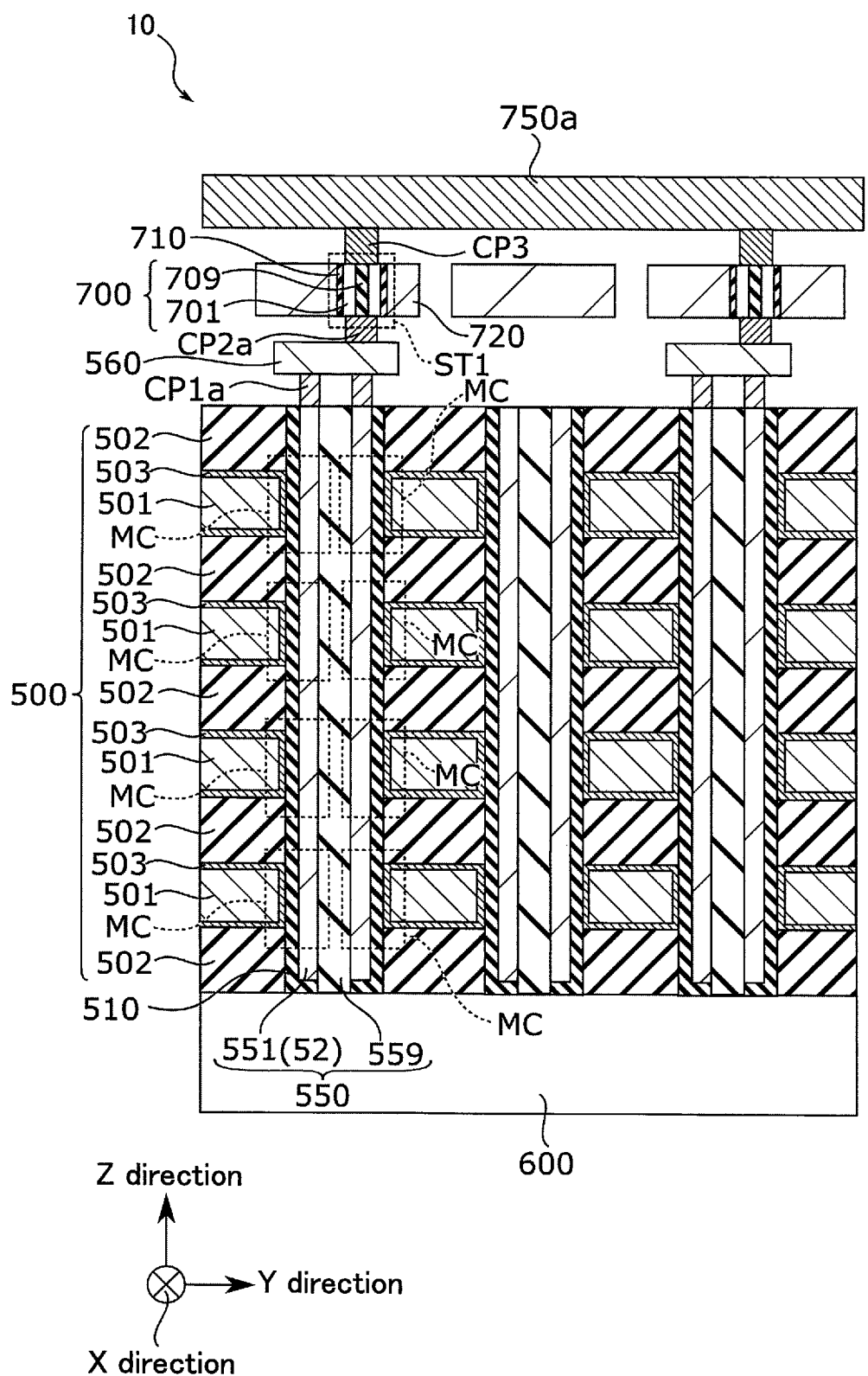
FIG. 5, FIG. 6 and FIG. 7 are cross-sectional views illustrating a structure example of the memory device of the first embodiment.
Figure 6:
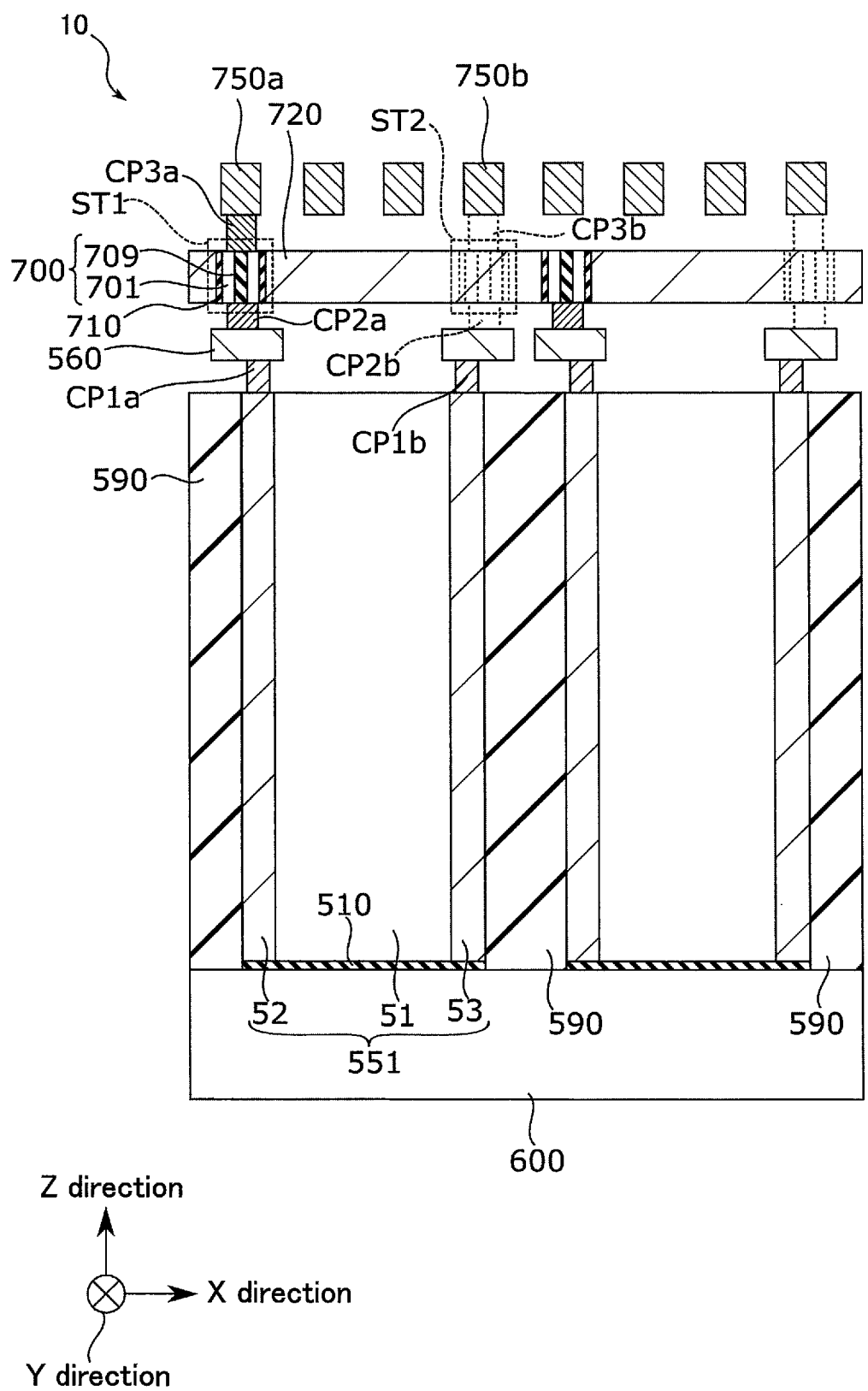

FIG. 4 is a top view illustrating a planar layout of the memory cell array in the flash memory of the present embodiment. FIG. 5 is a schematic cross-sectional view taken along line A-A in FIG. 4. FIG. 6 is a schematic cross-sectional view taken along line B-B in FIG. 4.

In FIG. 3 to FIG. 6, for the purpose of clearer illustrations and descriptions, certain areas and constituent elements in the memory cell area are extracted and illustrated.

As illustrated in FIG. 3 to FIG. 6, a plurality of layer stacks 500 and a plurality of semiconductor pillars 550 are provided on a substrate 600. A memory layer 510 is provided between the semiconductor pillar 550 and layer stack 500.

For example, the layer stack 500 has a comb-like planar shape with respect to the Z direction. In the description below, a portion FNG (to be described later) extending in the X direction of the layer stack 500 (or conductive layer 501) is called "finger portion FNG", and a portion AX extending in the Y direction of the layer stack 500 (or conductive layer 501) is called "axial portion AX". A plurality of finger portions FNG are connected to one axial portion AX. The layer stack 500 includes a plurality of conductive layers 501 and a plurality of insulating layers 502. The conductive layers 501 are arranged in the Z direction. One insulating layer 502 is provided between two conductive layers 501 which mutually neighbor in the Z direction. In the layer stack 500, the insulating layers 502 and conductive layers 501 are alternately provided in the Z direction.

The conductive layer 501 functions as a word line WL, i.e., as a gate electrode of the memory cell MC. The insulating layer 502 electrically isolates the conductive layers 501 which mutually neighbor in the Z direction.

In the present example, although the layer stack 500 is depicted as including four conductive layers 501, the number (the number of stacked layers) of conductive layers 501 in the layer stack 500 may be changed as appropriate, in accordance with the number of stacked layers of word lines WL, and the number of memory cells (the memory capacity of the NOR-type flash memory) formed in the memory cell array 11. Therefore, the number of conductive layers 501 in the layer stack 500 may be five or more, or may be three or less. Hereinafter, for the purpose of simpler and clearer descriptions, the case is described in which the number of stacked conductive layers of the layer stack 500 is four.

<Structure of Word Lines>

The word lines WL are provided in the respective layer levels in the Z direction. In the present embodiment, the layer level means an area located at a certain height in the Z direction with reference to the top surface of the substrate 600.

In the NOR-type flash memory of the present embodiment, the word line WL (conductive layer 501) has a comb-shaped planar structure as viewed in the Z direction.

In the same layer level, two word lines WL are provided. The two word lines WL in the same layer level are mutually independent conductive layers (isolated conductive layers).

The axial portion AX of the word line WL is provided in an area (hereinafter, also referred to as "hookup area") HA at an end portion in the X direction of the memory cell array 10. The axial portion AX of the word line WL extends in the Y direction. In each word line WL, a plurality of finger portions (hereinafter, also referred to as "word line fingers") FNG are connected to one axial portion AX. The axial portion AX is one layer that is continuous with the word line fingers FNG.

For example, the axial portion AX is provided in the hookup area HA (HA1, HA2) of the word line WL. The hookup area HA is an area where contact plugs and lead interconnects are provided in order to connect the word line WL and a circuit (e.g. row control circuit).

For example, two layer stacks 500 are provided in one area (e.g. block BLK) in the memory cell array. In this case, in the memory cell array 10, the hookup areas HA1 and HA2 are provided at one end side and at the other end side in the X direction of the block BLK, respectively. Memory cells MC are provided in an area (hereinafter referred to as "array area") MA between the two hookup areas HA1 and HA2.

The hookup area HA1 is provided for one of the two layer stacks 500, and the hookup area HA2 is provided for the other of the two layer stacks 500.

For example, finger portions FNG which mutually neighbor in the Y direction are mutually different word lines (conductive layers). Here, it is assumed that conductive layers, which are remotest from the top surface of the substrate 600, or in other words, uppermost conductive layers 501, are "WLa1" and "WLb1". "WLa1" is a conductive layer 501 of the layer stack 500 located on the hookup area HA1 side, and "WLb1" is a conductive layer 501 of the layer stack 500 located on the hookup area HA2 side. Hereinafter, similarly, the conductive layers 501 of the other three layers are referred to as "WLa2" and "WLb2", "WLa3" and "WLb3", and "WLa4" and "WLb4" in an order toward the substrate 600 side.

Figure 7:
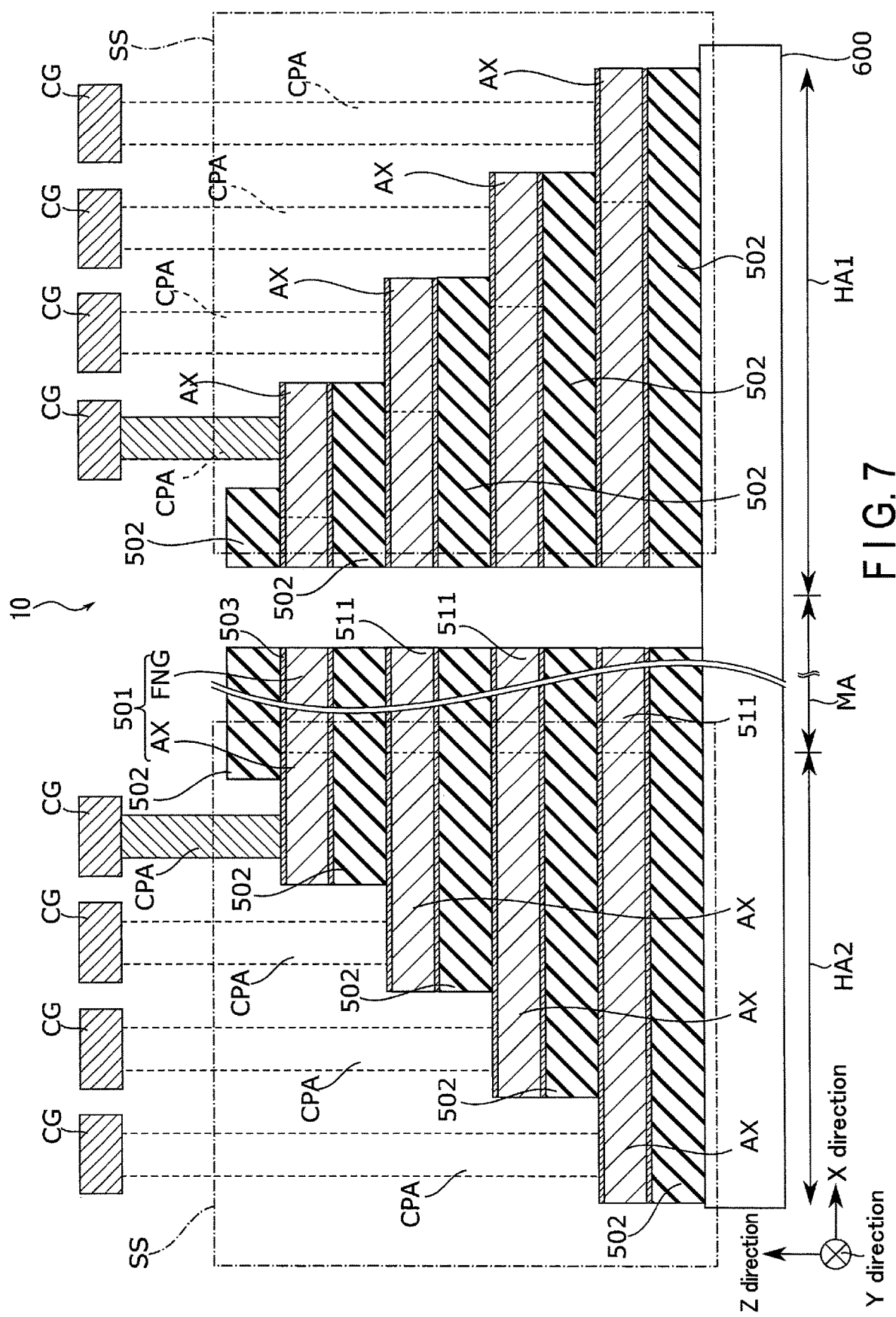

FIG. 7 is a schematic cross-sectional view for describing an example of the configuration in the hookup areas of the memory cell array.

As illustrated in FIG. 7, an end portion of the layer stack 500 in the hookup area HA (HA, HA2) has a staircase-like structure (hereinafter referred to as "staircase structure") SS.

Thereby, in the hookup area HA, the axial portion AX of a lower-layer conductive layer 501 includes an area which is not covered by an upper-layer conductive layer 501.

For example, the area (an extent in X-Y plane) of the axial portion AX of a lower-layer word line WL is greater than the area of the axial portion AX of an upper-layer word line WL.

A contact plug CPA is provided on the axial portion AX of the conductive layer 501. The contact plug CPA is put in direct contact with the axial portion AX. For example, in each staircase structure SS, a plurality of contact plugs CPA are arranged in an oblique direction in the X-Y plane.

Each of the conductive layers 501 is electrically connected to a corresponding interconnect (metal layer) CG via the contact plug CPA. The interconnect CG is provided above the layer stack 500. For example, the interconnect CG extends in the Y direction.

Referring back to FIG. 3 to FIG. 6, semiconductor pillars 550 are arranged in a matrix in a plane (X-Y plane) which is perpendicular to the Z direction of the substrate 600. The semiconductor pillars 550 extend in the Z direction. For example, the semiconductor pillar 550 has a rectangular prismatic structure. The planar shape of the semiconductor pillar 550 is rectangular.

The semiconductor pillar 550 is provided between two finger portions FNG.

One insulating layer 590 is provided between two semiconductor pillars 550 which mutually neighbor in the X direction. The two semiconductor pillars 550 which mutually neighbor in the X direction are electrically isolated by the insulating layer 590. For example, a dimension D2 in the Y direction of the insulating layer 590 is greater than a dimension D1 in the Y direction of the semiconductor pillar 550.

Each semiconductor pillar 550 includes a semiconductor layer 551, and an insulating layer (hereinafter, also referred to as "core layer") 559. The semiconductor layer 551 is provided between the core layer 559 and the layer stack 500. Semiconductor layers 551, which mutually neighbor in the X direction, are electrically isolated by the insulating layer 590. Semiconductor layers 551, which mutually neighbor in the Y direction between two finger portions FNG, are electrically isolated by the core layer 559. In a bottom portion of the semiconductor pillar 550, the core layer 559 is provided between the semiconductor layers 551 which mutually neighbor in the Y direction, with the core layer 559 being interposed.

The memory cell MC is provided between the conductive layer 501, which is the word line, and the semiconductor pillar 550. The memory cell MC may be configured to include the conductive layer 501, semiconductor pillar 550 and memory layer 510.

The memory layer 510 is provided on a surface (hereinafter, also referred to as "side surface") which crosses the Y direction of the layer stack 500 in a parallel direction to the surface (X-Y plane) of the substrate 600. The memory layer 510 is continuous on the side surface of the layer stack 500. The memory layer 510 is provided between the conductive layer 501 and semiconductor layer 551 and between the insulating layer 502 and semiconductor layer 551.

For example, as illustrated in FIG. 5, in the layer stack 500, a barrier layer 503 is provided between the conductive layer 501 and memory layer 510 and between the conductive layer 501 and the insulating layer 502. An insulating layer (e.g. aluminum oxide layer) may be provided between the barrier layer 503 and memory layer 510 and between the barrier layer 503 and insulating layer 502. Note that the barrier layer 503 may not be provided in the layer stack 500.

<Memory Cell>

As illustrated in FIG. 6, the semiconductor layer 551 extends in the Z direction. The semiconductor layer 551 includes three portions 51, 52 and 53. The three portions 51, 52 and 53 are arranged in the X direction. The portion 52 is provided at one end portion in the X direction of the portion 51, and the portion 53 is provided at the other end portion in the X direction of the portion 51.

The portion 51 functions as a channel region of the memory cell MC. The two portions 52 and 53 function as two source/drain regions of the memory cell MC. The channel region (channel portion) 51 is provided between the two source/drain regions (source/drain portions) 52 and 53.

The channel region 51 is, for example, a silicon layer (e.g. polysilicon layer). The source/drain region 52, 53 is a silicon layer (e.g. n-type polysilicon layer) including an n-type dopant (impurities). An n-type dopant concentration of the source/drain region 52, 53 is higher than an n-type dopant concentration of the channel region 51.

The portion 52 of the semiconductor layer 551 is one of the source/drain regions of the memory cell MC, and functions as a local bit line BL of the string NS.

The portion 53 of the semiconductor layer 551 is the other of the source/drain regions of the memory cell MC, and functions as a local source line SL of the string NS.

When a voltage, which is equal to or higher than a threshold voltage of the memory cell MC, is applied to the gate electrode (word line WL) of the memory cell MC, a channel is formed in the channel region 51. Thereby, in the memory cell MC that is in the ON state, an electric current flows between the two source/drain regions 52 and 53 (between the bit line BL and source line SL) via the formed channel.

Figure 8:
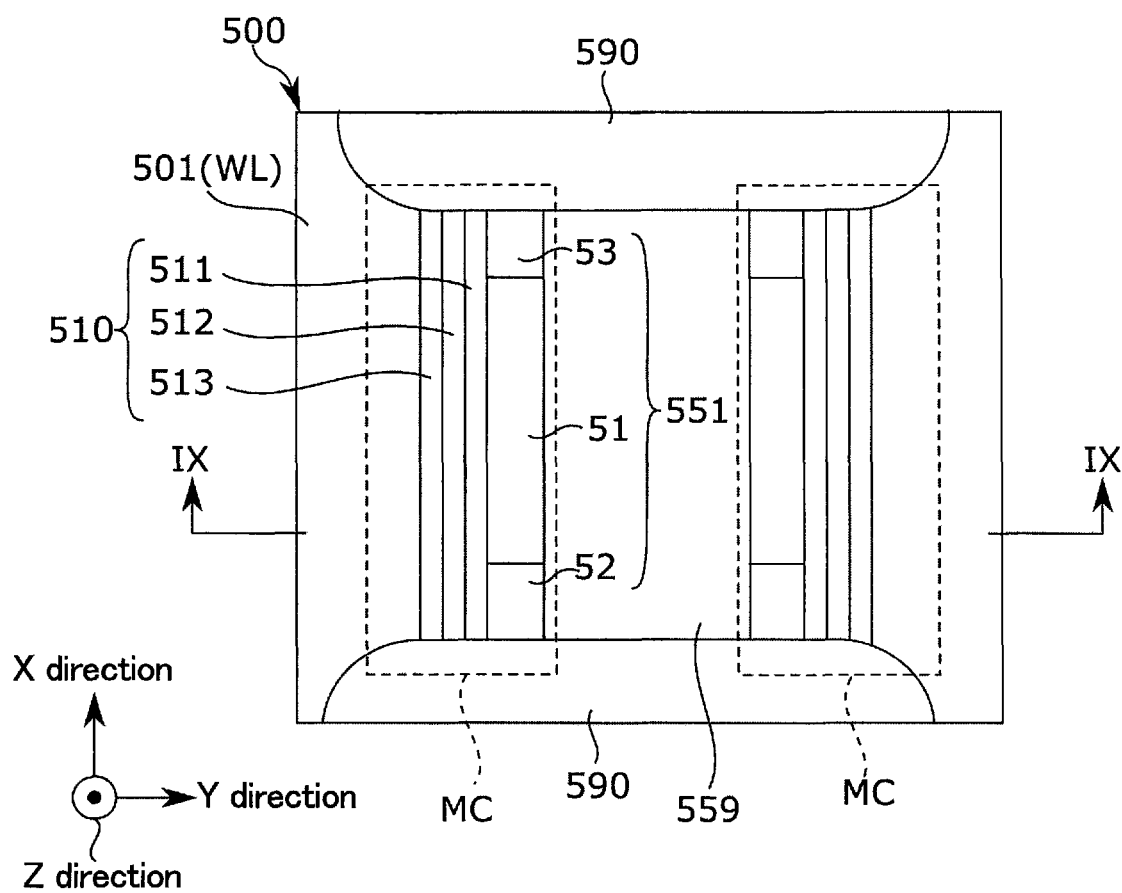
FIG. 8 is a top view illustrating a structure example of the memory device of the first embodiment.

FIG. 8 and FIG. 9 are views schematically illustrating one of concrete examples of the structure of the memory cell in the NOR-type flash memory of the present embodiment.

FIG. 8 is a top view illustrating a planar structure of the memory cell. FIG. 9 is a schematic cross-sectional view illustrating a cross-sectional structure of the memory cell, FIG. 9 being taken along line. IX-IX in FIG. 8.

As illustrated in FIG. 7 to FIG. 9, in the memory cell MC, the memory layer 510 is a stacked film including a plurality of layers 511, 512 and 513. The memory layer 510 includes an insulating layer 511, a charge storage layer 512 and an insulating layer 513. The charge storage layer 512 is provided between the two insulating layers 511 and 513. The insulating layer (hereinafter, also referred to as "gate insulting film" or "tunnel insulating film") 511 is provided between the semiconductor layer 551 and charge storage layer 512. The insulating layer (hereinafter, also referred to as "block insulating film") 513 is provided between the charge storage layer 512 and the layer stack 500. Each of the layers 511, 512 and 513 is continuous between a top portion and a bottom portion of the layer stack 500 in the Z direction.

A charge of a quantity corresponding to data to be stored is stored in the charge storage layer 512. For example, as the charge storage layer 512, a charge trap layer (e.g. silicon nitride film) including a trap level is used. The charge is trapped in the trap level in the charge storage layer 512. In accordance with the quantity of charge in the charge storage layer 512, the magnitude of the threshold voltage of the memory cell MC varies.

The gate insulating film 511 functions as a gate insulating film of the memory cell transistor MC. The gate insulating film 511 functions as a tunnel barrier between the charge storage layer 512 and semiconductor layer 551. For example, as the gate insulating film 511, an insulative oxide film (e.g. silicon oxide film) is used.

The block insulating film 513 suppresses, as a potential barrier, the movement of electrons between the charge storage layer 512 and conductive layer 501. For example, as the block insulating film 513, an insulative oxide film (e.g. aluminum oxide film) is used.

The memory cells MC, which are provided on a common semiconductor pillar 550 in the same layer level, neighbor each other in the Y direction, with the semiconductor pillar 550 being interposed. In the present embodiment, the memory cells MC, which neighbor each other in the Y direction, with the semiconductor pillar 550 being interposed, include, as gate electrodes, the word line WLa and word line WLb which are mutually different conductive layers 501. Thereby, the memory cells MC, which mutually neighbor in the Y direction via the core layer 559 with the semiconductor pillar 550 being interposed, can be mutually independently controlled.

Referring back to FIG. 4, FIG. 5 and FIG. 6, contact plugs CP1a are provided on the source/drain regions 52. A conductive layer (e.g. metal layer) 560 is provided on the contact plugs CP1a. The conductive layer 560 extends over the two portions 52 between which the core layer 559 is interposed. The conductive layer 560 and contact plugs CP1a electrically connect the two source/drain regions 52.

Contact plugs CP1b are provided on the source/drain regions 53. A conductive layer (e.g. metal layer) 560 is provided on the contact plugs CP1b. The conductive layer 560 extends over the portions 53 of the two semiconductor layers 551 between which the core layer 559 is interposed. The conductive layer 560 and contact plugs CP1b electrically connect the two source/drain regions 53.

In the NOR-type flash memory of the present embodiment, the select gate transistors ST and select gate lines SGL are provided in the memory cell array 10. The select gate transistors ST (ST1, ST2) are disposed above the layer stacks 500 in the Z direction. The select gate transistor ST is provided in a layer level between the semiconductor pillar 550 and a conductive layer 750 in the Z direction. The select gate transistor ST is connected to the memory cells MC in the cell string NS via the conductive layer 560.

<Select Gate Transistor>

Two select gate transistors ST1 and ST2 are provided for one semiconductor pillar 550.

A drain-side select gate transistor ST1 is provided above one end in the X direction of the semiconductor pillar 550. One drain-side select gate transistor ST1 is commonly connected, via the conductive layer 560 and contact plugs CP1a, to the two semiconductor layers 551 which are mutually independent and are arranged in the Y direction via the core layer 559. One drain-side select gate transistor ST1 is shared by two strings NS.

A source-side select gate transistor ST2 is provided above the other end in the X direction of the semiconductor pillar 550. One source-side select gate transistor ST2 is commonly connected, via the conductive layer 560 and contact plugs CP1b, to the two semiconductor layers 551 which are mutually independent and are arranged in the Y direction via the core layer 559. One source-side select gate transistor ST2 is shared by two strings NS.

The select gate transistor ST is a vertical-type transistor. The select gate transistor ST that is the vertical-type transistor includes a body portion (semiconductor pillar) 700 including a channel region.

The body portion 700 has a columnar structure extending in the Z direction.

The body portion 700 includes, for example, a semiconductor layer 701 and an insulating layer (core layer) 709. The semiconductor layer 701 is provided on a side surface (a surface parallel to the Z direction) of the core layer 709.

For example, the body portion 700 has a columnar structure. A planar shape of the body portion 700, as viewed from the Z direction, is circular (or elliptic). In this case, the semiconductor layer 701 has a cylindrical structure, and the core layer 709 has a columnar structure. Note that the body portion 700 may have a rectangular prismatic shape.

In the select gate transistor ST that is the vertical-type transistor, two terminals each functioning as a source/drain are arranged in the Z direction. In the select gate transistor ST, a current is passed in the Z direction.

An insulating layer 710 is provided on a side surface (a surface parallel to the Z direction of the semiconductor pillar 700) of the body portion 700. The insulating layer 710 functions as a gate insulating film of the select gate transistor ST.

A conductive layer 720 is opposed to a side surface of the body portion 700 via the insulating layer 710. The conductive layer 720 functions as a gate electrode of the select gate transistor ST.

A contact plug CP3 (CP3a, CP3b) is provided on a top surface of the semiconductor pillar 700 in the Z direction.

Conductive layers 750 are provided above the contact plugs CP3 in the Z direction. The conductive layers 750 extend in the Y direction. The conductive layers 750 function as global bit lines GBL and global source lines GSL. The global bit lines GBL and global source lines GSL are alternately arranged in the X direction.

Two conductive layers 750 are disposed between a global bit line GBL and a global source line GSL, which are connected to a certain memory cell MC. The two conductive layers 750 are not connected to the certain memory cell MC, and pass over the semiconductor layer 551 of the certain memory cell MC. One of the two conductive layers 750 is used as a global bit line GBL (or global source line GSL) of another memory cell, and the other of the two conductive layers 750 is used as a global source line GSL (or global bit line GBL) of still another memory cell.

A drain-side select gate transistor ST1 is provided in a portion (region) including the body portion 700, gate insulating film 710 and conductive layer 720. The select gate transistor ST1 is provided above the source/drain region 52 (bit line BL) via the conductive layer 560 and contact plugs CP1a and CP2a.

In the select gate transistor ST1, one end portion in the Z direction of the body portion 700 is connected to the source/drain region 52 (local bit line BL) of the semiconductor layer 551 via the conductive layer 560 and contact plugs CP1a and CP2a. The other end portion in the Z direction of the body portion 700 is connected to the conductive layer 750a, which functions as the global bit line GBL, via the contact plug CP3a.

The local bit line BL is connected to one terminal of the select gate transistor ST1. The global bit line GBL is connected to the other terminal of the select gate transistor ST1.

A source-side select gate transistor ST2 is provided in a portion (region) including the body portion 700, gate insulating film 710 and conductive layer 720. The select gate transistor ST2 is provided above the source/drain region 53 (source line SL) via the conductive layer 560 and contact plugs CP1b and CP2b.

The body portion 700 is provided above the conductive layer 560 via the contact plug CP2 (CP2a, CP2b).

In the select gate transistor ST2, one end portion in the Z direction of the body portion 700 is connected to the source/drain region 53 (local source line SL) of the semiconductor layer 551 via the conductive layer 560 and contact plugs CP1b and CP2b. The other end portion in the Z direction of the semiconductor pillar 700 is connected to the conductive layer 750b, which functions as the global source line GSL, via the contact plug CP3b.

The local source line SL is connected to one terminal of the select gate transistor ST2. The global source line GSL is connected to the other terminal of the select gate transistor ST2.

The global bit lines GBL and global source lines GSL are alternately arranged in the X direction. One global bit line GBL is disposed between two global source lines GSL arranged in the X direction. One global source line GSL is disposed between two global bit lines GBL arranged in the X direction.

The conductive layer 720 functioning as the select gate line (gate electrode) SGL extends in the X direction. The conductive layer 720 is opposed to a side surface of the semiconductor pillar 700 via the insulating layer 710. One conductive layer 720 crosses a plurality of semiconductor pillars 700 arranged in the X direction.

<Configuration Example of Select Gate Lines>

Figure 10:
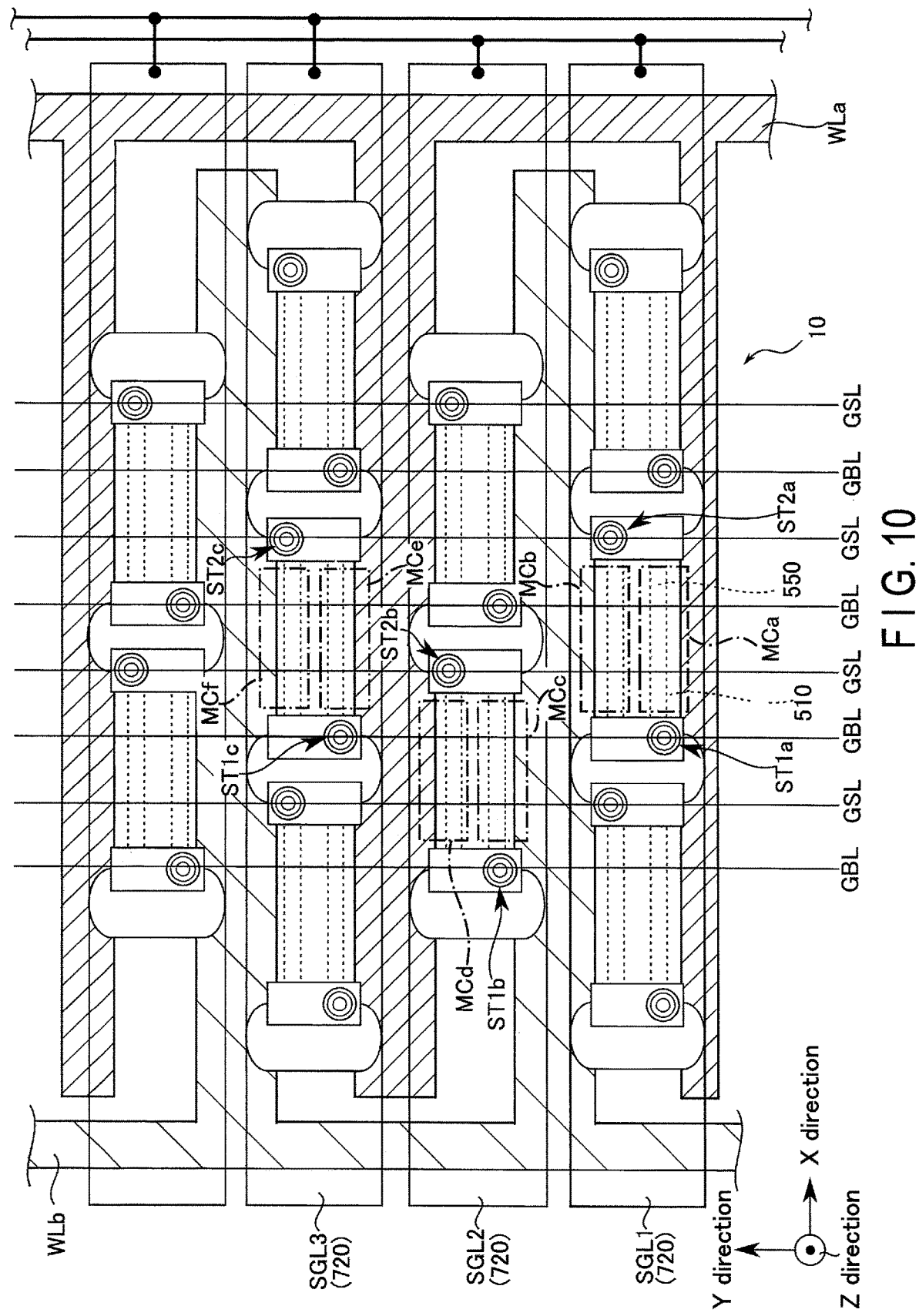
FIG. 10 is a top view illustrating a structure example of the memory device of the first embodiment.

FIG. 10 is a top view illustrating an example of the layout of select gate lines in the NOR-type flash memory of the present embodiment. In FIG. 10, a main part for describing the layout of select gate lines is extracted and illustrated. In FIG. 10, for the purpose of clarification, different hatchings are added to two word lines WLa and WLb.

As illustrated in FIG. 10, in strings NS arranged in the X direction, the drain-side select gate transistors ST1 are arranged in the X direction, and the source-side select gate transistors ST2 are arranged in the X direction. In strings NS arranged in the Y direction, the drain-side select gate transistors ST1 are arranged in the Y direction, and the source-side select gate transistors ST2 are arranged in the Y direction.

The drain-side select gate transistor ST1 neighbors the source-side select gate transistor ST2 in an oblique direction to the X direction and Y direction in the X-Y plane.

The conductive layer 720 is a portion of the select gate line SGL. For example, each select gate line SGL has a comb-like planar shape. Each select gate line SGL includes a portion (finger portion) extending in the X direction in the array area MA.

Select gate lines SGL may be connected to each other, for example, via a portion provided in the hookup area HA. Thereby, a plurality of select gate lines SGL are bundled.

For example, in the example of FIG. 10, consideration is now given to the case in which, among memory cells MCa, MCb, MCc, MCd, MCe and MCf, the memory cell MCa is selected as an operation target.

In this case, a select gate line SGL1 is set in a selected state, and a word line WLa is set in a selected state.

When the select gate line SGL1 is set in the selected state, a select gate line SGL2 and a select gate line SGL3 are set in a non-selected state. Select gate transistors ST1$b$, ST2$b$, ST1$c$ and ST2$c$ connected to the select gate line SGL2 and select gate line SGL3 that are set in the non-selected state are set in the OFF state.

Therefore, even if there exist memory cells MCd and MCe which are connected to the selected word line WLa, the memory cells MC in the strings NS, which are connected to the select gate lines SGL2 and SGL3 that are in the non-selected state, are electrically isolated from the global bit lines GBL and global source lines GSL by the select gate transistors ST that are in the OFF state.

Select gate transistors ST1$a$ and ST2$a$ are connected to the select gate line SGL1. The memory cells MCa and MCb are connected to the select gate transistors ST1$a$ and ST2$a$. The memory cell MCa is connected to the word line WLa, and the memory cell MCb is connected to the word line WLb.

When the select gate line SGL1 is set in the selected state, the select gate transistors ST1$a$ and ST2$a$ are set in the ON state.

When the word line WLa is set in the selected state and the word line WLb is set in the non-selected state, the memory cell MCa is set in the selected state and the memory cell MCb is set in the non-selected state. Therefore, even when the memory cell MCb is connected to the select gate transistors ST1$a$ and ST2$a$ that are in the ON state, the memory cell MCb does not become an operation target.

For example, when the select gate line SGL1 is connected to the select gate line SGL2 by the bundling of select gate lines (finger portions), the select gate transistors ST1$b$ and ST2$b$ connected to the select gate line SGL2 are set in the ON state. Therefore, the memory cells MCc and MCd are connected to the global bit line GBL and global source line GSL.

The memory cells MCc connected to the non-selected word line WLb does not become an operation target.

The memory cell MCd is connected to the selected word line WLa.

However, the global bit line GBL and global source line GSL, to which the memory cell MCd is connected, are different from the global bit line GBL and global source line GSL, to which the memory cell MCa is connected.

Therefore, by controlling the potentials of the global bit line GBL and global source line GSL, the memory cell MCa can be selected as an operation target, and the memory cell MCd can be excluded from operation targets.

As described above, in the present embodiment, even if a plurality of memory cells (cell strings) share the select gate transistor ST and select gate line SGL, the memory cell, which belongs to the string NS connected to the selected select gate line SGL and is connected to the selected word line, can be activated as an operation target.

In the above-described manner, in the NOR-type flash memory of the present embodiment, a memory cell array of a three-dimensional structure, which includes a plurality of memory cells and a plurality of select gate transistors, is constructed.

In the present embodiment, the structure of the select gate transistor and the structure of the select gate line are not limited to the above examples.

In this embodiment, for example, the circuits of the NOR-type flash memory 1, excluding the memory cell array 10, are provided on the semiconductor substrate which is located under the memory cell array 10 in the Z direction. For example, the row control circuit may be provided in such a position as to vertically overlap the memory cell array 10 in the Z direction.

However, the memory cell array 10 may be provided on the substrate 600, and the CMOS circuit may be laid out on a semiconductor substrate under the substrate 600, such that the memory cell array 10 and CMOS circuit do not vertically overlap in the Z direction. The CMOS circuit and memory cell array 10 may be provided on the same substrate.

(b) Operation

Referring to FIG. 11 to FIG. 14, an operation (control method) of the flash memory of the present embodiment will be described.

In FIG. 12 to FIG. 14, 27 memory cells arranged in a configuration of 3×3×3 are extracted and illustrated.

<Relationship Between Threshold Voltages of Memory Cells and Data>

Figure 11:
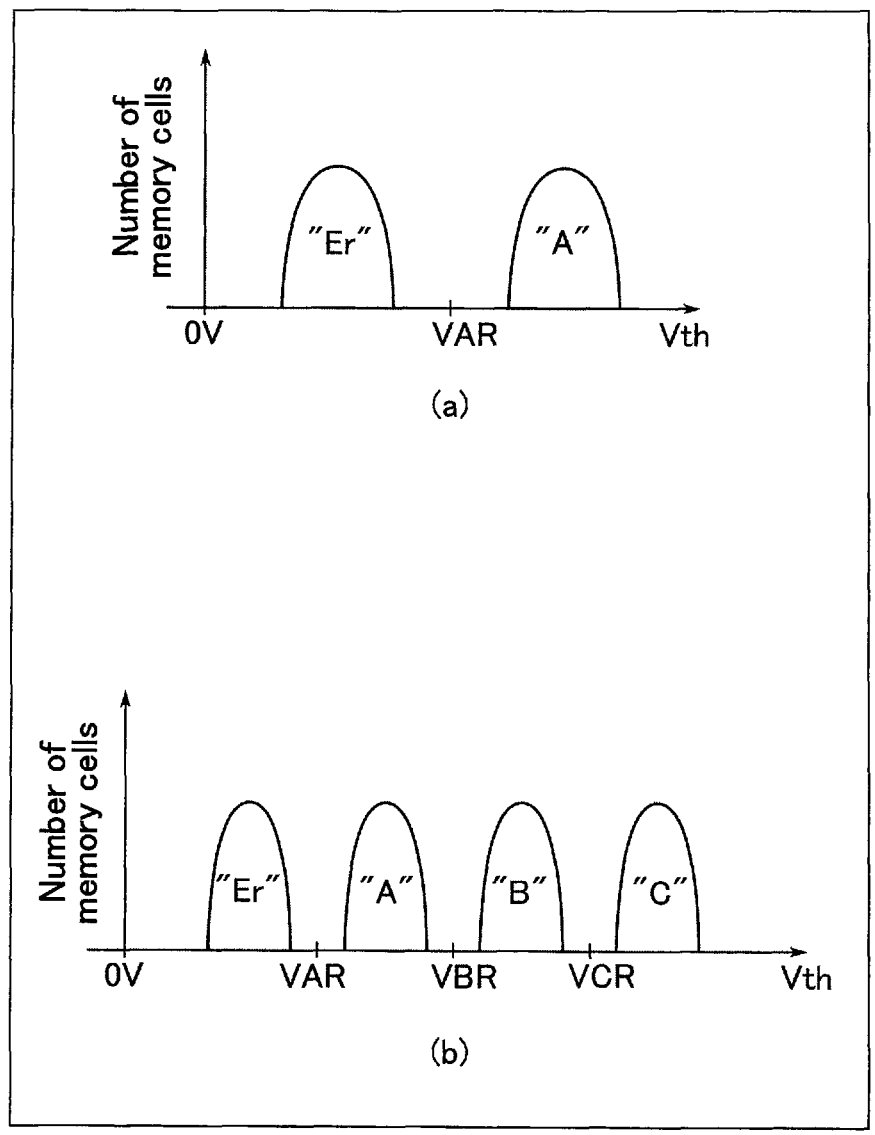

Referring to FIG. 11, a description is given of a relationship between threshold voltages of memory cells and data stored in the memory cells, in the NOR-type flash memory of the present embodiment.

FIG. 11 is a view for describing the relationship between the distribution of threshold voltages of memory cells and data of the memory cells in the NOR-type flash memory.

Part (a) of FIG. 11 is a view for describing the relationship between the distribution of threshold voltages of memory cells and data of the memory cells in a case where the memory cell stores data of one bit.

As illustrated in part (a) of FIG. 11, in the NOR-type flash memory, a threshold voltage of a memory cell which stores data of one bit ("0" or "1" data) is set at an "Er" level or an "A" level.

The threshold voltage of the memory cell of the "A" level is higher than the threshold voltage of the memory cell of the "Er" level.

The memory cell of the "Er" level is a memory cell that is in an erase state.

In the NOR-type flash memory, the threshold voltage of the memory cell that is in the erase state is a positive voltage. In the NOR-type flash memory, the threshold voltage of the memory cell that is in the erase state is higher than 0 V.

A read level (determination level) VAR of a certain voltage value is set between an upper limit value of an ideal distribution of the threshold voltage of the "Er" level and a lower limit level of an ideal distribution of the threshold voltage of the "A" level. The threshold voltage of the memory cell of the "Er" level is lower than the read level VAR. The threshold voltage of the memory cell of the "A" level is higher than the read level VAR.

When a voltage having the read level VAR is applied to the word line WL (the gate of the memory cell), the memory cell of the "Er" level is set in the ON state. In the memory cell in the ON state, current flows between the two source/drain regions (between the bit line BL and source line SL) via the formed channel.

When a voltage having the read level VAR is applied to the word line WL, the memory cell of the "A" level is set in the OFF state. In the memory cell in the OFF state, a channel is not formed, and no current flows between the source/drain regions.

The sense amplifier circuit 14 senses the presence/absence of occurrence of current (or a variation of potential) between the bit line BL and source line SL, and amplifies a signal corresponding to the sensed result.

In this manner, the data in the memory cell MC is determined based on a result as to whether the memory cell is turned on or off when the read level VAR is applied to the memory cell MC.

Thereby, data ("1" data or "0" data) allocated to the "Er" level or "A" level is read.

Part (b) of FIG. 11 is a view for describing the relationship between the distribution of threshold voltages of memory cells and data of the memory cells in a case where the memory cell stores data of two bits.

As illustrated in part (b) of FIG. 11, in the NOR-type flash memory, a threshold voltage of a memory cell can be set at a value corresponding to any one of an "Er" level, "A" level, "B" level and "C" level, in accordance with data of two bits ("00", "01", "10" or "11" data) which is stored.

A read level VAR of a certain voltage value is set between an upper limit value in an ideal distribution of the threshold voltage of the "Er" level and a lower limit level of an ideal distribution of the threshold voltage of the "A" level. A read level VBR of a certain voltage value is set between an upper limit value in the ideal distribution of the threshold voltage of the "A" level and a lower limit level of an ideal distribution of the threshold voltage of the "B" level. A read level VCR of a certain voltage value is set between an upper limit value in the ideal distribution of the threshold voltage of the "B" level and a lower limit level of an ideal distribution of the threshold voltage of the "C" level. The read level VBR is higher than the read level VAR and is lower than the read level VCR. The read level VCR is higher than the read levels VAR and VBR.

The threshold voltage of the memory cell of the "Er" level is lower than the read level VAR. The threshold voltage of the memory cell of the "A" level is higher than the read level VAR and lower than the read level VBR. The threshold voltage of the memory cell of the "B" level is higher than the read level VBR and lower than the read level VCR. The threshold voltage of the memory cell of the "C" level is higher than the read level VCR.

When a voltage having the read level VAR is applied to the word line, the memory cell of the "Er" level is set in the ON state, and the memory cells of the "A" level, "B" level and "C" level are set in the OFF state.

When a voltage having the read level VBR is applied to the word line, the memory cells of the "Er" level and "A" level are set in the ON state, and the memory cells of the "B" level and "C" level are set in the OFF state.

When a voltage having the read level VCR is applied to the word line, the memory cells of the "Er" level, "A" level and "B level are set in the ON state, and the memory cell of the "C" level is set in the OFF state.

The data in the memory cell MC is determined, based on a result as to whether the memory cell is turned on or off when at least one read level is applied to the memory cell MC, and based on a calculation process on this result.

Thereby, the data of memory cells, which store data of two bits allocated to the "Er" level, "A" level, "B" level and "C" level, is read in the lower bit unit or the higher bit unit in the data of two bits.

Here, the example in which one memory cell stores data of "1" bit or "2" bits is illustrated. However, in the NOR-type flash memory, one memory cell can also store data of 3 or more bits.

<Write Operation>

Figure 12:
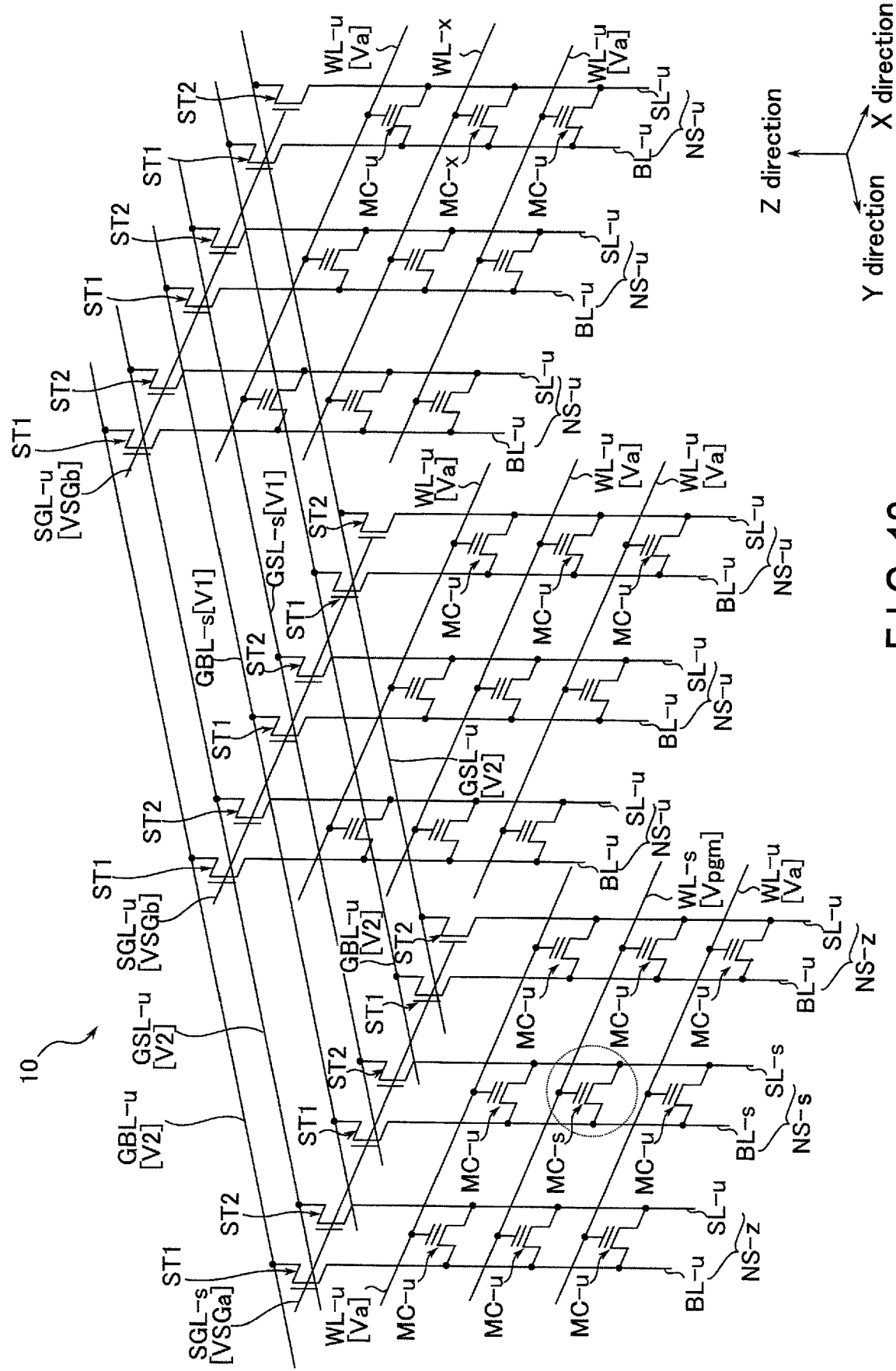

Referring to FIG. 12, a description is given of a write operation of the NOR-type flash memory of the present embodiment. Here, an example in which data of one bit is written to the memory cell is illustrated.

At a time of the write operation, the NOR-type flash memory of the present embodiment receives the command CMD, select address ADD and write data DT from the controller 9.

The sequencer 19 decodes the command CMD and address ADD. When the command CMD is a write command, the flash memory of the present embodiment executes a write operation on one or more memory cells MC designated by the select address ADD. For example, at the time of data write, the initial state of the threshold voltage of the memory cell is set to an erase state.

The sequencer 19 causes the column control circuit 13 and sense amplifier circuit 14 to control the potentials of the global bit line GBL and global source line GSL.

Based on the decoded result of the address ADD and the write data DT, the column control circuit 13 and sense amplifier circuit 14 control a potential V1 of a global bit line (hereinafter referred to as "selected global bit line") GBL-s and a global source line (hereinafter referred to as "selected global source line") GSL-s, to which a selected cell MC-s is connected.

When the threshold voltage of the selected cell MC-s is increased in accordance with the write data, the column control circuit 13 and sense amplifier circuit 14 set the potential V1 to a predetermined voltage (e.g. 0 V).

When the threshold voltage of the selected cell MC-s is not increased in accordance with the write data (e.g. when the threshold voltage of the selected cell MC-s is kept at a value corresponding to the erase state), the column control circuit 13 and sense amplifier circuit 14 apply a write prohibit voltage (>0 V) to the selected global bit line GBL-s and selected global source line GSL-s.

The column control circuit 13 and sense amplifier circuit 14 set the potential of a global bit line other than the selected global bit line GBL-s (hereinafter referred to as "non-selected global bit line") GBL-u and the potential of a global source line other than the selected global source line GSL-s (hereinafter referred to as "non-selected global source line") GSL-u to a predetermined voltage (hereinafter referred to as "non-select voltage") V2. The non-select voltage V2 is, for example, 7 V.

The sequencer 19 causes the row control circuit 12 to control the potential of the select gate line SGL and the potential of the word line WL.

Based on the decoded result of the address ADD, the row control circuit 12 sets the potential of a select gate line SGL-s (hereinafter referred to as "selected select gate line SGL-s") corresponding to the selected cell MC-s to a predetermined voltage (hereinafter referred to as "selected select gate line voltage") VSGa. The voltage value of the selected select gate line voltage VSGa is equal to or higher than a threshold voltage Vthsg of the select gate transistor ST1, ST2.

Based on the decoded result of the address ADD, the row control circuit 12 sets the potential of a select gate line SGL-u (hereinafter referred to as "non-selected select gate line SGL-u") other than the selected select gate line SGL-s to a predetermined voltage (non-selected select gate line voltage) VSGb. The voltage value of the non-select voltage VSGb is less than the threshold voltage Vthsg of the select gate transistor ST1, ST2. The voltage value of the non-selected select gate line voltage VSGb is, for example, 0 V.

Based on the decoded result of the address ADD, the row control circuit 12 sets the potential of a word line WL-s (hereinafter referred to as "selected word line WL-s"), to which the selected cell MC-s is connected, to a write voltage VPGM having a predetermined voltage value. The voltage value of the write voltage VPGM is, for example, about 20 V.

Based on the decoded result of the address ADD, the row control circuit 12 sets the potential of a word line WL-u (hereinafter referred to as "non-selected word line WL-u") other than the selected word line WL-s to a non-select voltage (hereinafter referred to as "write pass voltage" or "non-program voltage") Va. The voltage value of the write pass voltage Va is, for example, about 0 V.

The select gate transistor ST1, ST2, to which the selected select gate line voltage VSGa (>Vthsg) is applied, is set in the ON state.

The global bit line GBL and global source line GSL are electrically connected to the corresponding local bit line BL and local source line SL, respectively, via the select gate transistors ST1 and ST2 which are in the ON state.

Thereby, the potential of the local bit line BL and the potential of the local source line SL are set to values corresponding to the potential of the global bit line GBL and the potential of the global source line GSL.

When the select voltage V1 is applied to the global bit line GBL-s and global source line SGL-s, the voltage V1 of about 0 V is applied to the local bit line BL-s and local source line SL-s via the select gate transistors ST1 and ST2 which are in the ON state.

When the non-select voltage (write prohibition voltage) V2 is applied to the global bit line GBL-u and global source line GSL-u, the voltage V2 of about 7 V is applied to the local bit line BL-u and local source line SL-u via the select gate transistors ST1 and ST2 which are in the ON state.

In a string (hereinafter referred to as "selected string") NS-s connected to the selected global source line and selected global bit line via the select transistors ST1 and ST2 which are in the ON state, the program voltage VPGM is applied to the gate of the selected cell MC-s, and the write pass voltage (non-program voltage) Va is applied to the gate of a non-selected cell MC-u.

In the selected string NS-s, the potential difference between the gate and channel of the selected cell MC-s corresponds approximately to a voltage value of the program voltage VPGM. By a tunnel effect due to the potential difference, electric charge is injected in the charge storage layer 512 of the selected cell MC-s. As a result, the threshold voltage of the selected cell MC-s rises.

In the selected string NS-s, the potential difference between the gate and channel of the non-selected cell MC-u is 0 V. Therefore, in the non-selected cell MC-u in the selected string NS-s, no charge is injected in the charge storage layer due to the tunnel effect. As a result, the threshold voltage of the non-selected cell MC-u does not change. For example, the threshold voltage of the non-selected cell MC-u is kept at a value corresponding to the initial state.

In a non-selected string NS-z connected to the selected select gate line SGL, the non-select voltage V2 (e.g. 7 V) is applied from the non-selected global bit line GBL-u to the bit line BL-u and from the non-selected global source line GSL-u to the source line SL-u via the select gate transistors ST1 and ST2 which are in the ON state.

Among the non-selected cells of the non-selected string NS-z, in the non-selected cell MC-u connected to the non-selected word line WL-u, the potential of the source/drain region 52, 53 thereof becomes higher that the potential of the gate. Therefore, like the non-selected cell MC-u of the selected string NS-s, the threshold voltage of the non-selected cell MC-u of the non-selected string NS-z does not change.

Among the non-selected cells of the non-selected string NS-z, in the non-selected cell MC-u connected to the selected word line WL-s, the voltage V2 of about 7 V is applied to the source/drain region 52, 53 of the non-selected cell MC-u. The non-selected cell MC-u connected to the selected word line WL-s is set in the ON state. The potential of the channel region 51 of the non-selected cell MC-u that is in the ON state rises to about 7 V. Thereby, in the non-selected cell MC-u connected to the selected word line WL-s, the potential difference between the gate and channel has a voltage value lower than the program voltage VPGM (i.e. a voltage value at which no tunnel effect occurs). As a result, the threshold voltage of the non-selected cell MC-u connected to the selected word line WL-s does not change.

The select gate transistors ST1 and ST2 connected to the non-selected select gate line SGL-u are set in the OFF state.

In the non-selected string NS-u connected to the non-selected select gate line SGL-u, the bit line BL and source line SL are electrically isolated from the selected global bit line GBL and selected global source line GSL by the select gate transistors ST1 and ST2 which are in the OFF state. The non-selected string NS-u is electrically isolated from the non-selected global bit line GBL and non-selected global source line GSL by the select gate transistors ST1 and ST2 which are in the OFF state.

The potential of the non-selected word line WL-u is 0 V. Therefore, in the non-selected string NS-u, the threshold voltages of the non-selected cells MC-u do not change before and after the application of the program voltage VPGM, and is maintained.

When the word line WL has the comb-like structure as described above, the memory cells MC of strings NS, which are connected to mutually different select gate lines SGL, are connected to selected word lines WL-s and WL-x. In this case, a non-selected cell MC-x of the non-selected string NS-u, which is connected to the non-selected select gate line SGL-u, can be connected to the selected word line WL-x.

Among the non-selected cells MC-x in the non-selected string NS-u connected to the non-selected select gate line SGL-u, the local bit line BL and local source line SL of the non-selected cell MC-x are electrically isolated from the global bit line GBL and global source line SGL by the select gate transistors ST1 and ST2 which are in the OFF state. In this case, at the time of applying the program voltage VPGM, the channel region 51 and source/drain regions (local bit line and local source line) 52 and 53 of the non-selected cell MC-x are in an electrically floating state.

Therefore, with the application of the program voltage VPGM, the potential of the channel region 51 in the floating state in the non-selected cell MC-x, which is connected to the selected word line WL-x, increases. As a result, the potential difference between the gate and channel of the non-selected cell MC-x has such a magnitude that no charge is injected in the charge storage layer.

Accordingly, even if the non-selected cells MC-x belonging to the non-selected strings, which are connected to the non-selected select gate line GSL, are connected to the selected word line WL-s and WL-x, the threshold voltage of the non-selected cell MC-x does not substantially change.

As described above, in the flash memory of the present embodiment, in the memory cell array of the three-dimensional structure of the NOR-type flash memory, by the ON/OFF control of the select gate transistors, the threshold voltage of the selected cell can be selectively changed, while the variation of the threshold voltage of the non-selected cell can be suppressed.

After the application of the program voltage VPGM, the sequencer 19 sets the potentials of the respective interconnects WL, GBL, GSL and SGL to 0 V.

After the application of the program voltage (program operation) to the selected cell MC-s, it may be verified by a verify operation (hereinafter referred to as "program verify") whether the threshold voltage of the selected cell MC-s is set to a voltage value corresponding to the threshold state of write data. The verification of the threshold voltage of the memory cell in the program verify is executed by a similar method to a read operation (to be described later). In this case, the write operation (write sequence) is executed by such a sequence that the program operation and the program verify are alternately executed. When the result of the program verify for a certain selected cell is "pass", it is determined that predetermined write data was written to the selected cell. The selected cell of the verify "pass" is set in the write prohibition state at a time of a program operation after the program verify.

By the above operation, the write operation of the NOR-type flash memory of the present embodiment is completed.

In the example of FIG. 12, although only one string NS is set in the selected state, a plurality of strings NS connected to the selected select gate line SGL-s may be set in the selected state. In this case, in the selected strings, the program operation is simultaneously executed for the memory cells MC connected to the selected word line WL. Write/non-write of data to the selected cells is controlled by controlling the potentials of the corresponding global bit line GBL and corresponding global source line GSL.

As described above, the NOR-flash memory of the three-dimensional structure of the present embodiment can execute the write operation.

<Erase Operation>

Referring to FIG. 13, an erase operation of the NOR-flash memory of the present embodiment will be described.

As described above, the NOR-type flash memory 1 of the present embodiment receives the command CMD and address ADD from the controller 9. When the received command CMD is an erase command, the NOR-type flash memory 1 of this embodiment executes an erase operation on at least one memory cell MC designated by the address ADD.

As illustrated in FIG. 13, in the NOR-type flash memory 1 of the present embodiment, in a substantially similar manner as in the write operation, the global bit lines GBL, global source lines, word lines WL and select gate lines SGL are set in the selected state or non-selected state, based on the select address ADD.

At the time of the erase operation, the column control circuit 13 and sense amplifier circuit 14 apply an erase voltage VERA to a selected global bit line GBL and a selected global source line GSL. The voltage value of the erase voltage VERA is, for example, about 20 V. Note that a non-select voltage (e.g. a voltage of 0 V or more, and less than 20 V) may be applied to a non-selected global bit line GBL-u and a non-selected global source line GSL-u.

The row control circuit 12 applies a select voltage VSGa to the selected select gate line SGL-s, and applies a non-select voltage VSGb to a non-selected select gate line SGL-u.

The select gate transistors ST (ST1, ST2) connected to the selected select gate line SGL-s are set in the ON state. The selected global bit line GBL is connected to the local bit line BL. The selected global source line GSL is connected to the local source line SL.

Thereby, the erase voltage VERA is supplied to the local bit line BL and local source line SL via the select gate transistors ST which are in the ON state.

The select gate transistors ST, which are connected to the non-selected select gate line SGL-u, are set in the OFF state. A non-selected string NS-u connected to the non-selected select gate line SGL, is electrically isolated from the global bit line GBL and global source line GSL.

Thereby, in the non-selected string NS-u connected to the non-selected select gate line SGL-u, the voltage of the global bit line GBL and the voltage of the global source line GSL are not supplied to the local bit line BL and local source line SL-u.

The row control circuit 12 applies a select voltage Vb to a selected word line WL-s, and applies a non-select voltage Vc to a non-selected word line WL-u. In the erase operation, the voltage value of the select voltage Vb is about 0 V, and the voltage value of the non-select voltage Vc is about 14 V.

In the selected cell MC-s, the potential difference between the gate and the source/drain is set to a value that is approximately equal to the erase voltage VERA. At the time of the erase operation, the potential of the source/drain region 52, 53 of the selected cell MC-s is higher than the potential of the gate (word line WL) of the selected cell MC-s. Thereby, holes are injected in the charge storage layer 512 of the selected cell MC-s (or electrons are released from the charge storage layer 512 to the semiconductor layer 551). As a result, the value of the threshold voltage of the selected cell MC-s is shifted toward the range of the erase state. In this manner, in the NOR-type flash memory of the present embodiment, the data of the selected cell MC-s is erased.

In the non-selected cell MC-u in the selected string NS-u, the potential difference between the source/drain region 52, 53 and the gate is sufficiently smaller than the erase voltage VERA. For example, at the time of the erase operation, the potential difference between the source/drain region 52, 53 and the gate of the non-selected cell MC-u is about 6 V.

Thus, even if the non-selected cell MC-u in the selected string NS-u is connected to the selected global bit line GBL and selected global source line GSL, holes are not injected in the charge storage layer 512 (or electrons are not released from the charge accumulation layer 512 to the semiconductor layer 551). Therefore, the threshold voltage of the non-selected cell MC-u in the selected string NS-u does not change.

As regards the non-selected string NS-u connected to the selected select gate line SGL-s, the non-selected string NS-u is connected to the non-selected global bit line GBL-u and non-selected global source line GSL-u via the select gate transistors ST which are in the ON state. The potential of the non-selected global bit line GBL-u and the potential of the non-selected global source line GSL-u are supplied to the source/drain regions 52, 53 of the non-selected memory cell MC-u in the non-selected string NS-u. The potential difference between the gate and the source/drain region 52, 53 of the non-selected cell MC-u is sufficiently smaller than the erase voltage VERA.

Therefore, in the non-selected string NS-u connected to the selected select gate line SGL-s, the threshold voltage of the non-selected cell MC-u connected to the selected word line WL-s does not change.

In the non-selected string NS-u connected to the non-selected select gate line SGL-u, the non-selected cell MC-u is electrically isolated from the global bit line GBL and global source line GSL by the select gate transistors ST which are in the OFF state. The source/drain of the non-selected cell MC-u is set in the floating state.

The potential of the channel region of the non-selected cell MC-u is increased by the non-select voltage Vc that is applied to the non-selected word line WL-u. In addition, in the non-selected cell MC-u connected to the selected word line WL-s, the voltage Vb applied to the selected word line WL-s is 0 V. Therefore, the potential difference between the gate and the source/drain in the non-selected cell MC-u is smaller than the erase voltage VERA.

Thereby, in the non-select string NS-u connected to the non-selected select gate line SGL-u, the threshold voltage of the non-selected cell MC-u does not change.

In the non-selected string NS-u of the non-selected select gate line SGL-u, a memory cell MC-x connected to a selected word line WL-x is electrically isolated from the global bit line GBL and global source line GSL, to which the erase voltage VERA is applied, by the select gate transistors ST which are in the OFF state.

Therefore, no data erase occurs in the non-selected cell MC-x.

After the application of the erase voltage, the sequencer 19 sets the potentials of the interconnects WL, GBL, GSL and SGL to 0 V.

After the application of the erase voltage to the selected cell, it may be verified by a verify operation (hereinafter referred to as "erase verify") whether the threshold voltage of the selected cell is set to a voltage value corresponding to the erase state. The verification of the threshold voltage of the memory cell in the verify operation is executed by a similar method to a read operation (to be described later).

For example, there is a case in which a variance occurs in characteristics among the memory cells in the memory cell array. Due to the variance in characteristics, it is possible that the threshold voltage of the memory cell reaches a voltage or 0 V or less due to the application of the erase voltage, and the threshold state of the memory cell becomes an over-erase state.

In order to set the threshold voltage of the memory cell, which is in the over-erase state, to a value corresponding to the erase state, a write operation (soft program) may be executed.

By the above operation, the erase operation of the NOR-type flash memory of the three-dimensional structure of the present embodiment is completed.

Note that in the NOR-type flash memory, data erase may be executed in parallel (substantially at the same time) for the memory cells of the strings NS connected to the selected select gate line SGL-s.

For example, in the erase operation of the NOR-type flash memory, data of selected cells MC-s connected to one or more selected word lines WL-s can be erased. Note that in the erase operation, a plurality of select gate lines SGL may be selected at the same time. Thereby, data erase can be executed for strings NS connected to different select gate lines.

As described above, the erase operation is executed in the NOR-type flash memory of the three-dimensional structure of the present embodiment.

<Read Operation>

Figure 14:
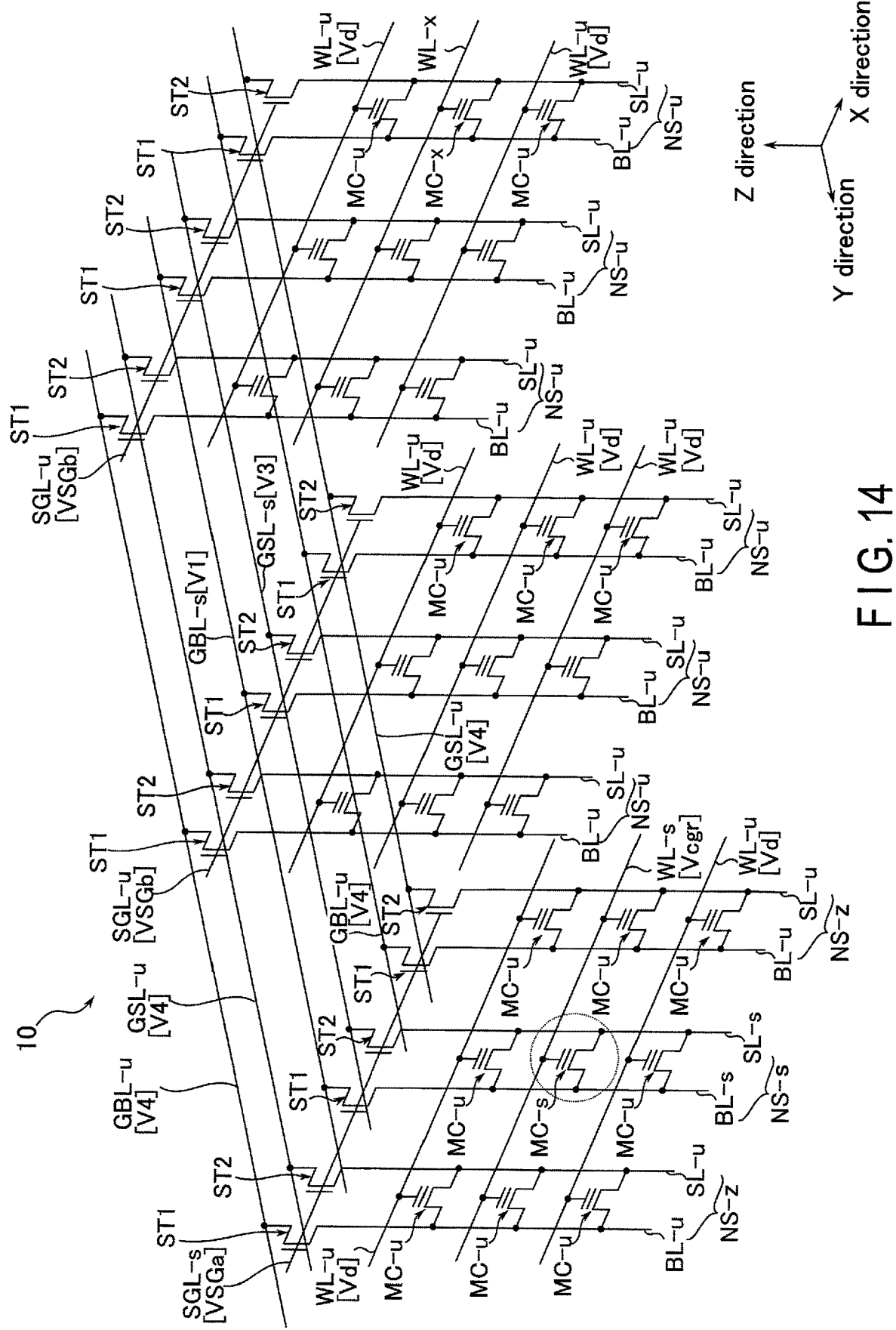

Referring to FIG. 14, a read operation of the flash memory of the present embodiment will be described.

As described above, the NOR-type flash memory 1 of the present embodiment receives the command CMD and address ADD from the controller 9. When the received command CMD is a read command, the NOR-type flash memory 1 of this embodiment executes a read operation on at least one memory cell MC designated by the address ADD.

As illustrated in FIG. 14, based on a decoded result of the address ADD, the global bit lines GBL, global source lines GSL, word lines WL and select gate lines SGL are set in the selected state or non-selected state.

At the time of the read operation, the column control circuit 13 and sense amplifier circuit 14 apply a selected bit line voltage V1 to a selected global bit line GBL and a selected source line voltage V3 to a selected global source line GSL. For example, the selected bit line voltage V1 has a value in a range of about 0.5 V to 1 V, and the selected source line voltage V3 is about 0 V.

A predetermined voltage V4 (e.g. 0 V) may be applied to a non-selected global bit line GBL-u and a non-selected global source line GSL-u.

The row control circuit 12 applies a select voltage VSGa to a selected select gate line SGL-s, and a non-select voltage VSGb to a non-selected select gate line SGL-u.

The select gate transistors ST1 and ST2, which are connected to the selected select gate line SGL-s, are set in the ON state. The selected global bit line GBL-s is connected to the local bit line BL via the select gate transistor ST1 that is in the ON state. The selected global source line GSL-s is connected to the local source line SL via the select gate transistor ST2 that is in the ON state. Thereby, the selected bit line voltage V1 and selected source line voltage V3 are supplied to the local bit line BL and local source line SL, respectively, via the select gate transistors ST1 and ST2 that are in the ON state.

The select gate transistors ST1 and ST2, which are connected to a non-selected select gate line SGL-u, are set in the OFF state. Thereby, a non-selected string NS-u, which corresponds to the non-selected select gate line SGL-u, is electrically isolated from the global bit line GBL and global source line GSL. The voltage V1 of the selected global bit line GBL-s and the voltage V3 of the selected global source line GSL-s are not supplied to the local bit line BL and local source line SL by the select gate transistors ST1 and ST2 which are in the OFF state.

The row control circuit 12 applies a read voltage Vcgr to the selected word line WL-s, and a non-select voltage Vd to the non-selected word line WL-u.

In the read operation, the read voltage Vcgr has one or more voltage values (read levels) for determining the threshold voltage of the memory cell MC. For example, when one memory cell stores data of one bit (see part (a) of FIG. 11), the voltage value of the read voltage Vcgr is set at the read level VAR.

When the threshold voltage of the selected cell MC-s is equal to or less than the voltage value of the read voltage Vcgr, the selected cell MC-s is set in the ON state. When the selected cell MC-s is in the ON state at the time of the application of the read voltage Vcgr, the local bit line BL is electrically connected to the local source line SL via the channel of the selected cell MC-s that is in the ON state.

Thereby, in the selected cell MC-s that is in the ON state, a cell current Icell flows between the local bit line BL and local source line SL. As a result, at the time of the application of the read voltage Vcgr, if the selected cell MC-s is in the ON state, the cell current Icell flows to the selected global bit line GBL-s.

When the threshold voltage of the selected cell MC-s is higher than the voltage value of the read voltage Vcgr, the selected cell MC-s is set in the OFF state. When the selected cell MC-s is in the OFF state at the time of the application of the read voltage Vcgr, the local bit line BL is electrically isolated from the local source line SL by the selected cell that is in the OFF state.

Thereby, in the selected cell MC-s that is in the OFF state, the cell current Icell does not flow between the local bit line BL and local source line SL. As a result, at the time of the application of the read voltage Vcgr, if the selected cell MC-s is in the OFF state, the cell current Icell does not flow to the selected global bit line GBL-s.

At the time of the read operation, among the non-selected cells MC-u of the non-selected string NS-u, there may be a non-selected cell MC-x which is connected to a selected word line WL-x. The non-selected cell MC-x connected to the selected word line WL-x is electrically isolated from the global bit line GBL and global source line GSL by the select gate transistors ST that are in the OFF state.

Therefore, the non-selected cell MC-u, to which the read voltage Vcgr is applied, is prevented from greatly adversely affecting the read of data from the selected cell MC-s.

In the present embodiment, the voltage value of the non-select voltage Vd is about 0 V. As described above, the threshold voltage of the memory cell MC is higher than 0 V. The non-selected cell MC-u, to which the non-select voltage Vd is applied, is not set in the ON state. Therefore, in the non-selected cell MC-u, the local bit line BL is electrically isolated from the local source line SL.

Note that in the non-selected string NS-u connected to the selected select gate line SGL-s, if the non-select voltage V4 is applied to the global bit line GBL and global source line GSL, the data read is not executed for the memory cells in the non-selected string NS-u.

For example, when the select voltages V1 and V3 are applied to each of the global bit lines GBL and each of the global source lines GSL, data read can be executed in parallel for the memory cells connected to the selected word line WL-s in the selected strings connected to the selected select gate line SGL-s.

The sense amplifier circuit 14 senses the presence/absence of the cell current Icell. The sense amplifier circuit 14 amplifies the magnitude of the signal corresponding to the sensed result.

Based on the sensed result of the sense amplifier circuit 14, the data that is read from the selected cell MC-s is determined.

For example, one memory cell MC can store data of two bits or more, the data that is read from the selected cell MC-s is determined based on the result of ON/OFF of the selected cell MC-s for the respective read levels.

Thereafter, the sequencer 19 sets the potentials of the interconnects WL, GBL, GSL and SGL to 0 V.

By the above-described operation, the read operation of the NOR-type flash memory of the three-dimensional structure of the present embodiment is completed.

As described above, in the NOR-type flash memory of the three-dimensional structure of the present embodiment, the read operation is executed.

(c) Manufacturing Method

Referring to FIG. 15 to FIG. 49, a manufacturing method of the flash memory of the present embodiment will be described.

FIG. 15 and FIG. 16 are schematic cross-sectional process views illustrating a fabrication step in the manufacturing method of the NOR-type flash memory of the present embodiment. FIG. 15 corresponds to a cross section along the X direction of the memory cell array of the flash memory. FIG. 16 corresponds to a cross section along the Y direction of the memory cell array of the flash memory.

As illustrated in FIG. 15 and FIG. 16, a plurality of insulating layers 502 and a plurality of insulating layers (hereinafter referred to as "sacrificial layers") 509 are alternately formed on a substrate 600 in the Z direction, by using, for example, CVD (Chemical Vapor Deposition). Thereby, a layer stack 500X is formed on the substrate 600. In the present example illustrated, although the layer stack 500X includes four sacrificial layers 509, the number of sacrificial layers 509 in the layer stack 500X may be changed as appropriate, in accordance with the number of memory cells (the memory capacity of the NOR-type flash memory) formed in the memory cell array. The number of sacrificial layers 509 in the layer stack 500X may be five or more, or may be three or less.

The material of the sacrificial layer 509 and the material of the insulating layer 502 are selected such that a large etching selectivity ratio is obtained between the two layers 502 and 509. For example, when the material of the insulating layer 502 is silicon oxide, silicon nitride is used as the material of the sacrificial layer 509.

Further, using a well-known photolithography technology and etching technology, a mask layer 900 is formed on a top surface of the layer stack 500X in a manner to have predetermined patterns 990 and 901.

Figure 17:
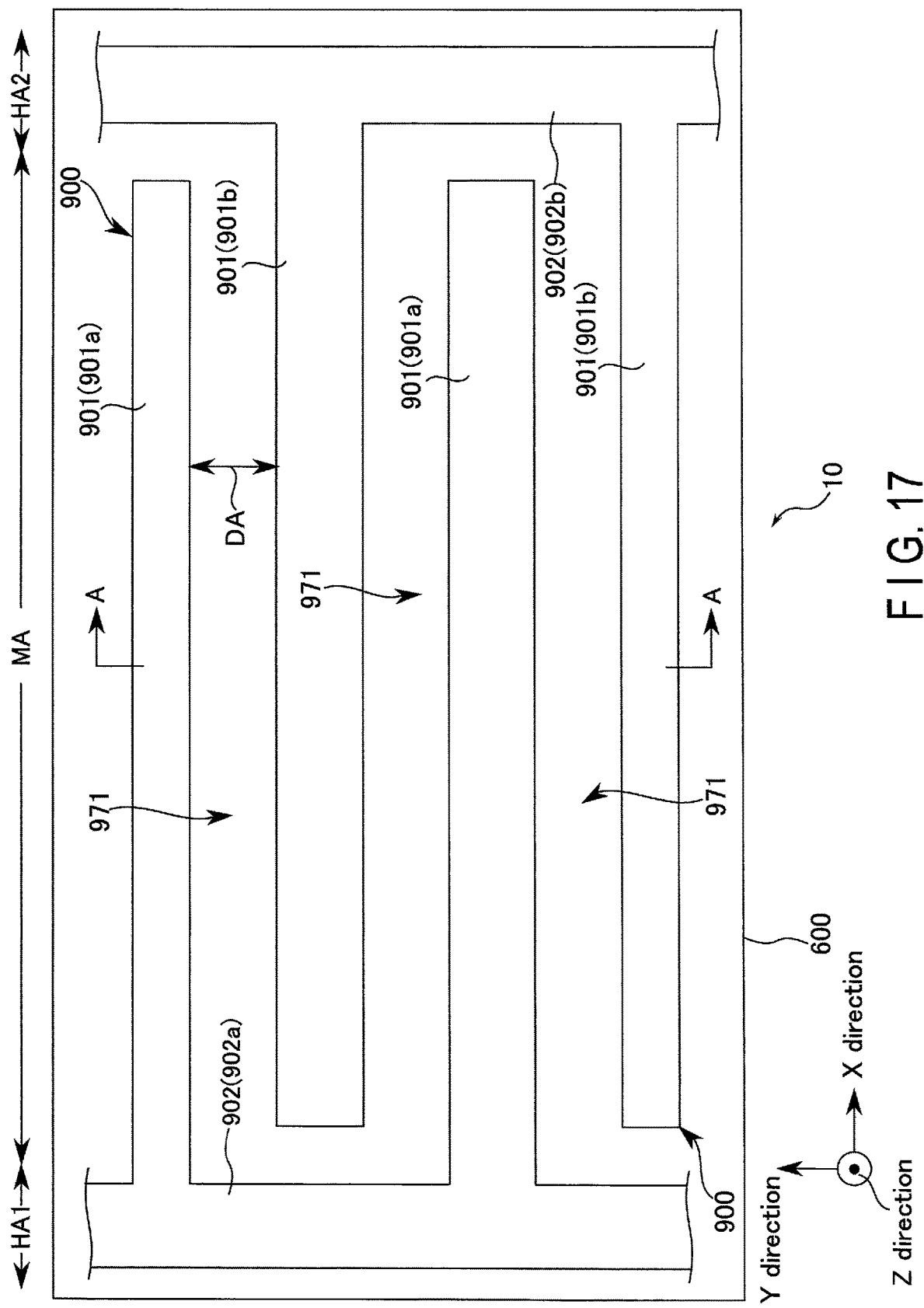
FIG. 17 is a top view illustrating a fabrication step of the manufacturing method of the memory device of the first embodiment.

FIG. 17 and FIG. 18 are views illustrating a fabrication step in the manufacturing method of the NOR-type flash memory of the present embodiment. FIG. 17 is a top view of the memory cell array of the flash memory in a fabrication step of the manufacturing method of the flash memory. FIG. 18 is a schematic cross-sectional view taken along line A-A in FIG. 17.

As illustrated in FIG. 17 and FIG. 18, the mask layer 900 includes a portion (finger portion) 901 (901a, 901b) extending in the X direction and a portion (axial portion) 902 (902a, 902b) extending in the Y direction. The mask layer 900 has a comb-shaped pattern.

The axial portion 902a of the mask layer 900 is formed in one hookup area HA1 of the memory cell array 10. The axial portion 902b of the mask layer 900 is formed in the other hookup area HA2 of the memory cell array 10.

One end of the finger portion 901a of the mask layer 900 is connected to the axial portion 902a. The other end of the finger portion 901a is separated from the axial portion 902b. One end of the finger portion 901b of the mask layer 900 is connected to the axial portion 902b. The other end of the finger portion 901b is separated from the axial portion 902a. Each finger portion 901 extends from the hookup area HA toward an array area MA.

The finger portions 900a and finger portions 900b are alternately arranged in the Y direction. A dimension between the finger portion 900a and finger portion 900b in the Y direction is set to "DA".

The dimension DA is set in accordance with a dimension of a semiconductor pillar and a dimension of a memory layer, which will be formed in fabrication steps to be described later. For example, the dimension DA is set to approximately a total (t1+2×t2) of a dimension t1 in the Y direction of the semiconductor pillar and twice a dimension (thickness of the memory layer) t2 in the Y direction of the memory layer.

By performing etching based on the pattern of the mask layer 900, a layer stack 500A having a comb-like planar shape is formed. A trench (groove) 971 is formed between finger portions 901 of the layer stack 500A. The dimension DA of the trench 971 in the Y direction corresponds to the dimension between two finger portions 901 of the mask layer 900. A bottom portion of the trench 971 reaches the substrate 600. A top surface of the substrate 600 is exposed via the trench 971.

Figure 19:
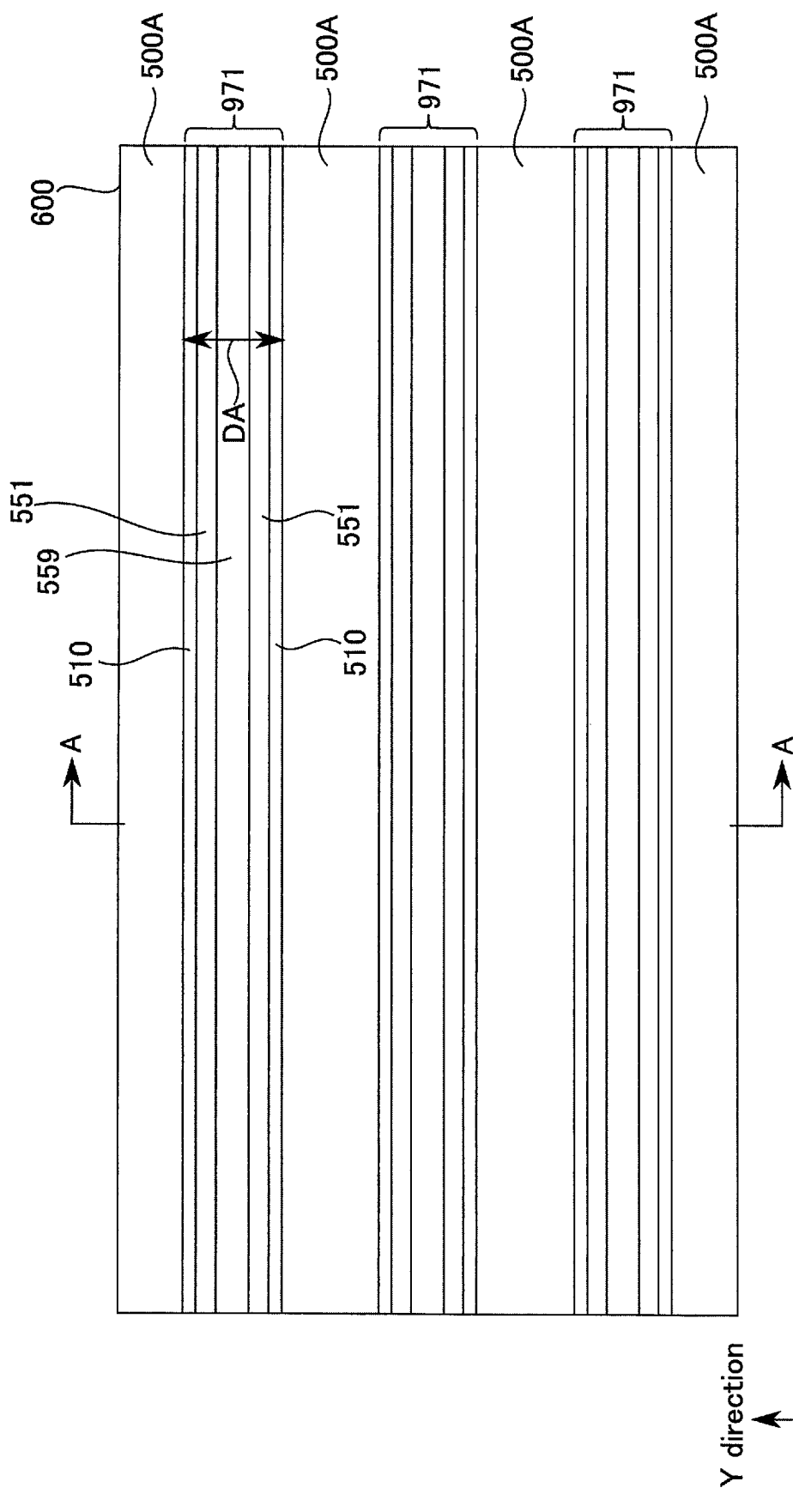
FIG. 19 is a top view illustrating a fabrication step of the manufacturing method of the memory device of the first embodiment.
Figure 21:
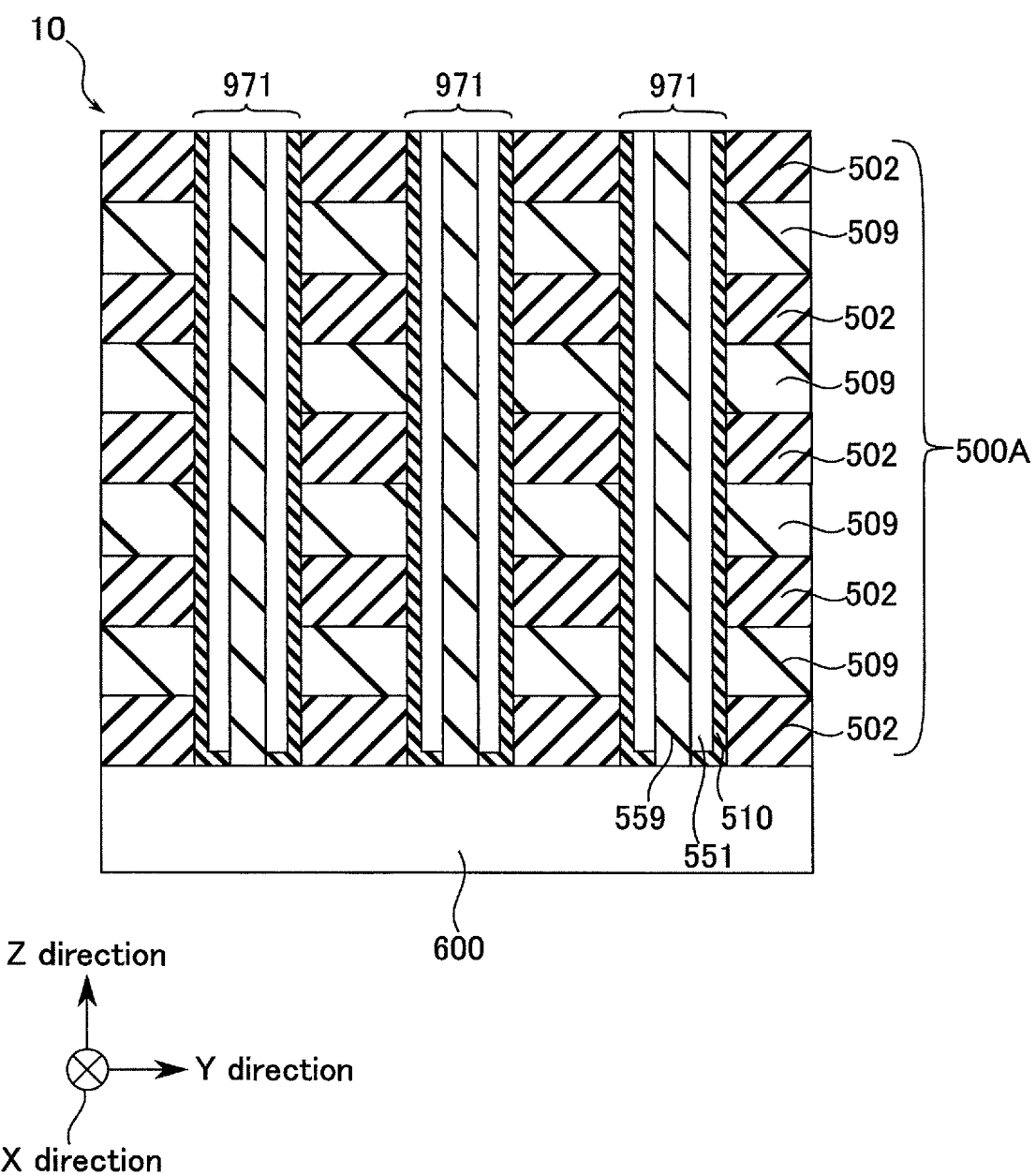

FIG. 19, FIG. 20 and FIG. 21 are views illustrating fabrication steps in the manufacturing method of the NOR-type flash memory of the present embodiment. FIG. 19 is a top view of the memory cell array of the flash memory in a fabrication step of the manufacturing method of the flash memory. FIG. 20 and FIG. 21 are schematic cross-sectional views taken along line A-A in FIG. 19.

As illustrated in FIG. 19 and FIG. 20, after the mask layer 900 is removed, a memory layer 510 is formed by, for example, CVD, on side surfaces (surfaces crossing the X-Y plane) of the layer stack 500A in the trench 971. The memory layer 510 includes portions extending in the X direction. As described above (see FIG. 9), the memory layer 510 is a stacked film including three layers 511, 512 and 513. The memory layer 510 includes an insulating layer 511, a charge storage layer 512 and an insulating layer 513. The insulating layer 513 is formed on the insulting layers 502 and 509. The charge storage layer 512 is formed on the insulating layer 513. The insulating layer 511 is formed on the charge storage layer 512.

In this manner, in the memory layer 510, the insulating layer 513 is in contact with the layer stack 500A. The charge storage layer 512 is interposed between the two insulating layers 511 and 513.

A semiconductor layer (e.g. polysilicon layer or amorphous silicon layer) 551 is formed on the memory layer 510. The semiconductor layer 551 includes a portion extending in the X direction.

In the present embodiment, the dimension DA in the Y direction of the trench 971 is greater than a total of a dimension of twice the thickness of the memory layer 510 and a dimension of twice the thickness of the semiconductor layer 551. Thereby, in the trench 971, a space 972 between the finger portions FNG is not closed by the memory layer 510 and semiconductor layer 551. The space 972 is secured between the semiconductor layers 551 which mutually neighbor in the Y direction in the trench 971.

For example, in the state in which the space is formed between the semiconductor layers 551 which mutually neighbor in the Y direction, etch-back by anisotropic etching 950, such as RIE (Reactive Ion Etching), is executed on the semiconductor layers 551 and memory layers 510. Thereby, the semiconductor layers 551 and memory layers 510 on the top surface of the layer stack 500A are removed. Along with this, the semiconductor layers 551 and memory layers 510 are removed from the top surface of the substrate 600 at a bottom part of the trench 971. In the trench 971, the semiconductor layers 551 mutually neighbor in the Y direction, with the space 972 being interposed.

As a result, the memory layers 510 and semiconductor layers 551 are split in the bottom part of the trench 971. In the trench 971, the top surface of the substrate 600 is exposed.

Thereafter, as illustrated in FIG. 21, an insulating layer 559 is formed in the space 972 between the semiconductor layers 551 by, for example, CVD. The insulating layer 559 is buried in the trench 971. In the array area MA, the insulating layer 559 extends in the Y direction.

Figure 22:
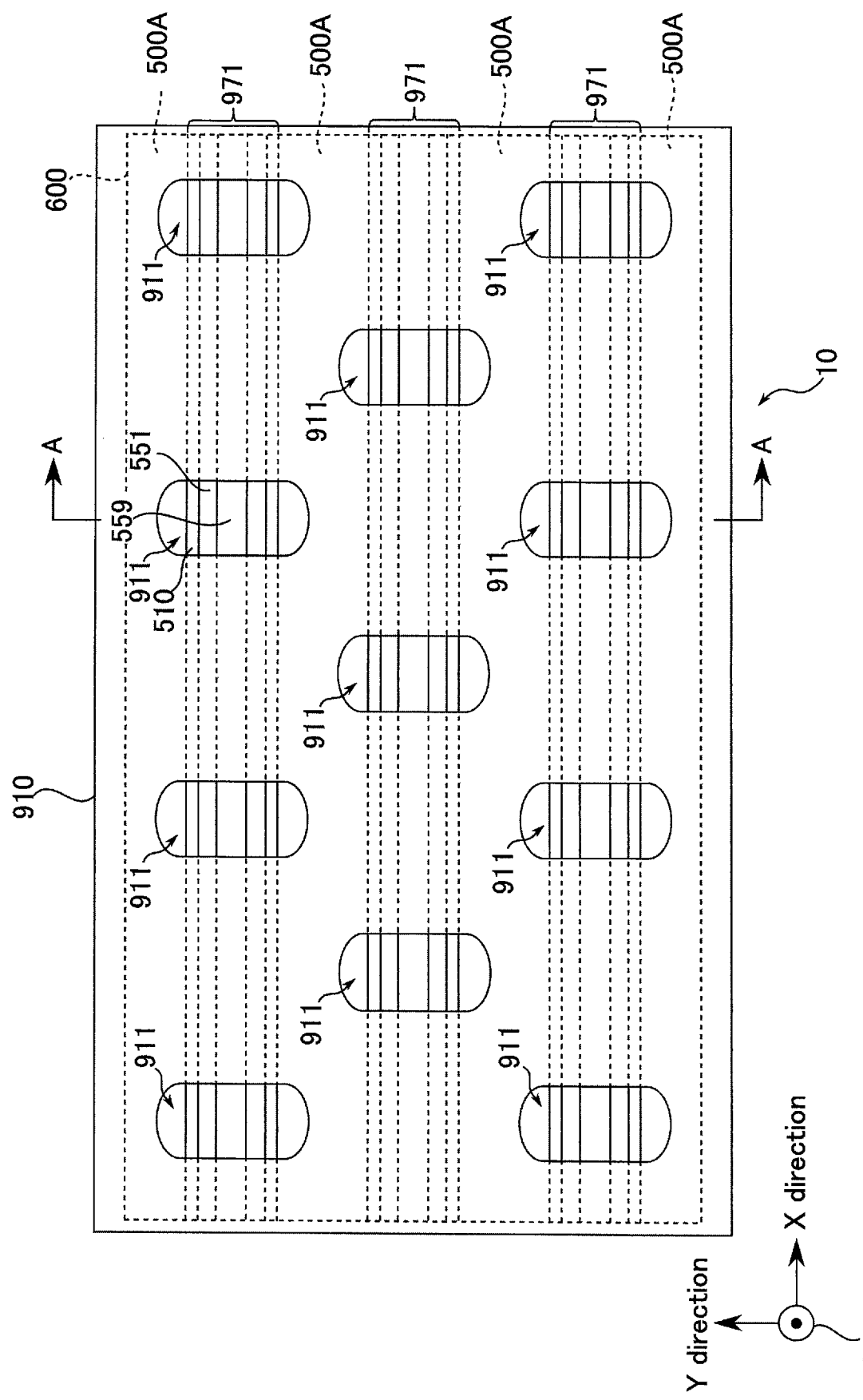
FIG. 22 is a top view illustrating a fabrication step of the manufacturing method of the memory device of the first embodiment.

FIG. 22 and FIG. 23 are views illustrating a fabrication step in the manufacturing method of the NOR-type flash memory of the present embodiment. FIG. 22 is a top view of the memory cell array of the flash memory in a fabrication step of the manufacturing method of the flash memory. FIG. 23 is a schematic cross-sectional view taken along line A-A in FIG. 22.

As illustrated in FIG. 22 and FIG. 23, a mask layer 910 having a predetermined pattern is formed on the layer stack 500A, memory layer 510, semiconductor layer 551 and insulating layer 559 by using a well-known photolithography technology and etching technology.

The mask layer 910 includes a plurality of openings (opening patterns) 911. The opening 911 is formed above the trench 971 (memory layer 510, semiconductor layer 551 and insulating layer 559). The openings 911 are arranged in the array area MA at predetermined intervals (pitch).

For example, a dimension DB in the Y direction of the opening 911 is greater than the dimension DA in the Y direction of the trench 971.

In two trenches 971 which mutually neighbor in the Y direction, the opening 911 above one of the two trenches 971 does not neighbor the opening 911 above the other trench 971 in the Y direction. As regards the openings 911 above two trenches 971 which mutually neighbor in the Y direction, the openings 911 mutually neighbor in an oblique direction in the X-Y plane.

Between two openings 911 which mutually neighbor in the Y direction, an upper part of the trench 971 is covered with the mask layer 910. Between two openings 911 which mutually neighbor in the X direction, an upper part of the trench 971 is covered with the mask layer 910.

Based on the pattern 911 of the mask layer 910, the memory layer 510, semiconductor layer 551, insulating layer 559 and layer stack 500A are etched by, for example, anisotropic etching.

Figure 24:
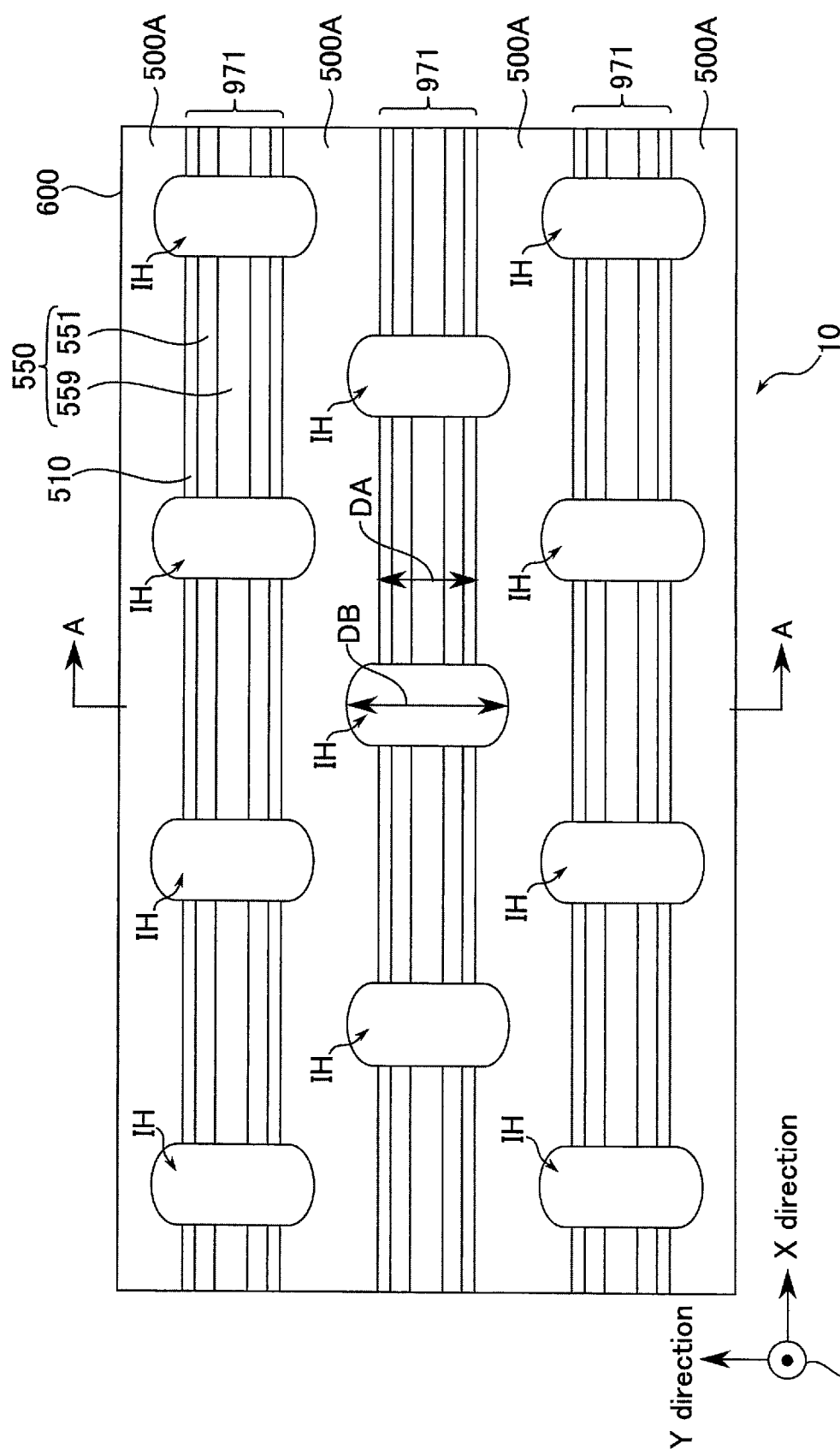
FIG. 24 is a top view illustrating a fabrication step of the manufacturing method of the memory device of the first embodiment.

FIG. 24 and FIG. 25 are views illustrating a fabrication step in the manufacturing method of the NOR-type flash memory of the present embodiment. FIG. 24 is a top view of the memory cell array of the flash memory in a fabrication step of the manufacturing method of the flash memory. FIG. 25 is a schematic cross-sectional view taken along line A-A in FIG. 24.

As illustrated in FIG. 24 and FIG. 25, an opening IH is formed in the layer stack 500A and trench 971 by anisotropic etching. A dimension DB in the Y direction (a maximum dimension in the Y direction) of the opening IH is greater than the dimension DA in the Y direction of the trench 971. The layers in the trench 971 are split in the X direction by the formation of the opening IH.

Thereby, a plurality of semiconductor pillars 550 and a plurality of memory layers 510 are formed in the trench 971. The memory layer 510 is formed between the semiconductor pillar 550 and layer stack 500.

Figure 26:
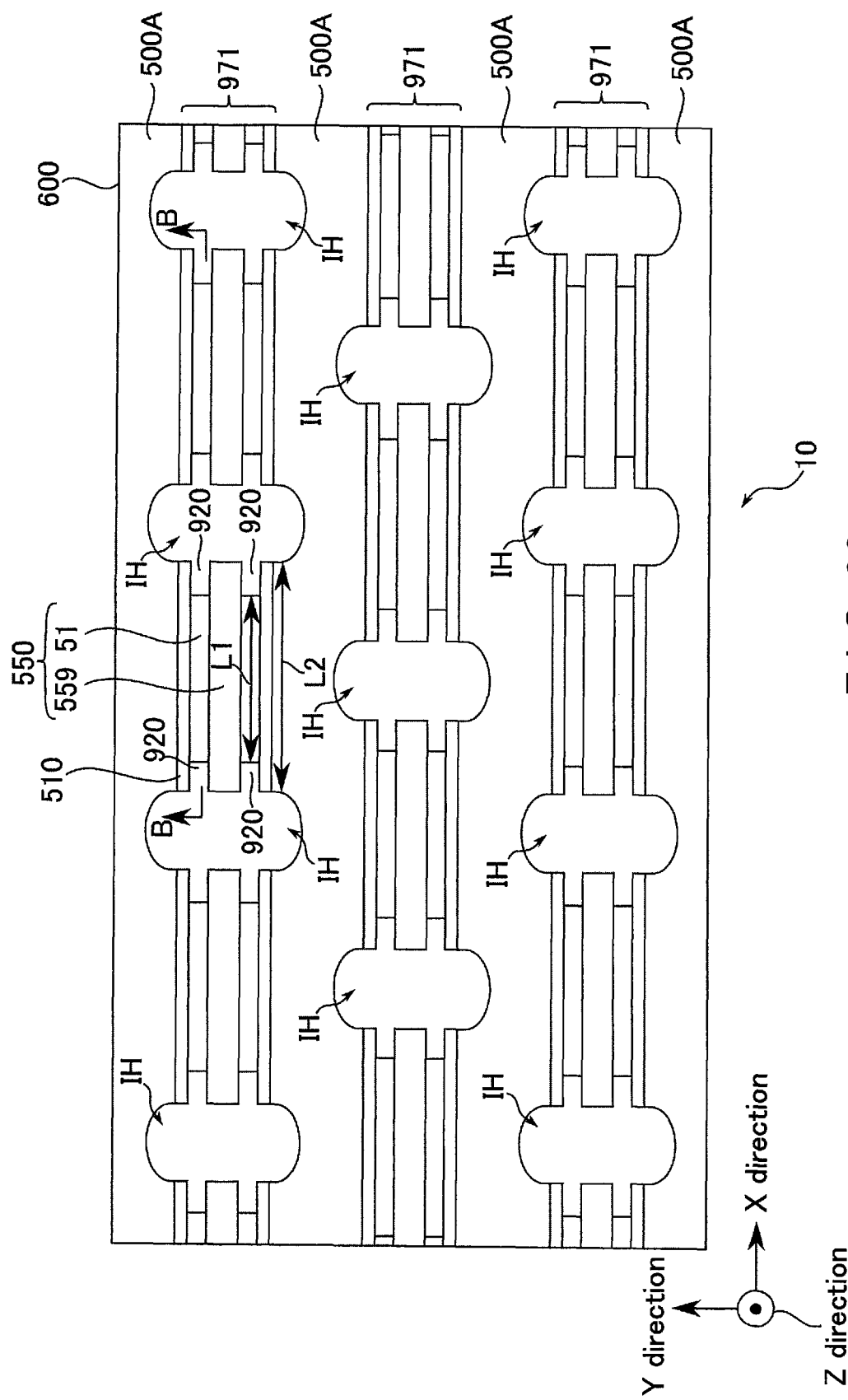
FIG. 26 is a top view illustrating a fabrication step of the manufacturing method of the memory device of the first embodiment.
Figure 27:
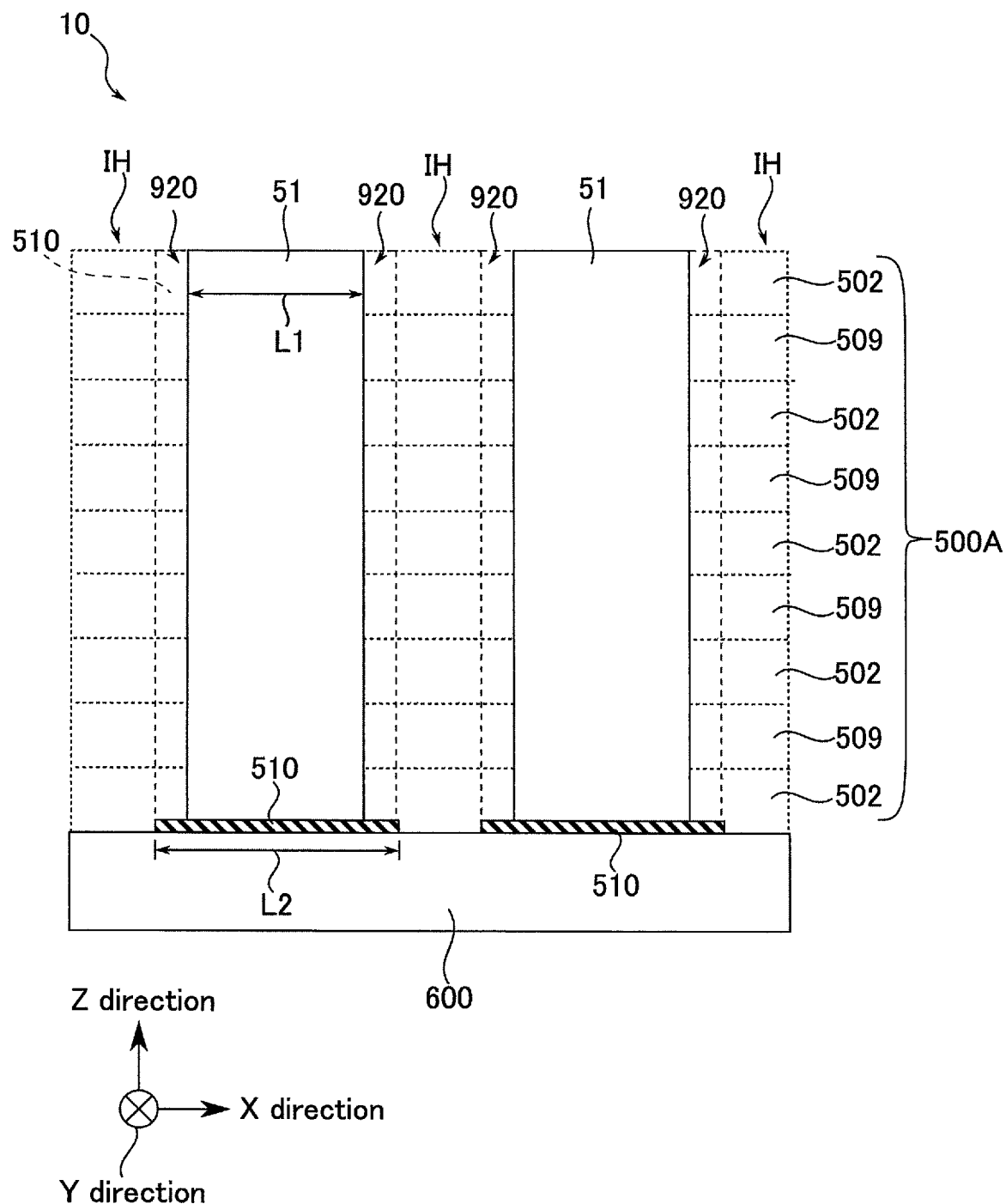
FIG. 27 is a cross-sectional process view illustrating a fabrication step of the manufacturing method of the memory device of the first embodiment.

FIG. 26 and FIG. 27 are views illustrating a fabrication step in the manufacturing method of the NOR-type flash memory of the present embodiment. FIG. 26 is a top view of the memory cell array of the flash memory in a fabrication step of the manufacturing method of the flash memory. FIG. 27 is a schematic cross-sectional view taken along line B-B in FIG. 26.

After the mask layer 910 is removed, etching is selectively performed on the semiconductor layers 551 via the opening IH.

Thereby, as illustrated in FIG. 26 and FIG. 27, that part of the semiconductor layer 51, which is exposed to the opening IH, retreats in the X direction. For example, a dimension L1 in the X direction of the semiconductor layer 51 becomes smaller than a dimension L2 in the X direction of the memory layer 510.

At an end portion in the X direction of the semiconductor layer 51, a recess 920 is formed between the memory layer 510 and core layer 559.

Figure 28:
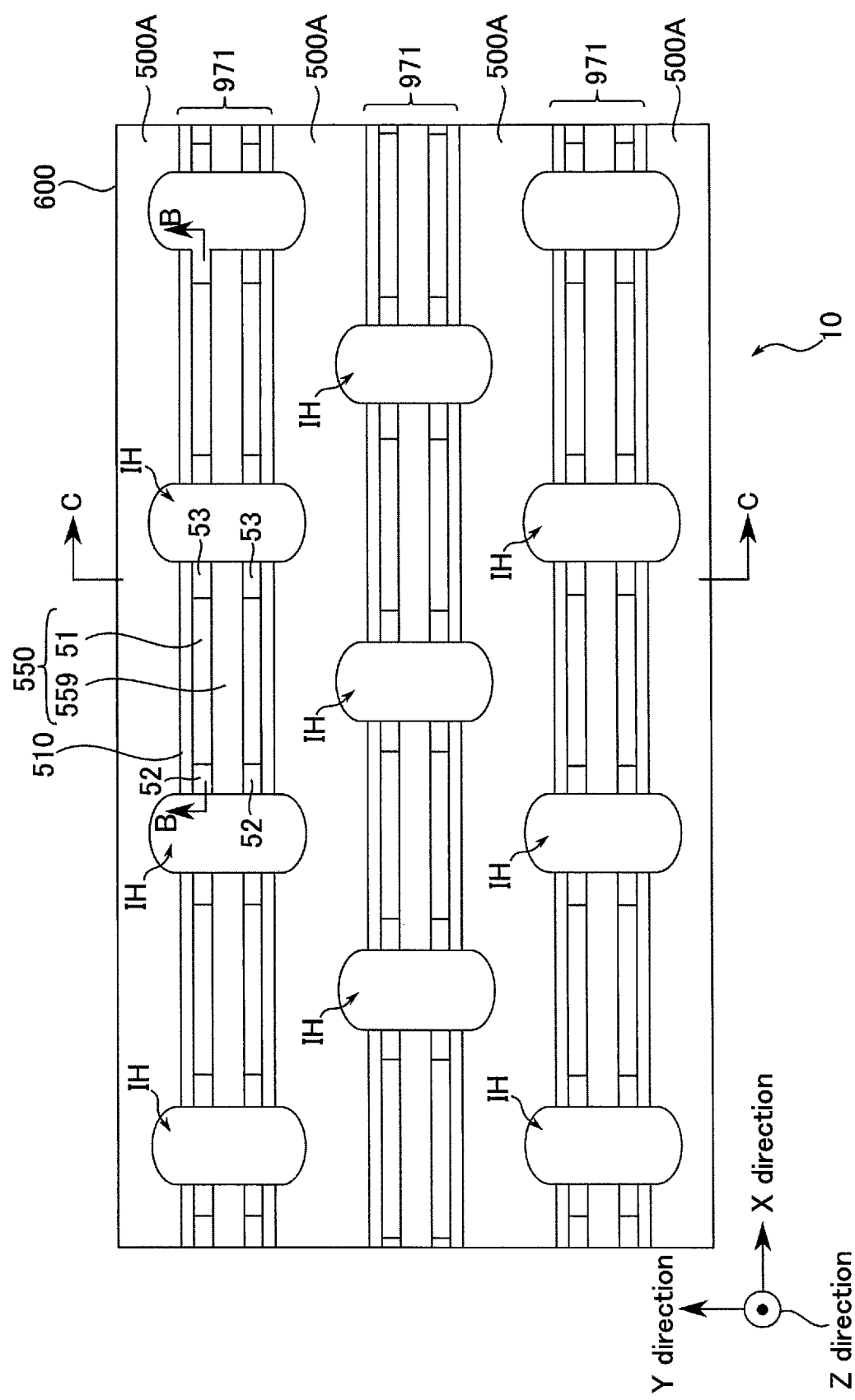
FIG. 28 is a top view illustrating a fabrication step of the manufacturing method of the memory device of the first embodiment.

FIG. 28, FIG. 29 and FIG. 30 are views illustrating a fabrication step in the manufacturing method of the NOR-type flash memory of the present embodiment. FIG. 28 is a top view of the memory cell array of the flash memory in a fabrication step of the manufacturing method of the flash memory. FIG. 29 is a schematic cross-sectional view taken along line B-B in FIG. 28. FIG. 30 is a schematic cross-sectional view taken along line C-C in FIG. 28.

As illustrated in FIG. 28, FIG. 29 and FIG. 30, a semiconductor layer (e.g. polysilicon layer or amorphous silicon layer) is formed on the layer stack 500A, semiconductor pillar 550, memory layer 510 and substrate 600 by, for example, CVD. Selective etching is performed on the formed semiconductor layer.

Thereby, semiconductor layers 52 and 53 are left in a self-aligning manner in the recesses 920 between the memory layer 510 and core layer 559. The semiconductor layers 52 and 53 are formed on end portions in the X direction of the semiconductor layer 51.

The semiconductor layers 52 and 53 are formed such that an n-type dopant concentration (impurity concentration) of the semiconductor layer 52, 53 becomes higher than an n-type dopant concentration of the semiconductor layer 51.

Figure 32:
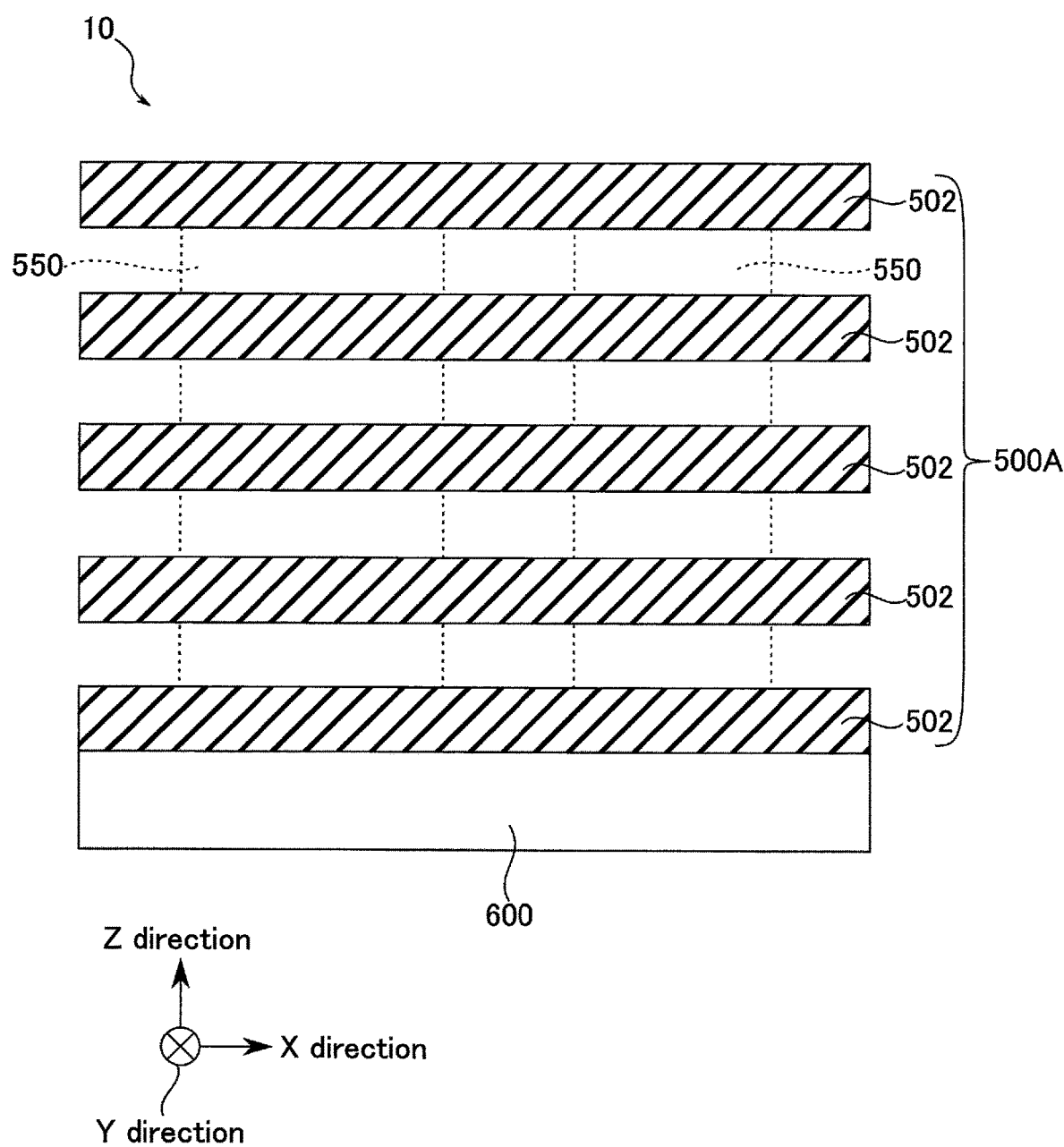

FIG. 31 and FIG. 32 are views illustrating a fabrication step in the manufacturing method of the NOR-type flash memory of the present embodiment. FIG. 31 corresponds to a cross section along the Y direction in a fabrication step of the manufacturing method of the flash memory. FIG. 32 corresponds to a schematic cross section along the X direction in a fabrication step of the manufacturing method of the flash memory.

As illustrated in FIG. 31 and FIG. 32, the sacrificial layers (silicon nitride films) in the layer stack 500A are selectively removed by etching via the opening IH (e.g. wet etching using $H_3PO_4$). A space 930 is formed between the insulating layers 502 of the layer stack 500A.

The layer stack 500A including the space 930 between the insulating layers 502 is supported by the semiconductor pillar 550 and a support member (not shown) formed before removing sacrificial layers.

Figure 34:
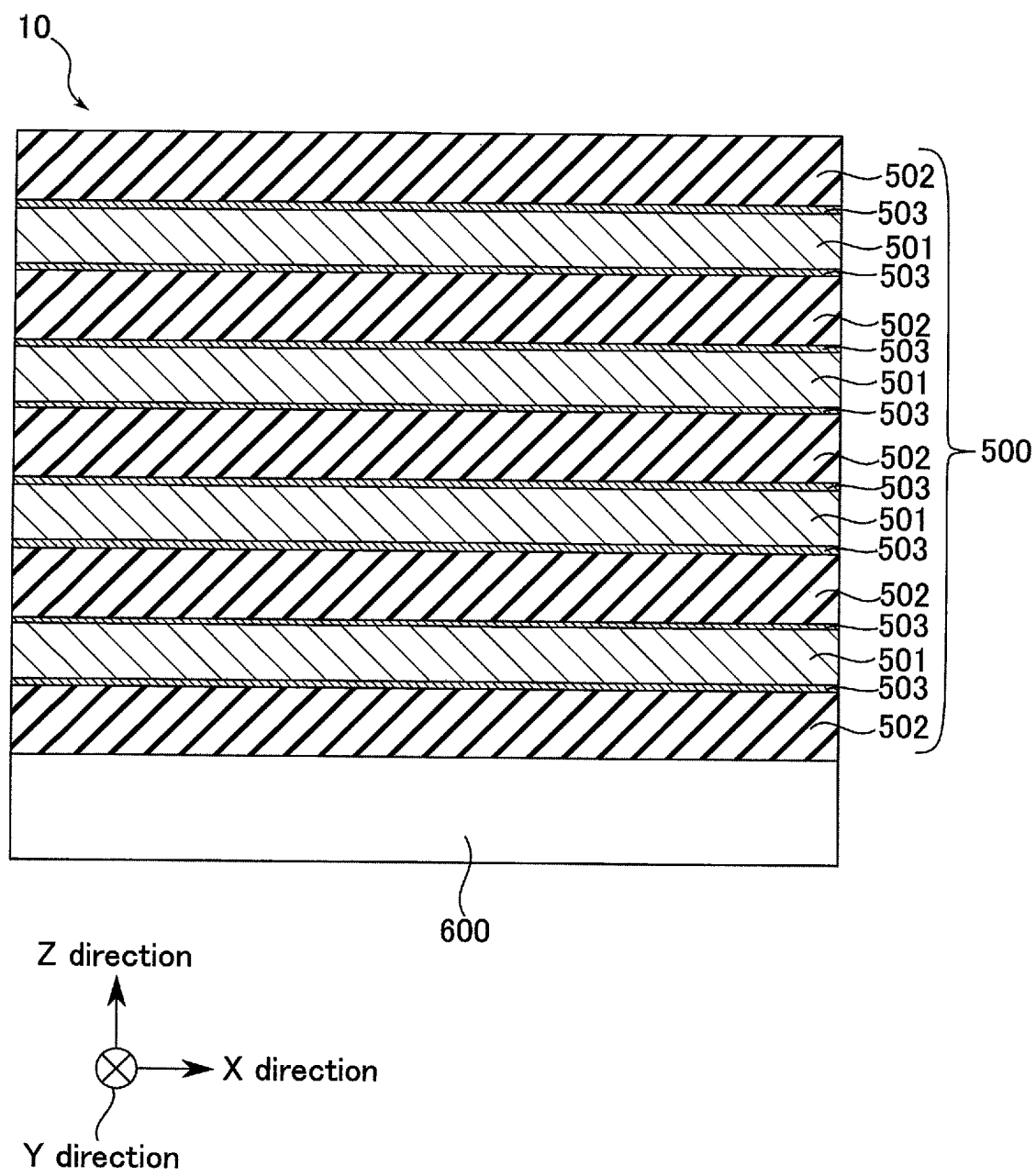

FIG. 33 and FIG. 34 are views illustrating a fabrication step in the manufacturing method of the NOR-type flash memory of the present embodiment. FIG. 33 corresponds to a cross section along the Y direction of the memory cell array in a fabrication step of the manufacturing method of the flash memory. FIG. 34 corresponds to a cross section along the X direction of the memory cell array in a fabrication step of the manufacturing method of the flash memory.

As illustrated in FIG. 33 and FIG. 34, a barrier layer (e.g. Ti/TiN layer) 503 is formed on the insulating layer 502 and memory layer 510 in the space 930.

A conductive layer (e.g. tungsten layer) 501 is formed on the barrier layer 503.

The barrier layer 503 and conductive layer 501 in the opening IH are removed.

Thereby, the conductive layer (word line) 501 is formed between the insulating layers 502 in the layer stack 500A, and the layer stack 500 shown in FIG. 3 is formed.

Note that an insulating layer (e.g. aluminum oxide layer) may be formed on the insulating layer 502 and memory layer 510 before the barrier layer 503 is formed. In this case, the insulating layer is formed between the memory layer 510 and barrier layer 503.

Figure 37:
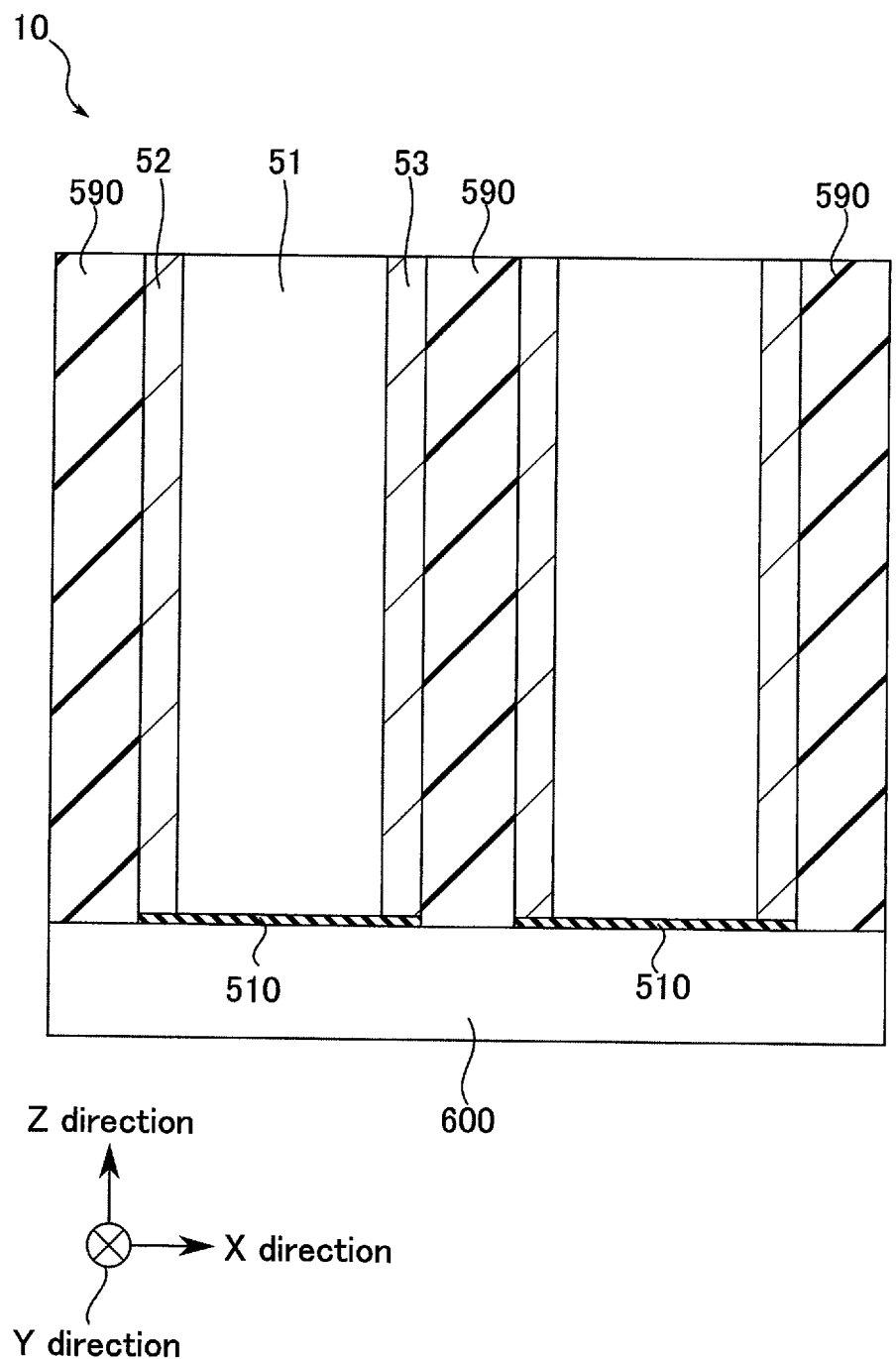

FIG. 35, FIG. 36 and FIG. 37 are views illustrating a fabrication step in the manufacturing method of the NOR-type flash memory of the present embodiment. FIG. 35 is a top view of the memory cell array of the flash memory in a fabrication step of the manufacturing method of the flash memory. FIG. 36 is a schematic cross-sectional view taken along line A-A in FIG. 35. FIG. 37 is a schematic cross-sectional view taken along line B-B in FIG. 35.

As illustrated in FIG. 35, FIG. 36 and FIG. 37, an insulating layer 590 is buried in the opening IH. Thereby, memory cells MC arranged in the X direction are isolated from each other.

Figure 40:
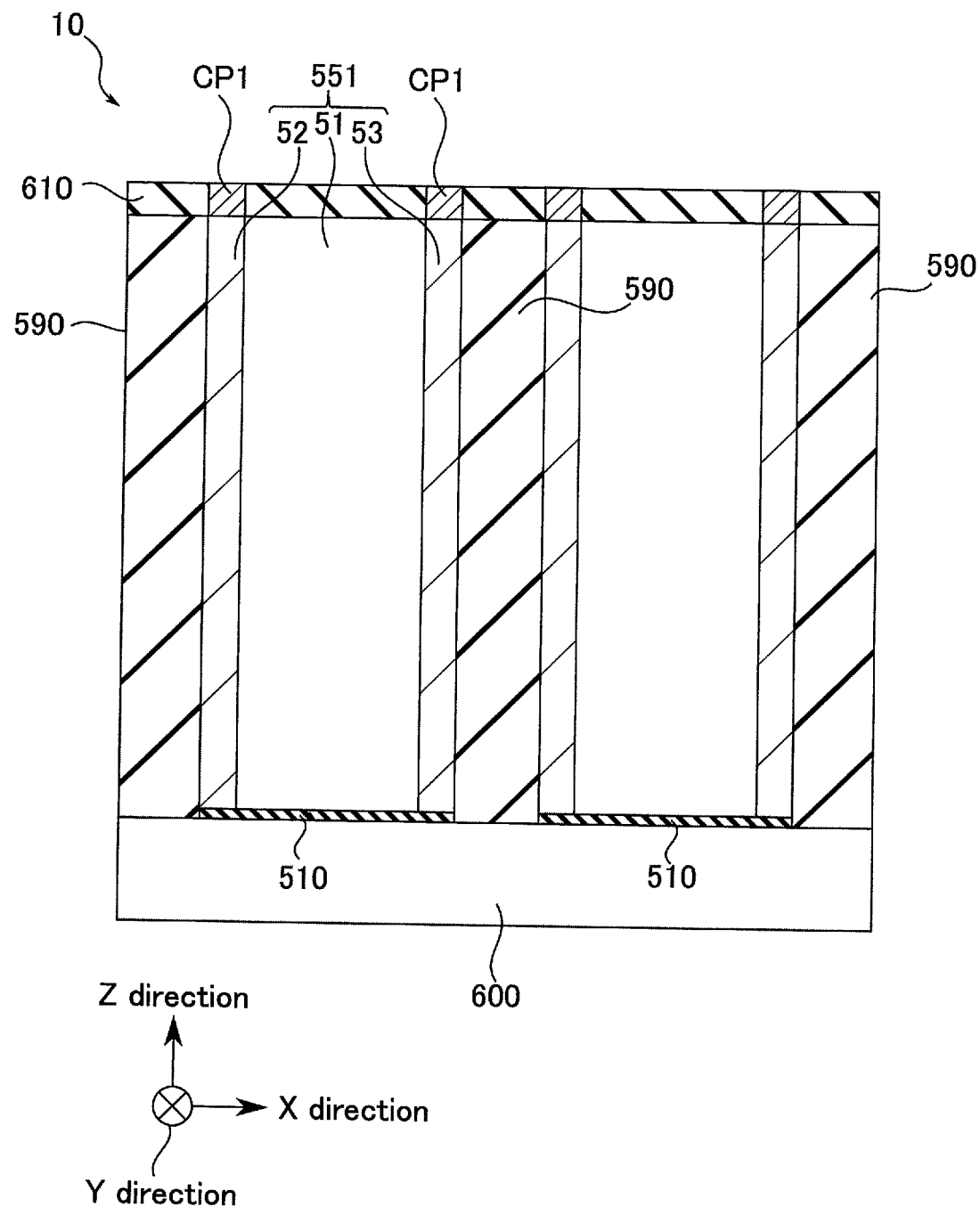

FIG. 38, FIG. 39 and FIG. 40 are views illustrating a fabrication step in the manufacturing method of the NOR-type flash memory of the present embodiment. FIG. 38 is a top view of the memory cell array of the flash memory in a fabrication step of the manufacturing method of the flash memory. FIG. 39 is a schematic cross-sectional view taken along line A-A in FIG. 38. FIG. 40 is a schematic cross-sectional view taken along line B-B in FIG. 38.

As illustrated in FIG. 38, FIG. 39 and FIG. 40, an insulating layer 610 is formed on the layer stack 500, semiconductor pillar 550, memory layer 510 and insulating layer 590 in the Z direction.

Contact holes are formed in the insulating layer 610 by using a photolithography technology and etching technology. Upper parts of the semiconductor layers 52 and 53 are exposed via the contact holes.

Contact plugs (conductors) CP1 are formed in the contact holes in a self-aligning manner by using a sputter method and CMP (Chemical Mechanical Polishing) method. The contact plugs CP1 are electrically connected to the semiconductor layers 52 and 53. The contact plugs CP1 may be formed by well-known photolithography and etching.

Figure 41:
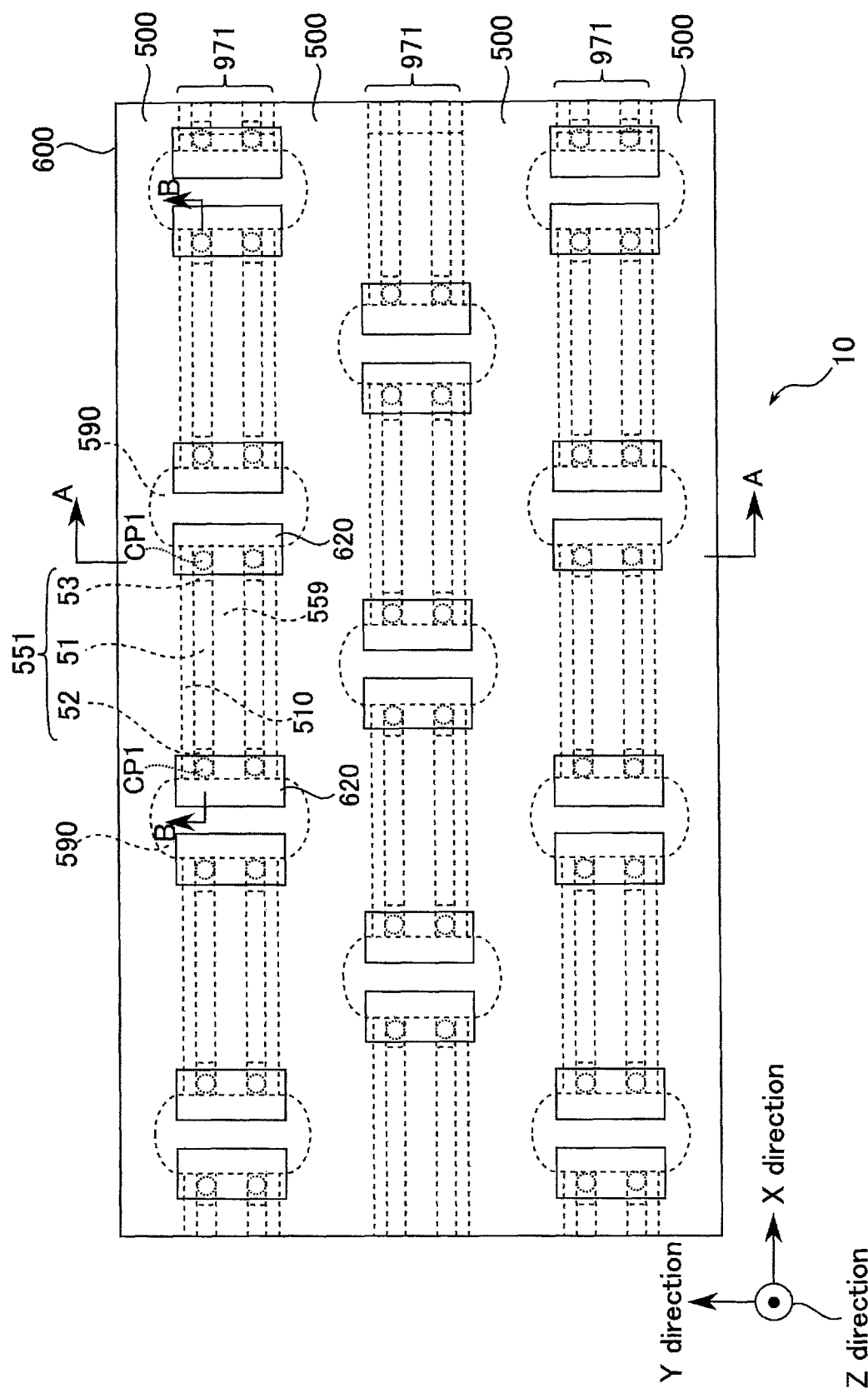
FIG. 41 is a top view illustrating a fabrication step of the manufacturing method of the memory device of the first embodiment.

FIG. 41, FIG. 42 and FIG. 43 are views illustrating a fabrication step in the manufacturing method of the NOR-type flash memory of the present embodiment. FIG. 41 is a top view of the memory cell array of the flash memory in a fabrication step of the manufacturing method of the flash memory. FIG. 42 is a schematic cross-sectional view taken along line A-A in FIG. 41. FIG. 43 is a schematic cross-sectional view taken along line B-B in FIG. 41.

As illustrated in FIG. 41, FIG. 42 and FIG. 43, after a conductive layer is formed on the insulating layer 610, a mask layer 940 is formed on the conductive layer by using a photolithography technology and etching technology. By the etching of the conductive layer, which is based on the pattern of the mask layer 940, a pad layer (conductive layer) 620 is formed on the insulating layer 610 and contact plugs CP1. The pad layer 620, when viewed in the Z direction, extends over two contact plugs CP1 which are opposed to each other with the semiconductor pillar 550 being interposed. The pad layer 620 electrically connects the two contact plugs CP1 which are opposed to each other in the Y direction.

Thereby, the two semiconductor layers 551, between which the insulating layer 559 is interposed, are electrically connected.

Figure 44:
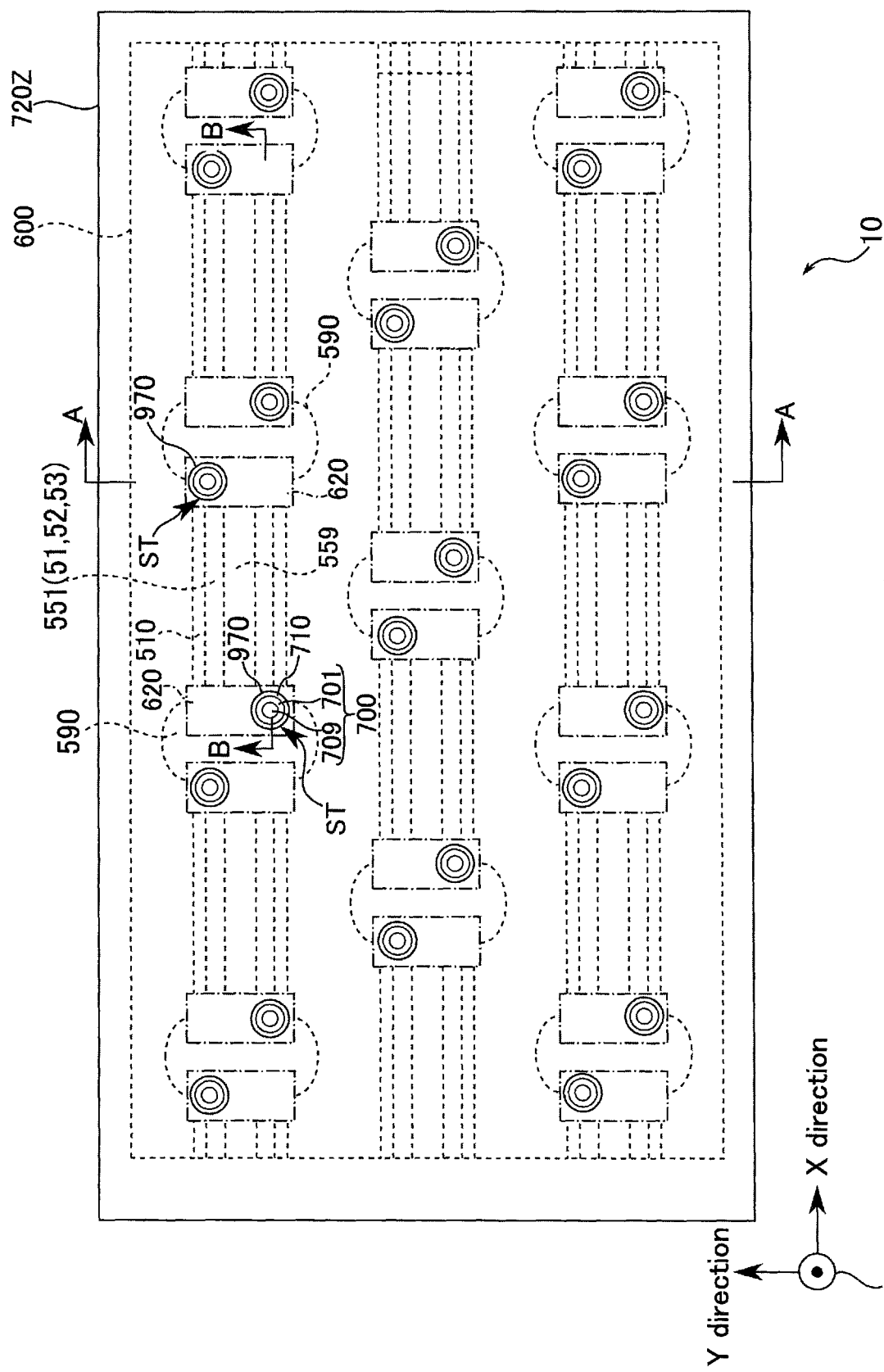
FIG. 44 is a top view illustrating a fabrication step of the manufacturing method of the memory device of the first embodiment.
Figure 46:
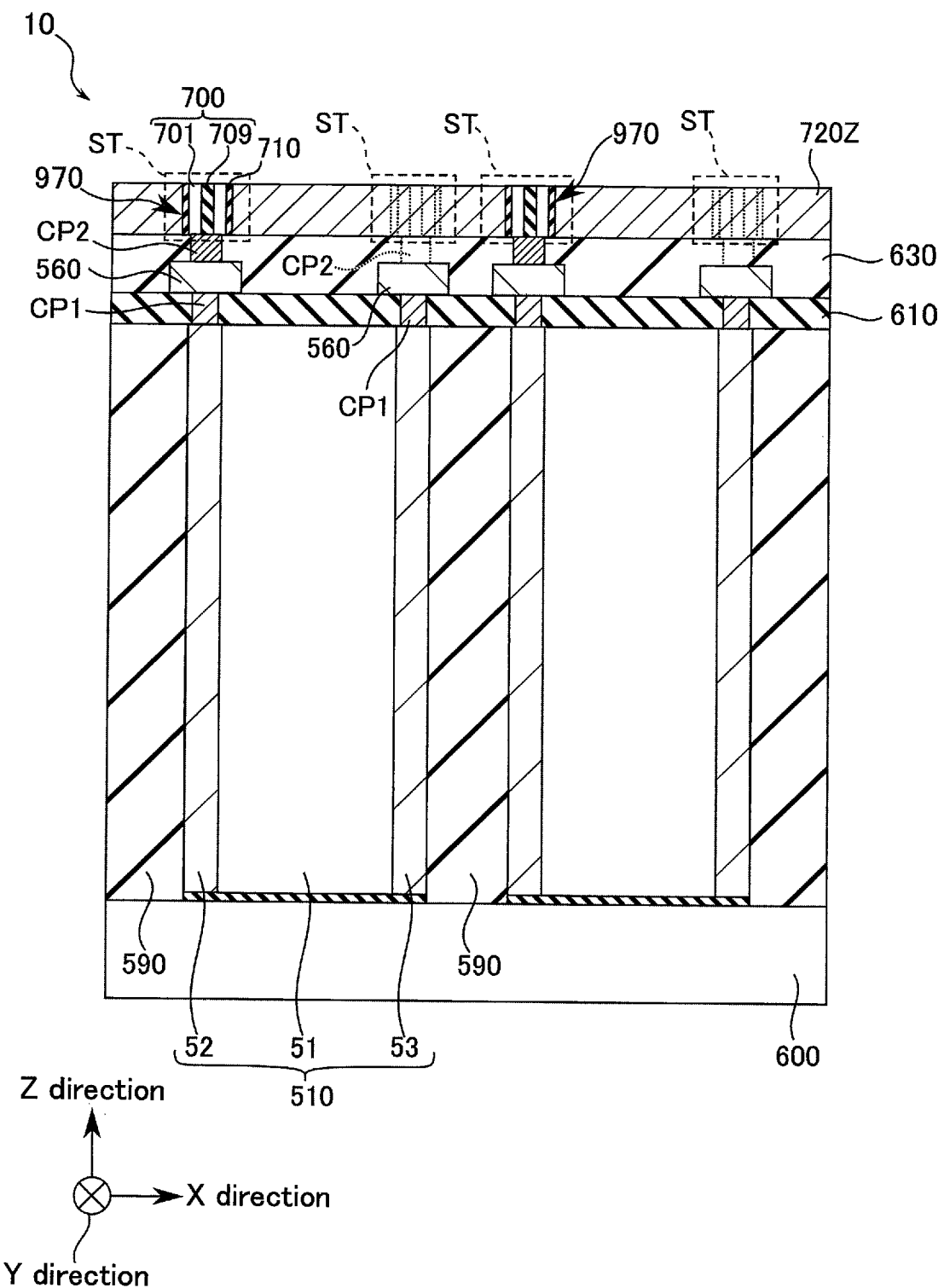

FIG. 44, FIG. 45 and FIG. 46 are views illustrating a fabrication step in the manufacturing method of the NOR-type flash memory of the present embodiment. FIG. 44 is a top view of the memory cell array of the flash memory in a fabrication step of the manufacturing method of the flash memory. FIG. 45 is a schematic cross-sectional view taken along line A-A in FIG. 44. FIG. 46 is a schematic cross-sectional view taken along line B-B in FIG. 44.

As illustrated in FIG. 44, FIG. 45 and FIG. 46, an insulating layer 630 is formed on the pad layer 620 and insulating layer 610. Contact holes are formed in the insulating layer 630 by a photolithography technology and etching technology. Contact plugs CP2 are formed in a self-aligning manner in the contact holes in the insulating layer 630, such that the contact plugs CP2 are connected to the pad layers 620.

A conductive layer (e.g. tungsten silicide layer) 720Z is formed on the insulating layer 630. By photolithography and etching, an opening 970 is formed in the conductive layer 720Z at each of positions corresponding to predetermined formation areas of select gate transistors. For example, the opening 970 is formed above the contact plug CP2.

An insulating layer 710 is formed on a side surface of the conductive layer 720Z in the opening 970 by, for example, CVD. The insulating layer 710 is a gate insulating film of the select gate transistor.

The insulating layer 710 is removed from a top surface of the contact plug CP2, such that the top surface of the contact plug CP2 is exposed. The insulating layer 710 is left on the side surface of the conductive layer 720Z in the opening 970 in a self-aligning manner.

A semiconductor layer (e.g. polysilicon layer) 701 is formed in the opening 970 in a manner to reach the contact plug CP2. The semiconductor layer 701 has a cylindrical structure extending in the Z direction in the opening 970.

After the semiconductor layer 701 is formed, an insulating layer 709 is formed in the opening 970. The insulating layer 709 is buried in a space surrounded by the cylindrical semiconductor layer 701 in the opening 970. The insulating layer 709 has a columnar structure extending in the Z direction.

Thereby, a body portion 700 of the select gate transistor ST is formed. The semiconductor layer 701 serves as a channel region of the select gate transistor ST. For example, in the body portions 700 on the pad layers 620 which mutually neighbor in the X direction, the body portions 700 are arranged in an oblique direction in the X-Y plane.

Figure 47:
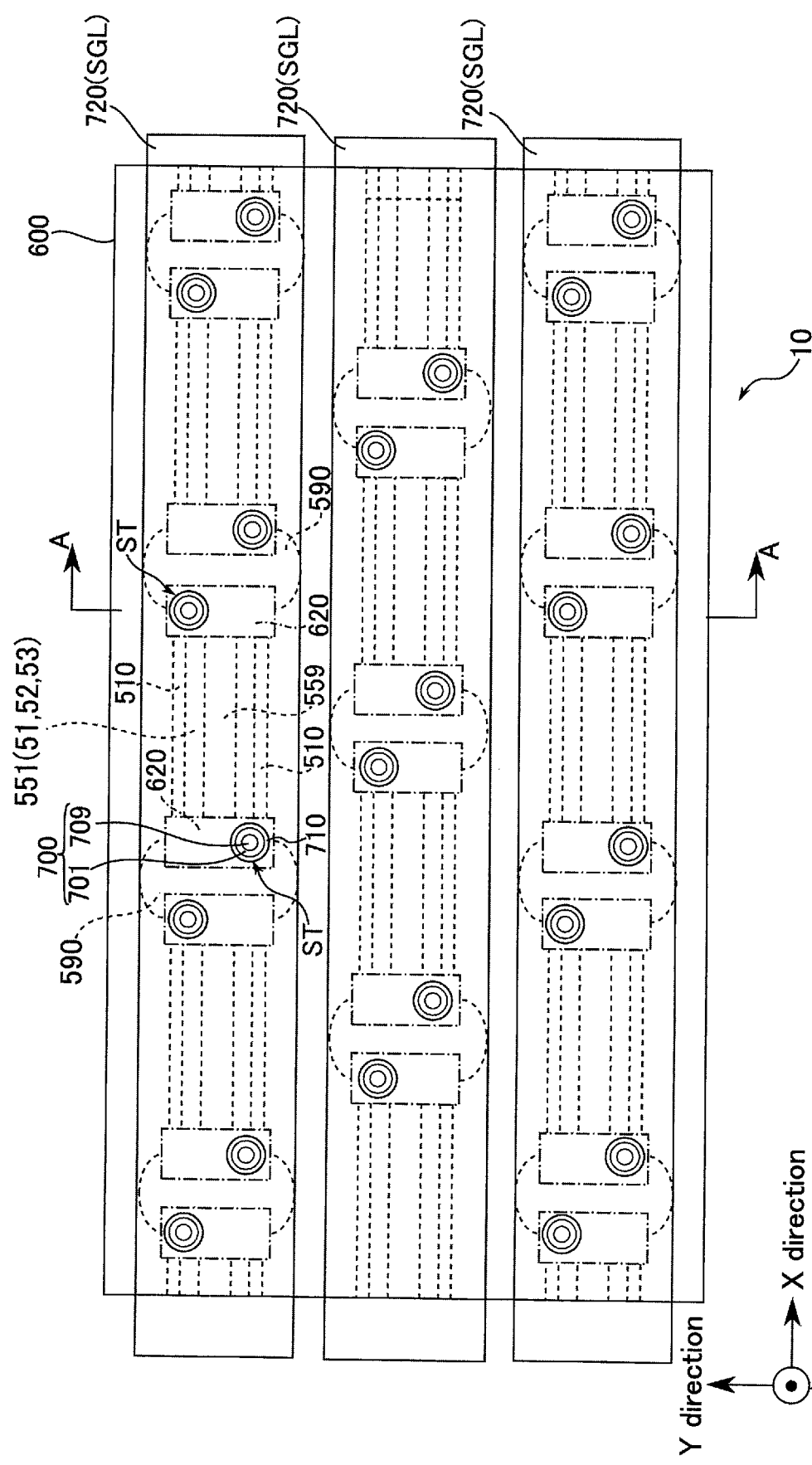
FIG. 47 is a top view illustrating a fabrication step of the manufacturing method of the memory device of the first embodiment.

FIG. 47 and FIG. 48 are views illustrating a fabrication step in the manufacturing method of the NOR-type flash memory of the present embodiment. FIG. 47 is a top view of the memory cell array of the flash memory in a fabrication step of the manufacturing method of the flash memory. FIG. 48 is a cross-sectional view taken along line A-A in FIG. 47.

As illustrated in FIG. 47 and FIG. 48, a mask layer 980 of a predetermined pattern is formed on the conductive layer 720Z by photolithography and etching.

The mask layer 980 has line patterns which vertically overlap the semiconductor pillars 550 in the Z direction. The mask layer 980 includes slits 981 extending in the X direction between the line patterns which mutually neighbor in the Y direction. The slit 981 is formed above the finger portion (finger portion of the conductive layer 501) of the layer stack 500.

Thereafter, the conductive layer 720Z is etched, based on the pattern of the mask layer 980 (the pattern of the slits 981).

Thereby, the select gate line 720 (SGL) using the conductive layer 720Z is formed above the layer stack 500.

FIG. 49 is a view illustrating a fabrication step in the manufacturing method of the NOR-type flash memory of the present embodiment. FIG. 49 corresponds to a schematic cross section along the Y direction in a fabrication step of the manufacturing method of the flash memory.

After the mask layer is removed, as illustrated in FIG. 49, an insulating layer 760 is formed on the select gate line 720.

In the insulating layer 760, openings 991 are formed in the insulating layer 760 by photolithography and etching. Upper parts of the semiconductor layers 701 are exposed via the openings 991 in the insulating layers 760.

After the mask layer is removed, contact plugs CP3 are formed in the openings 991 in the insulating layer 760. The contact plug CP3 is connected to the semiconductor layer 701.

Thereafter, a global bit line GBL and a global source line GSL are formed on the insulating layer and contact plug CP3 by a well-known photolithography technology and etching technology.

Note that the global bit line GBL and global source line GSL may be formed by using a damascene method.

By the above-described manufacturing method, the NOR-type flash memory of the three-dimensional structure of the present embodiment is completed.

In the memory cell array, the processing of the staircase structure of the layer stack may be performed before a process of replacing the sacrificial layers with conductive layers (hereinafter, also referred to as "replace process"), or may be performed after the replace process.

(d) Conclusion

The memory device of the present embodiment is a NOR-type flash memory of a three-dimensional structure.

In the NOR-type flash memory of the present embodiment, one terminal (local bit line) of the memory cell (memory cell transistor) is connected to one terminal of a first select gate transistor, and the other terminal (local source line) of the memory cell is connected to one terminal of a second select gate transistor.

The other terminal of the first select gate transistor ST1 is connected to a first interconnect (global bit line). The other terminal of the second select gate transistor ST2 is connected to a second interconnect (global source line).

In the flash memory of the three-dimensional structure, the number of stacked layers of word lines increases in accordance with an increase of the number of stacked layers of memory cells in the Z direction. Thus, the area of the staircase structure of the memory cell array and the area of the hookup area increase. In addition, there is a tendency that in the hookup area, the layout of contact plugs connected to word lines and the layout of interconnects become complex.

In the NOR-type flash memory of the present embodiment, by the arrangement of select gate transistors and select gate lines, a plurality of conductive layers in a certain layer level can be put together as one control unit (word line).

As a result, in the memory device of the present embodiment, the area size of the contact area (axial portion) of the word line in the staircase structure and the area size of the hookup area (the staircase portion of the layer stack) can be reduced.

In the NOR-type flash memory of the present embodiment, the layout of contact plugs and the layout of interconnects can be simplified.

Accordingly, in the memory device of this embodiment, the area size of the area where the memory cells are arranged can be increased, and the number of stacked layers of word lines (memory cells) in a certain area can be increased. Furthermore, in the memory device of the present embodiment, the bit cost can be improved.

As described above, in the memory device of this embodiment, the memory density can be improved.

(2) Second Embodiment

Referring to FIG. 50 to FIG. 55, a memory device of a second embodiment will be described.

(a) Structure Example

Figure 50:
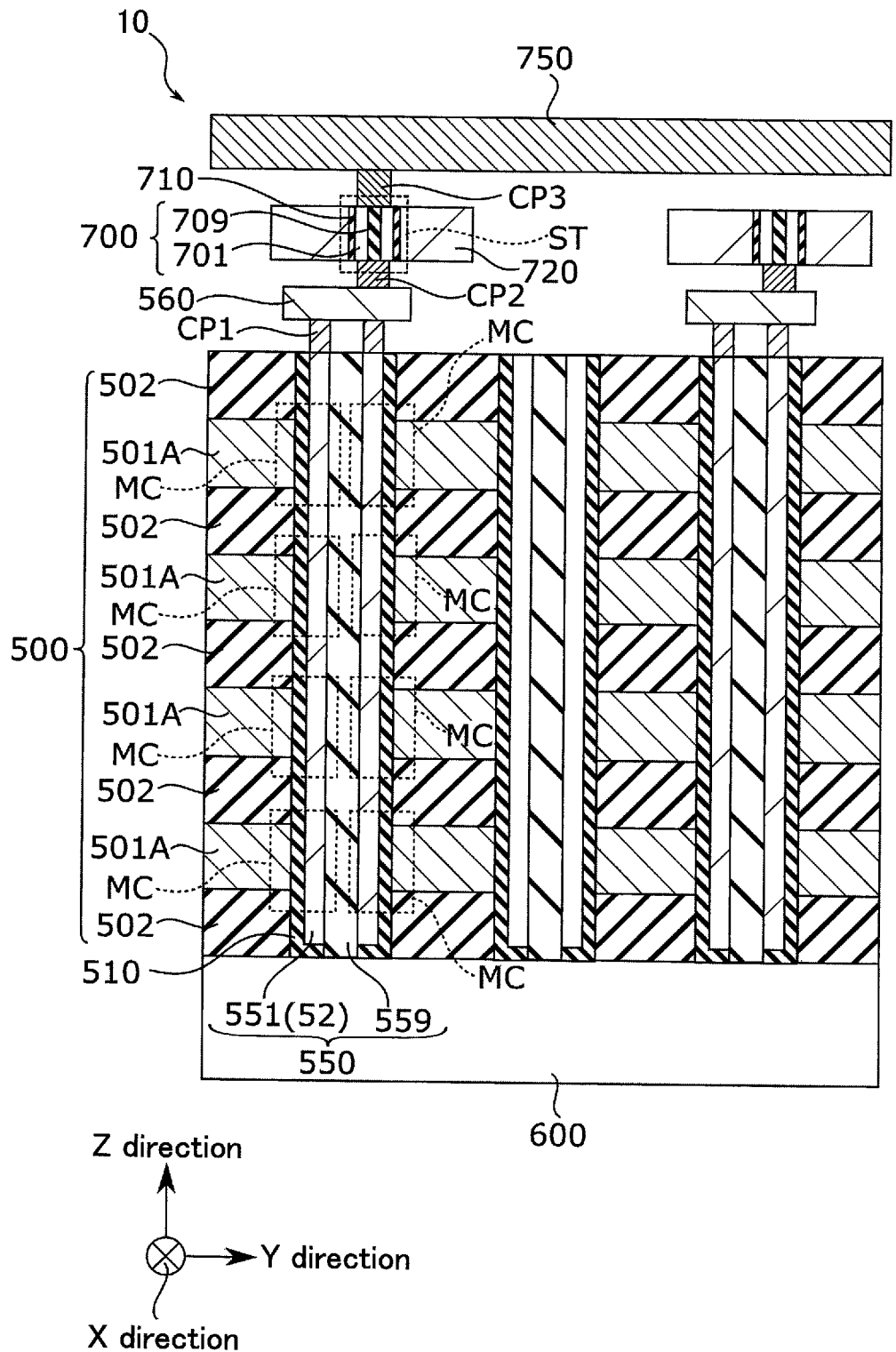
FIG. 50 is a cross-sectional view illustrating a structure example of a memory device of a second embodiment.

FIG. 50 is a cross-sectional view illustrating a structure example of the memory device (NOR-type flash memory) of the present embodiment.

As illustrated in FIG. 50, the conductive layer serving as the word line WL may be a semiconductor layer 501A.

The semiconductor layer 501A is, for example, an n-type polysilicon layer. An n-type dopant concentration of the n-type polysilicon layer 501A serving as the word line WL is, for example, equal to or greater than an n-type dopant concentration of the source/drain region.

For example, when the word line WL is a semiconductor layer, a barrier layer may not be provided between the insulating layer 502 and semiconductor layer 501A, or between the memory layer 510 (block insulating layer) and semiconductor layer 501A.

(b) Manufacturing Method

Referring to cross-sectional process views of FIG. 51 to FIG. 55, a manufacturing method of the memory device (e.g. NOR-type flash memory) of the present embodiment will be described.

FIG. 51 and FIG. 52 are views illustrating a fabrication step in the manufacturing method of the NOR-type flash memory of the present embodiment. FIG. 51 is a schematic cross-sectional process view along the Y direction in the manufacturing method of the NOR-type flash memory of this embodiment. FIG. 52 is a schematic cross-section process view along the X direction in the manufacturing method of the NOR-type flash memory of this embodiment.

As illustrated in FIGS. 51 and 52, a plurality of insulating layers 502 and a plurality of semiconductor layers (e.g. n-type polysilicon layers) 501A are alternately formed in the Z direction. Thereby, a layer stack 500B including the insulating layers 502 and semiconductor layers 501A is formed on the substrate 600.

FIG. 53 illustrates a fabrication step in the manufacturing method of the NOR-type flash memory of the present embodiment. FIG. 53 is a cross-sectional process view along the Y direction in the manufacturing method of the NOR-type flash memory of this embodiment.

As illustrated in FIG. 53, trenches 971 are formed in the layer stack 500B by substantially the same step as the step illustrated in FIG. 17 and FIG. 18. For example, by the etching for forming the trenches, the planar shape of the layer stack 600 is patterned in a comb shape.

A memory layer 510, semiconductor layer 551 and insulating layer (core layer) 559 are formed in the trench 971 by substantially the same step as the step illustrated in FIG. 19 to FIG. 21.

By substantially the same step as the step illustrated in FIG. 22 to FIG. 25, openings IH are formed, and thereby a plurality of memory layers 510 and a plurality of semiconductor pillars 551 are formed.

Figure 54:
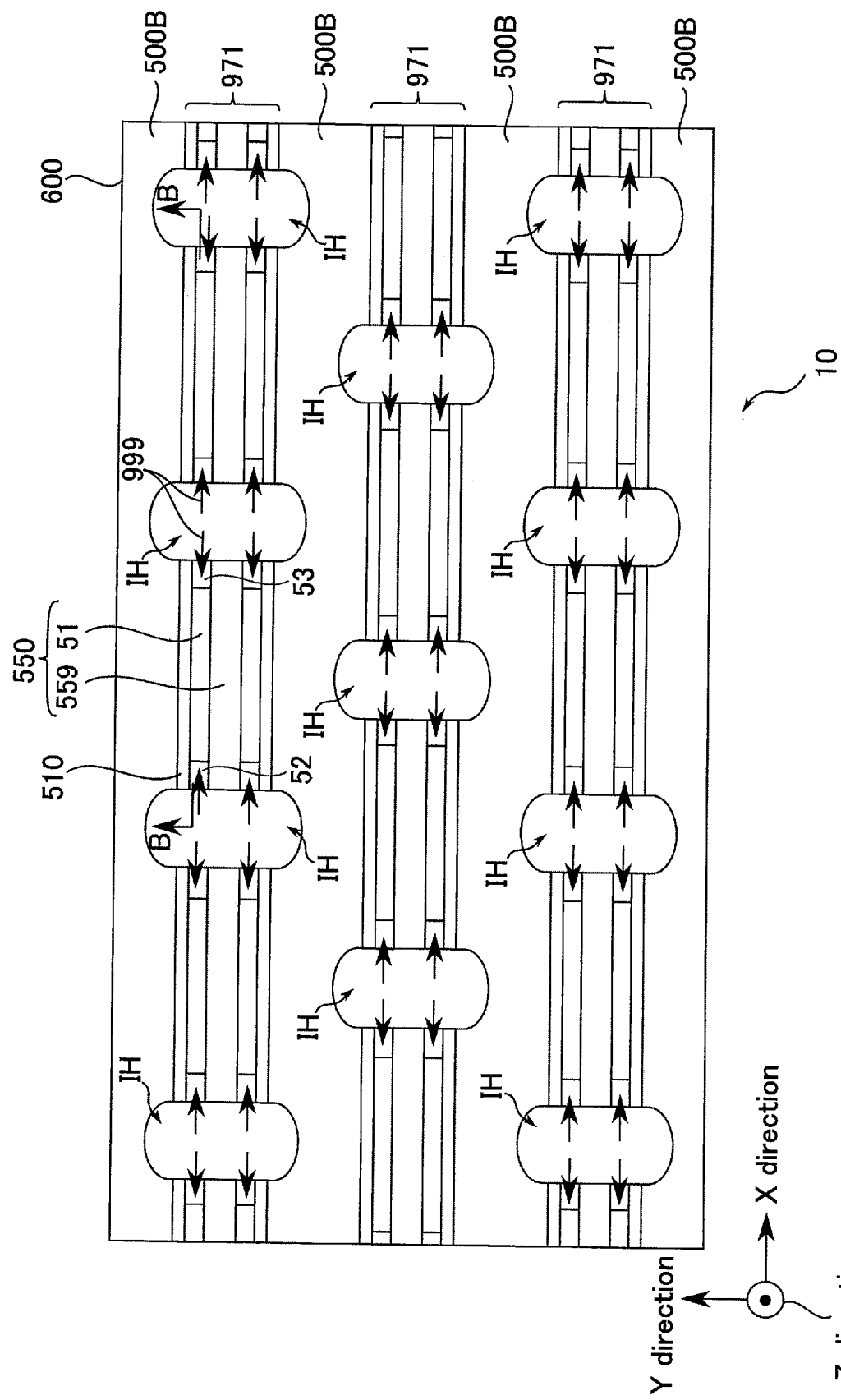
FIG. 54 is a top view illustrating a fabrication step of the manufacturing method of the memory device of the second embodiment.
Figure 55:
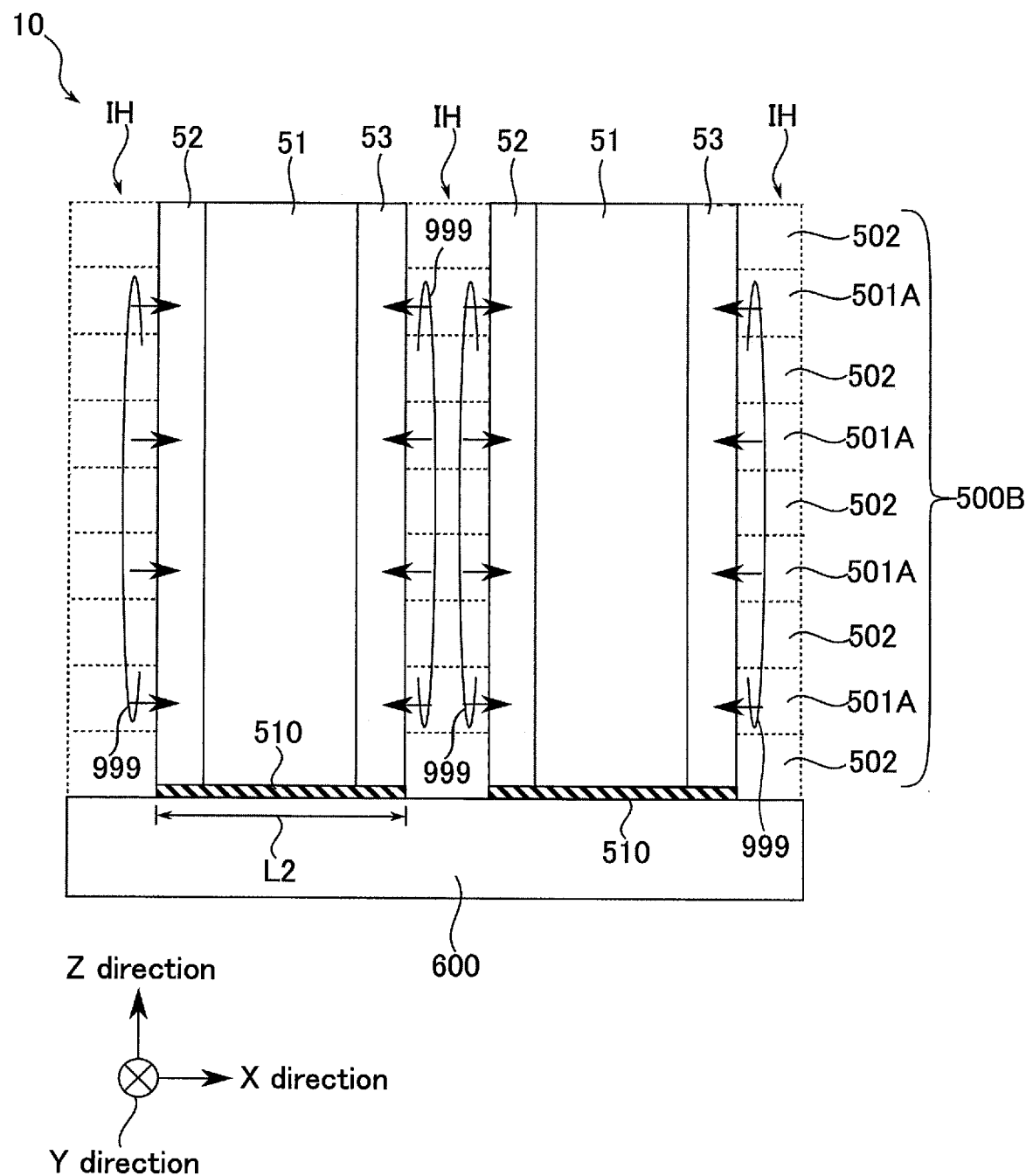
FIG. 55 is a cross-sectional process view illustrating a fabrication step of the manufacturing method of the memory device of the second embodiment.

FIG. 54 and FIG. 55 are views illustrating a fabrication step in the manufacturing method of the NOR-type flash memory of the present embodiment. FIG. 54 is a top view illustrating a fabrication step in the manufacturing method of the NOR-type flash memory of this embodiment. FIG. 55 is a cross-sectional process view along the X direction in the manufacturing method of the NOR-type flash memory of this embodiment.

As illustrated in FIG. 54 and FIG. 55, in the present embodiment, without forming recesses (see FIG. 26 and FIG. 27) on the semiconductor pillars 550, ion implantation 999 by gas phase doping (GPD) is performed on the semiconductor layer 551 via the opening IH.

By the gas phase doping, an n-type dopant is implanted in end portions in the X direction of the semiconductor layer 51. Thereby, source/drain regions 52 and 53 are formed at in the end portions in the X direction of the semiconductor layer 51.

Thereafter, by substantially the same steps as illustrated in FIG. 28 to FIG. 49, select gate transistors ST, select gate lines SGL, global bit lines GBL and global source lines GSL are formed.

In the present embodiment, the polysilicon layer is used as the word line WL. Therefore, in this embodiment, the replace process of the conductive layers in the layer stack does not occur.

By the above fabrication steps, the flash memory (e.g. NOR-type flash memory) of the present embodiment is formed.

Even when the layer stack 500 is formed by using the semiconductor layers as in the present embodiment, the memory cell array including select gate transistors can be formed.

As described above, in the memory device of the second embodiment, substantially the same advantageous effects as in the memory device of the first embodiment can be obtained.

(3) Third Embodiment

Figure 56:
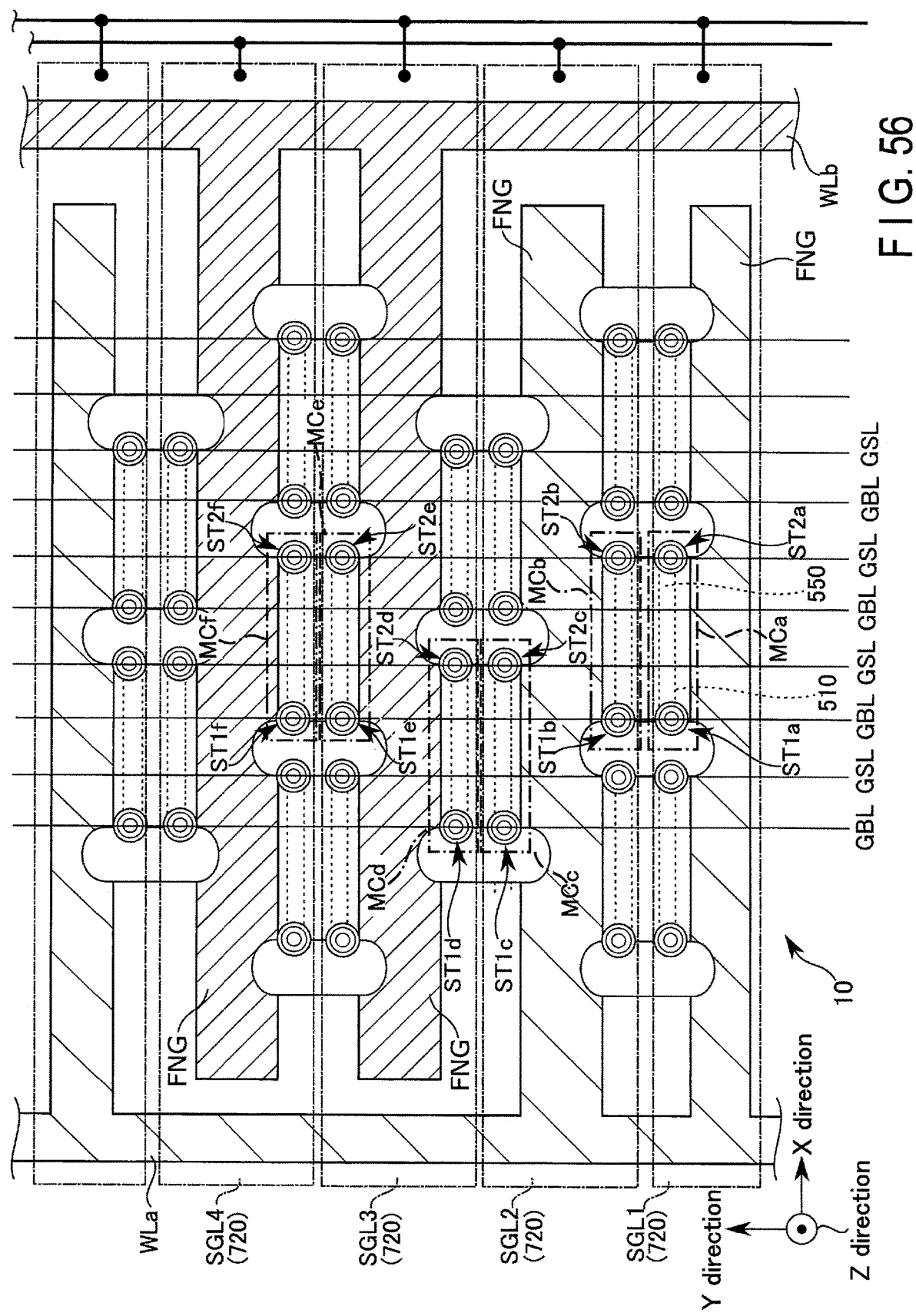
FIG. 56 is a view illustrating a structure example of a memory device of a third embodiment.

Referring to FIG. 56, a memory device of a third embodiment will be described.

FIG. 56 is a top view illustrating a structure example of the memory device (e.g. NOR-type flash memory) of the present embodiment. In FIG. 56, a main part for describing the layout of select gate lines is extracted and illustrated. In FIG. 56, for the purpose of clarification, different hatchings are added to two word lines WLa and WLb in one layer level.

As illustrated in FIG. 56, in each layer level, two word line fingers (finger portions of the conductive layer) FNG, which mutually neighbor in the Y direction, may be connected. In this case, the pair of two word line fingers FNG, which mutually neighbor in the Y direction, belong to the same word line WL.

Memory cells MCa, MCb and MCc are connected to a word line WLa. Memory cells MCd, MCe and MCf are connected to a word line WLb.

In the present embodiment, drain-side and source-side select gate transistors ST1 and ST2 are provided for each string NS. Unlike the first embodiment, the select gate transistors ST1 and ST2 in the present embodiment are not shared by two strings NS.

In the example of FIG. 56, a conductive layer 720 is provided above the word line finger portion FNG in the Z direction. For example, the conductive layer 720 is a part of the select gate line SGL.

In the present embodiment, two conductive layers 720 that mutually neighbor in the Y direction function as mutually different select gate lines SGL.

The select gate line SGL may have a comb-like planar shape. For example, among a plurality of comb-like select gate lines SGL in a certain layer level, one group of select gate lines SGL has an axial portion in the hookup area HA1 and another group of select gate lines SGL has an axial portion in the hookup area HA2.

Like the example of FIG. 10 to FIG. 14, in each of the write operation, erase operation and read operation, among the strings NS connected to the selected select gate line SGL, the memory cells connected to the selected word line WL-s are set in the selected state. Among the strings NS connected to the selected select gate line SGL, the memory cells connected to the non-selected word line WL-u are set in the non-selected state by the control of potential of the non-selected word line WL-u.

In addition, the strings NS connected to the non-selected select gate line SGL are electrically isolated from the global bit line GBL and global source line GSL by the select gate transistors ST which are in the OFF state.

In the example of FIG. 56, for example, consideration is now given to the case in which, among the memory cells MCa, MCb, MCd, MCe and MCf, the memory cell MCb is selected as an operation target.

In this case, the select gate line SGL2 is set in the selected state, and the word line WLa is set in the selected state.

When the select gate line SGL2 is set in the selected state, the select gate lines SGL1 and SGL3 are set in the non-selected state. The select gate transistors ST1a, ST1d, ST1e, ST2a, ST2d and ST2e, which are connected to the select gate lines SGL1 and SGL3 that are set in the non-selected state, are set in the OFF state.

Therefore, among the memory cells MC in the strings NS connected to the select gate lines SGL1 and SGL3 that are in the non-selected state, even if there exists the memory cell MCa connected to the selected word line WLa, this memory cell MCa is electrically isolated from the global bit line GBL and global source line GSL by the select gate transistors ST which are in the OFF state.

When the select gate line SGL4 is connected to the selected select gate line SGL2, the select gate transistors ST1f and ST2f connected to the select gate line SGL4 are set in the ON state. The memory cell MCf connected to the select gate transistors ST1f and ST2f is connected to the non-selected word line WLb.

Therefore, even when the select gate line SGL4 and the selected select gate line SGL2 are the same interconnect, the memory cell MCf connected to the non-selected word line WLb does not become an operation target.

The select gate transistors ST1b, ST1c, ST2b and ST2c connected to the selected select gate line SGL2 are set in the ON state.

In FIG. 56, when the word line WLa is set in the selected state and the word line WLb is set in the non-selected state, the memory cells MCb and MCc are set in the selected state (in the ON state). The memory cell MCb is connected to the global bit line GBL and global source line GSL via the select gate transistors ST1b and ST2b that are in the ON state.

The memory cell MCc is connected to the global bit line GEL and global source line GSL via the select gate transistors ST1c and ST2c that are in the ON state.

However, the global bit line GBL and global source line GSL, to which the memory cell MCc is connected, are different from the global bit line GBL and global source line GSL, to which the memory cell MCb is connected.

Therefore, by the control of potential of the global bit line GBL and global source line GSL, the memory cell MCb can be set in the selected state as the operation target, and the memory cell MCc can be set in the non-selected state.

As described above, in the NOR-type flash memory of the present embodiment, when the word lines WL and select gate lines SGL have the configuration of FIG. 56 as in the present embodiment, the memory cell of the operation target can be activated by the control of the string NS with use of the global bit line GBL, global source line GSL and select gate line SGL.

In addition, in the present embodiment, the bundling of select gate lines SGL can be performed with predetermined cycles corresponding to the arrangement of memory cells and select gate transistors.

In the NOR-type flash memory of the present embodiment, substantially the same advantageous effects as in the above-described embodiments can be obtained.

(4) Fourth Embodiment

Referring to FIG. 57 and FIG. 58, a memory device of a fourth embodiment will be described.

FIG. 57 and FIG. 58 are cross-sectional views illustrating a structure example of the memory device (e.g. NOR-type flash memory) of the present embodiment.

FIG. 57 illustrates a cross section along the Y direction of the NOR-type flash memory of the present embodiment. FIG. 58 illustrates a cross section along the X direction of the NOR-type flash memory of the present embodiment.

As illustrated in FIG. 57 and FIG. 58, the select gate transistors ST may be provided in a region between the memory cells MC and the substrate 600.

The select gate transistors ST and select gate line SGL are provided below the memory cells MC and above the substrate 600 in the Z direction.

The global bit line GBL and global source line GSL are provided in a region between the select gate transistor ST and the substrate 600.

Note that, of the two select gate transistors ST connected to one cell string NS, one select gate transistor ST may be provided below the cell string NS (on the substrate side), and the other select gate transistor ST may be provided above the cell string NS.

In the NOR-type flash memory of the present embodiment, substantially the same advantageous effects as in the above-described embodiments can be obtained.

(5) Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a substrate;
a first stack provided above the substrate in a first direction perpendicular to a surface of the substrate, the first stack including a first conductive layer, and a second conductive layer provided between the substrate and the first conductive layer;
a first semiconductor layer extending in the first direction and neighboring the first stack in a second direction parallel to the surface of the substrate;
a first memory layer provided between the first stack and the first semiconductor layer;
a first memory cell provided between the first conductive layer and the first semiconductor layer;
a second memory cell provided between the second conductive layer and the first semiconductor layer;
a first transistor provided above the first semiconductor layer in the first direction, the first transistor including a first terminal connected to one end of the first semiconductor layer in a third direction which is parallel to the surface of the substrate and crosses the second direction, and a second terminal connected to a first interconnect;
a second transistor provided above the first semiconductor layer in the first direction, the second transistor including a third terminal connected to the other end of the first semiconductor layer in the third direction, and a fourth terminal connected to a second interconnect;
a second stack provided above the substrate in the first direction and neighboring the first semiconductor layer in the second direction, the second stack including a third conductive layer, and a fourth conductive layer provided between the substrate and the third conductive layer;
a second semiconductor layer provided between the second stack and the first semiconductor layer;
a second memory layer provided between the second semiconductor layer and the second stack;
a third memory cell provided between the third conductive layer and the second semiconductor layer; and
a fourth memory cell provided between the fourth conductive layer and the second semiconductor layer,
wherein
one end of the second semiconductor layer in the third direction is connected to the first terminal of the first transistor, and
the other end of the second semiconductor layer in the third direction is connected to the third terminal of the second transistor.

2. The memory device of claim 1, wherein the first semiconductor layer includes:
a first portion provided at one end of the first semiconductor layer and connected to the first interconnect via the first transistor;
a second portion provided at the other end of the first semiconductor layer and connected to the second interconnect via the second transistor; and
a third portion provided between the first portion and the second portion.

3. The memory device of claim 2, wherein an impurity concentration of the first portion and an impurity concentration of the second portion are higher than an impurity concentration of the third portion.

4. The memory device of claim 1, wherein
the first transistor includes:
a third semiconductor layer extending in the first direction; and
a first gate insulating layer between a fifth conductive layer extending in the third direction and a side surface of the third semiconductor layer, and
the second transistor includes:
a fourth semiconductor layer extending in the first direction; and
a second gate insulating layer between the fifth conductive layer and a side surface of the fourth semiconductor layer.

5. The memory device of claim 1, wherein the first memory layer includes:
a charge storage layer;
a first insulating layer between the charge storage layer and the first semiconductor layer; and
a second insulating layer between the charge storage layer and the first stack.

6. The memory device of claim 1, further comprising:
a fifth semiconductor layer provided above the substrate, the fifth semiconductor layer neighboring the first semiconductor layer in the third direction and neighboring the first stack in the second direction;
a third memory layer provided between the fifth semiconductor layer and the first stack;
a fifth memory cell provided between the first conductive layer and the fifth semiconductor layer;
a sixth memory cell provided between the second conductive layer and the fifth semiconductor layer;
a third transistor provided above the fifth semiconductor layer in the first direction, the third transistor including a fifth terminal connected to one end of the fifth semiconductor layer in the third direction, and a sixth terminal connected to a third interconnect; and
a fourth transistor provided above the fifth semiconductor layer in the first direction, the fourth transistor including a seventh terminal connected to the other end of the fifth semiconductor layer in the third direction, and an eighth terminal connected to a fourth interconnect.

7. The memory device of claim 6, wherein
the first transistor includes:
- a sixth semiconductor layer extending in the first direction; and
- a third gate insulating layer between a fifth conductive layer extending in the third direction and a side surface of the sixth semiconductor layer, the second transistor includes:
- a seventh semiconductor layer extending in the first direction; and
- a fourth gate insulating layer between the fifth conductive layer and a side surface of the seventh semiconductor layer, the third transistor includes:
- an eighth semiconductor layer extending in the first direction; and
- a fifth gate insulating layer between the fifth conductive layer and a side surface of the eighth semiconductor layer, and the fourth transistor includes:
- a ninth semiconductor layer extending in the first direction; and
- a sixth gate insulating layer between the fourth fifth conductive layer and a side surface of the ninth semiconductor layer.

8. The memory device of claim 6, further comprising:
a third insulating layer provided between the first semiconductor layer and the third semiconductor layer and between the first memory layer and the third memory layer.

9. The memory device of claim 1, wherein the first transistor and the second transistor are arranged in a fourth direction, the fourth direction being parallel to the surface of the substrate and crossing the second direction and the third direction.

10. The memory device of claim 1, further comprising:
a seventh conductive layer extending over one end of the first semiconductor layer and one end of the second semiconductor layer;
an eighth conductive layer extending over the other end of the first semiconductor layer and the other end of the second semiconductor layer;
wherein the first transistor is provided between the seventh conductive layer and the first interconnect, and
the second transistor is provided between the eighth conductive layer and the second interconnect.

11. The memory device of claim 10, wherein
the first transistor includes:
- a tenth semiconductor layer extending in the first direction and provided on the seventh conductive layer; and
- a seventh gate insulating layer between a ninth conductive layer extending in the third direction and a side surface of the tenth semiconductor layer, and the second transistor includes:
- an eleventh semiconductor layer extending in the first direction and provided on the eighth conductive layer; and
- an eighth gate insulating layer between the ninth conductive layer and a side surface of the eleventh semiconductor layer.

12. The memory device of claim 1, wherein
the first conductive layer is provided in a first word line,
the second conductive layer is provided in a second word line,
the third conductive layer is provided in a third word line, and
the fourth conductive layer is provided in a fourth word line.

13. The memory device of claim 1, wherein
the first and third conductive layers are provided in a first word line, and
the second and fourth conductive layers are provided in a second word line.

14. The memory device of claim 1, further comprising:
a fourth insulating layer provided between the first semiconductor layer and the second semiconductor layer.

15. The memory device of claim 1, wherein each of the first and second conductive layers include a semiconductor.

16. The memory device of claim 1, further comprising:
a third interconnect extending in the second direction and provided between the first interconnect and the second interconnect; and
a fourth interconnect extending in the second direction and provided between the first interconnect and the third interconnect,
wherein the third and fourth interconnects are isolated from the first semiconductor layer.

* * * * *